US010276594B2

(12) United States Patent
Yamazaki et al.

(10) Patent No.: US 10,276,594 B2
(45) Date of Patent: Apr. 30, 2019

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/698,117

(22) Filed: Sep. 7, 2017

(65) Prior Publication Data

US 2018/0076231 A1    Mar. 15, 2018

(30) Foreign Application Priority Data

Sep. 12, 2016    (JP) .................................. 2016-178106
Sep. 20, 2016    (JP) .................................. 2016-183322
(Continued)

(51) Int. Cl.
*H01L 27/02*    (2006.01)
*H01L 27/12*    (2006.01)
(Continued)

(52) U.S. Cl.
CPC ....... *H01L 27/1225* (2013.01); *G09G 3/3233* (2013.01); *G09G 3/3648* (2013.01);
(Continued)

(58) Field of Classification Search
None
See application file for complete search history.

(56) References Cited

U.S. PATENT DOCUMENTS 8,854,286 B2    10/2014    Yamazaki et al.
8,890,781 B2    11/2014    Yamazaki et al.
(Continued)

FOREIGN PATENT DOCUMENTS

CN    104867981 A    8/2015
CN    105659370 A    6/2016
(Continued)

OTHER PUBLICATIONS

Kang.S et al., "Surface-chemistry-sensitive spectral features of In—Ga—Zn—O thin film: Cleaned, air-passivated, and sputter-phase-separated surfaces", Chem. Phys. Lett. (Chemical Physics Letters), Jul. 15, 2011, vol. 510, No. 4-6, pp. 234-236.
(Continued)

*Primary Examiner* — William A Harriston
(74) *Attorney, Agent, or Firm* — Robinson Intellectual Property Law Office; Eric J. Robinson

(57) ABSTRACT

A novel display device is provided. The display device includes a pixel portion and a driver circuit for driving the pixel portion. The driver circuit includes a first transistor having a dual-gate structure. The pixel portion includes a second transistor having a single-gate structure and a pixel electrode electrically connected to the second transistor. The first transistor and the second transistor each include a first metal oxide film functioning as a channel. The metal oxide films each include a first region and a second region. The first region contains In or Zn, and oxygen. The second region contains In or an element M, and oxygen. The first region and the second region are dispersed or distributed in a mosaic pattern.

22 Claims, 58 Drawing Sheets

(30) Foreign Application Priority Data

Nov. 30, 2016 (JP) .................................. 2016-233577
May 19, 2017 (JP) .................................. 2017-099483

(51) Int. Cl.
*G09G 3/3233* (2016.01)
*G09G 3/36* (2006.01)

(52) U.S. Cl.
CPC ........ *H01L 27/124* (2013.01); *H01L 27/1248* (2013.01); *H01L 27/1255* (2013.01); *G09G 3/3677* (2013.01); *G09G 3/3688* (2013.01); *G09G 2330/021* (2013.01); *G09G 2340/0407* (2013.01); *H01L 27/0251* (2013.01)

(56) References Cited

U.S. PATENT DOCUMENTS

| | | | |
|---|---|---|---|
| 9,165,502 | B2 | 10/2015 | Yamazaki et al. |
| 9,368,082 | B2 | 6/2016 | Yamazaki et al. |
| 9,496,408 | B2 | 11/2016 | Yamazaki et al. |
| 9,704,894 | B2 | 7/2017 | Miyake et al. |
| 9,741,865 | B2 | 8/2017 | Yamazaki et al. |
| 2012/0132903 | A1 | 5/2012 | Yamazaki et al. |
| 2012/0211745 | A1 | 8/2012 | Ueda et al. |
| 2013/0270552 | A1 | 10/2013 | Yamazaki et al. |
| 2014/0084287 | A1 | 3/2014 | Yamazaki |
| 2014/0106502 | A1 | 4/2014 | Tezuka et al. |
| 2015/0109553 | A1 | 4/2015 | Kubota |
| 2015/0115259 | A1* | 4/2015 | Yamazaki ........... H01L 27/1225 257/43 |
| 2015/0144945 | A1 | 5/2015 | Kusunoki et al. |
| 2015/0243738 | A1 | 8/2015 | Shimomura et al. |
| 2015/0318171 | A1* | 11/2015 | Yamazaki ........... H01J 37/3491 204/192.25 |
| 2015/0318359 | A1 | 11/2015 | Shimomura et al. |
| 2015/0333088 | A1 | 11/2015 | Yamazaki et al. |
| 2016/0035275 | A1 | 2/2016 | Yamazaki et al. |
| 2016/0232868 | A1 | 8/2016 | Yamazaki et al. |
| 2016/0240562 | A1 | 8/2016 | Miyake et al. |
| 2016/0260837 | A1 | 9/2016 | Koezuka et al. |
| 2017/0004788 | A1 | 1/2017 | Yamazaki et al. |
| 2017/0256572 | A1 | 9/2017 | Yamazaki |
| 2017/0263773 | A1 | 9/2017 | Yamazaki |
| 2017/0271378 | A1 | 9/2017 | Yamazaki et al. |
| 2017/0288023 | A1 | 10/2017 | Yamazaki et al. |
| 2017/0309751 | A1 | 10/2017 | Yamazaki et al. |
| 2017/0338315 | A1 | 11/2017 | Yamazaki et al. |

FOREIGN PATENT DOCUMENTS

| | | |
|---|---|---|
| DE | 112014004839 | 7/2016 |
| JP | 2011-141522 A | 7/2011 |
| JP | 2011-141524 A | 7/2011 |
| JP | 2014-007399 A | 1/2014 |
| JP | 2015-179250 A | 10/2015 |
| JP | 2015-188054 A | 10/2015 |
| JP | 2016-056446 A | 4/2016 |
| JP | 2016-074580 A | 5/2016 |
| KR | 2015-0061578 A | 6/2015 |
| KR | 2015-0099467 A | 8/2015 |
| KR | 2015-0126272 A | 11/2015 |
| KR | 2016-0074514 A | 6/2016 |
| TW | 201519419 | 5/2015 |
| TW | 201530744 | 8/2015 |
| TW | 201544458 | 12/2015 |
| WO | WO-2015/060203 | 4/2015 |

OTHER PUBLICATIONS

International Search Report (Application No. PCT/IB2017/055351) dated Dec. 12, 2017.
Written Opinion (Application No. PCT/IB2017/055351) dated Dec. 12, 2017.

* cited by examiner

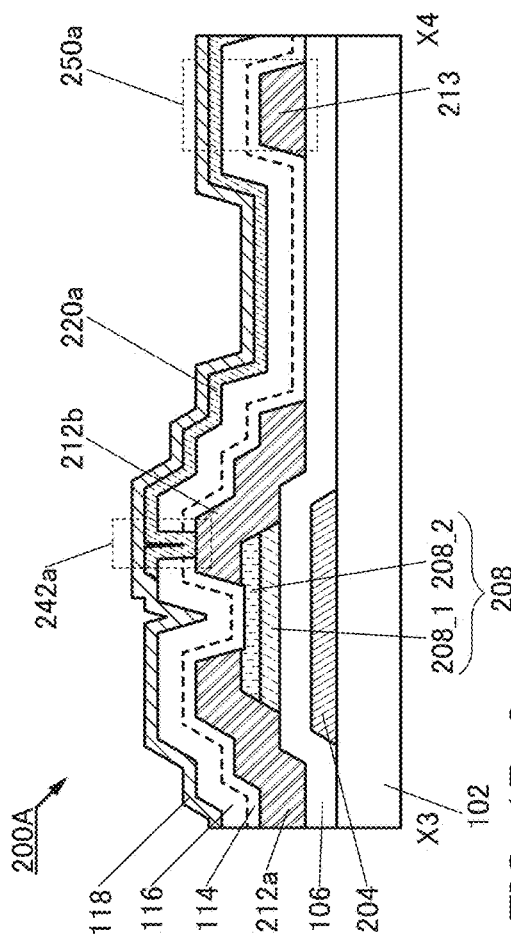
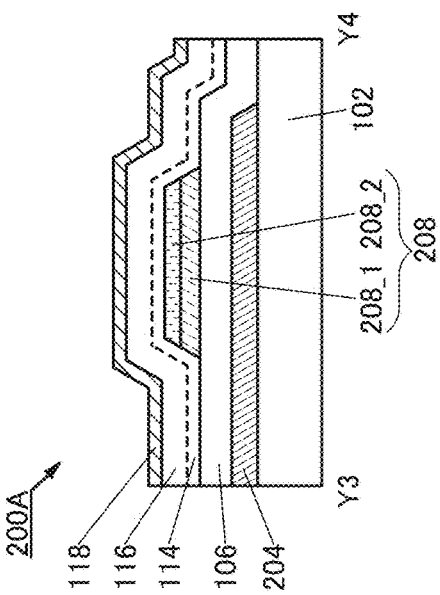
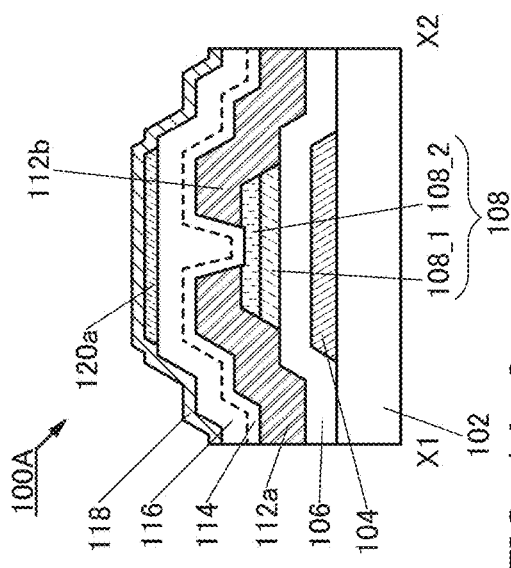
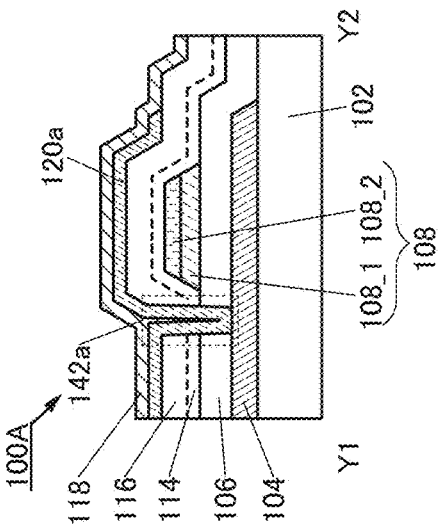

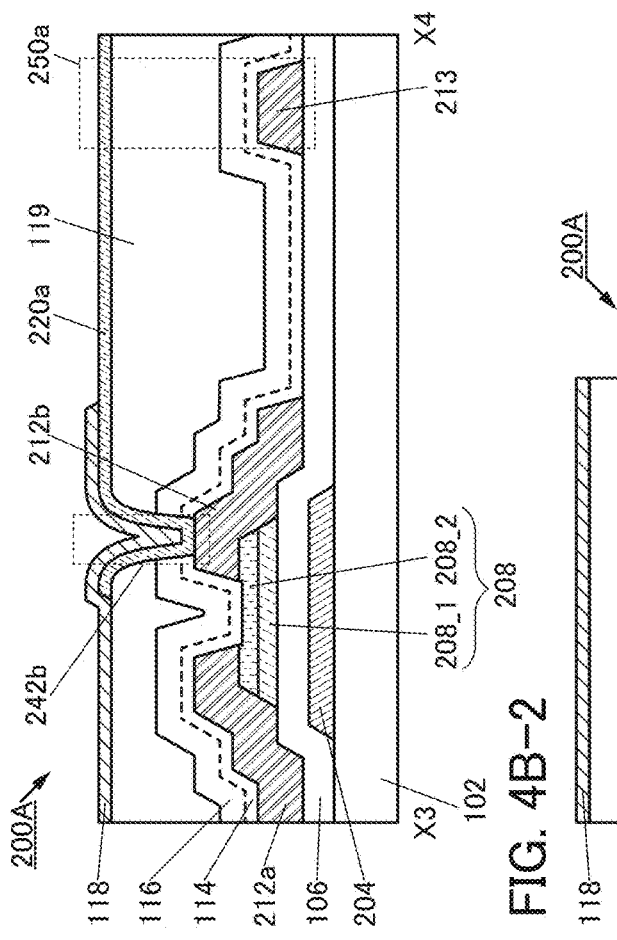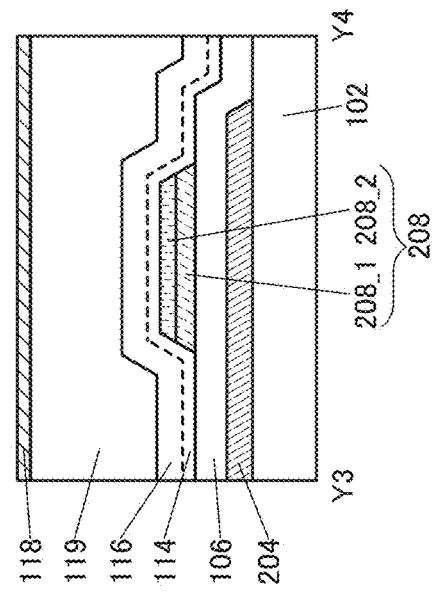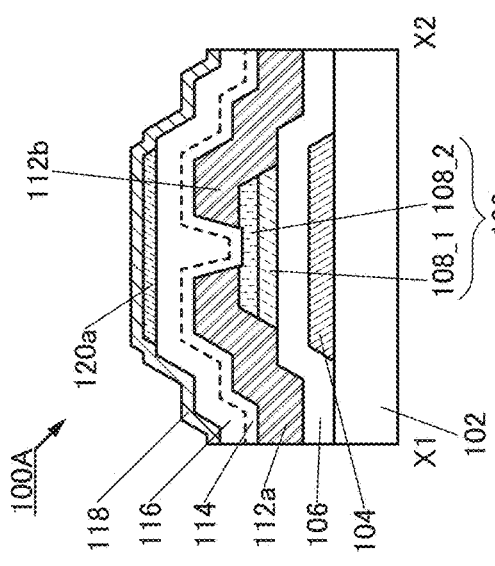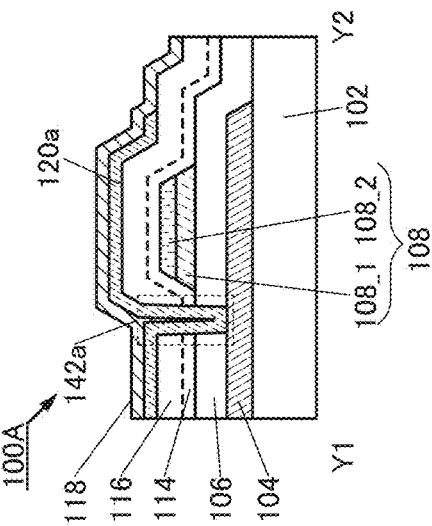

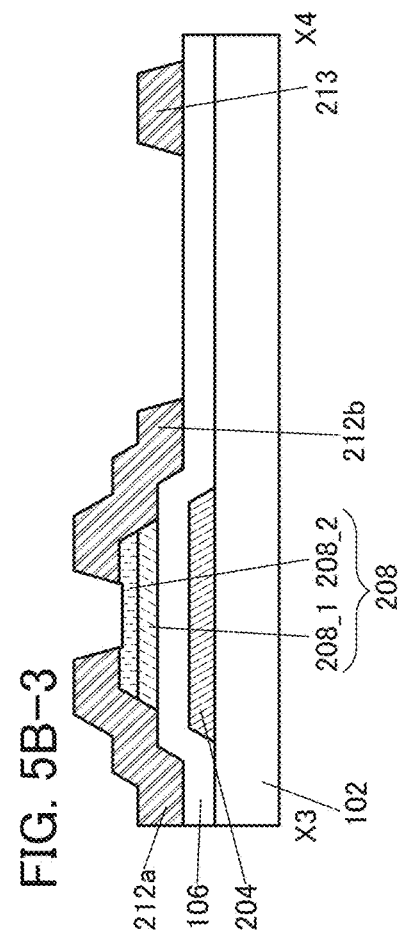

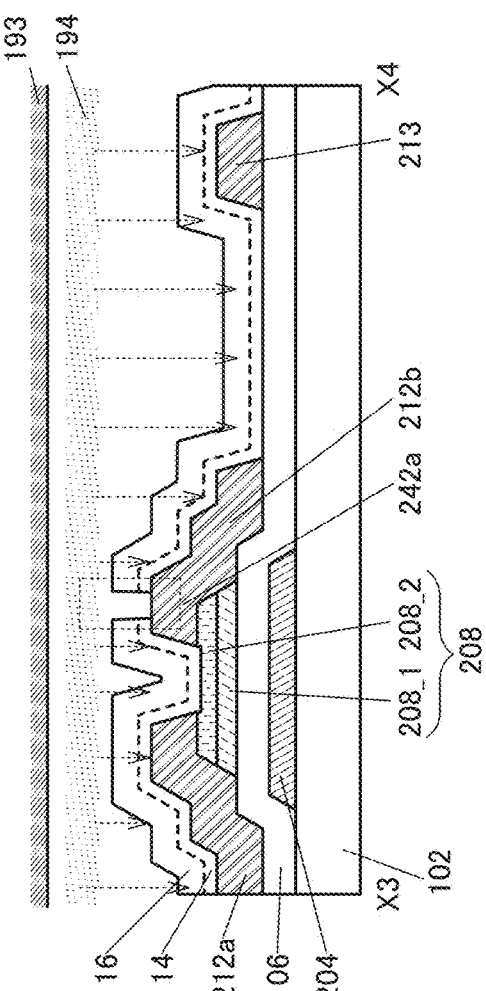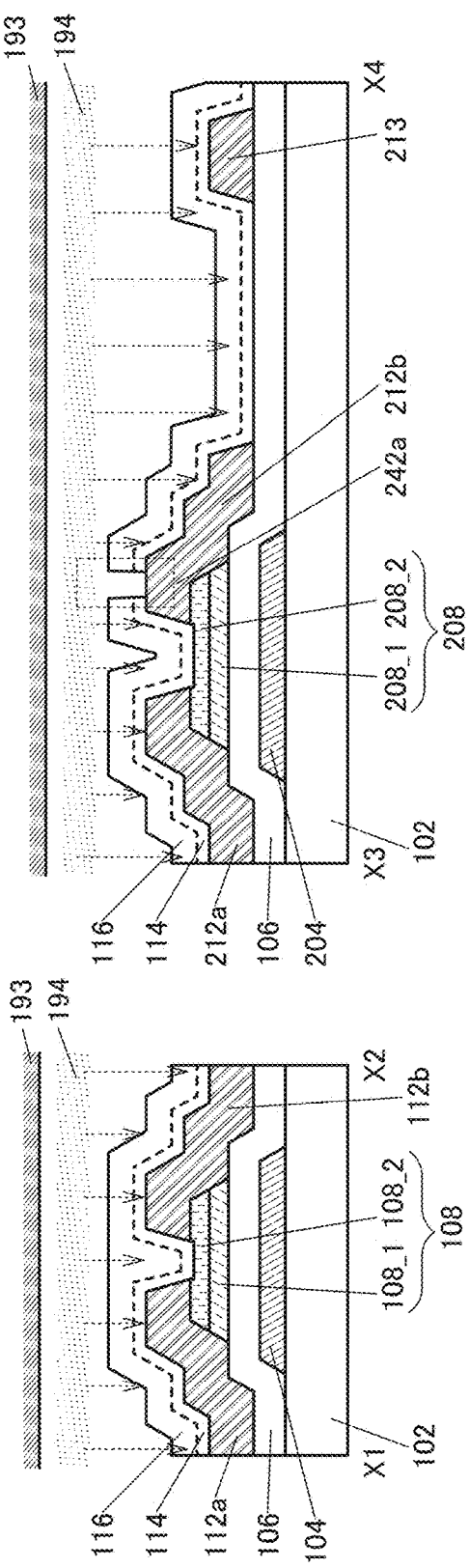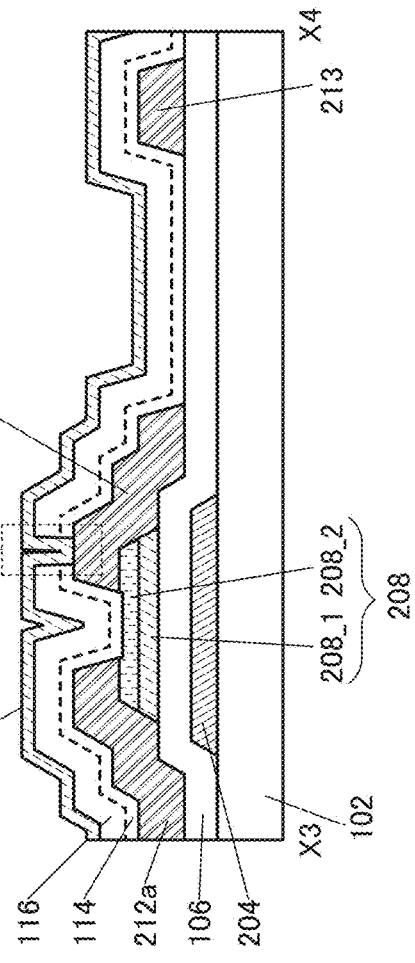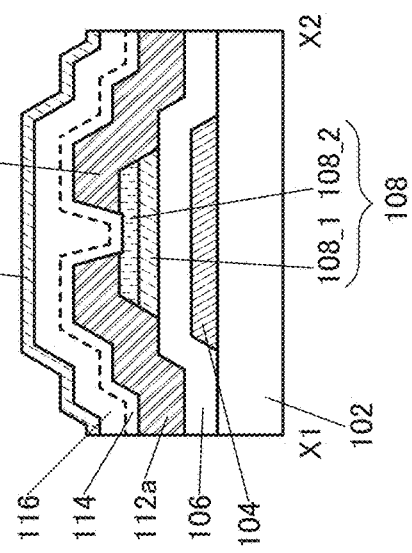

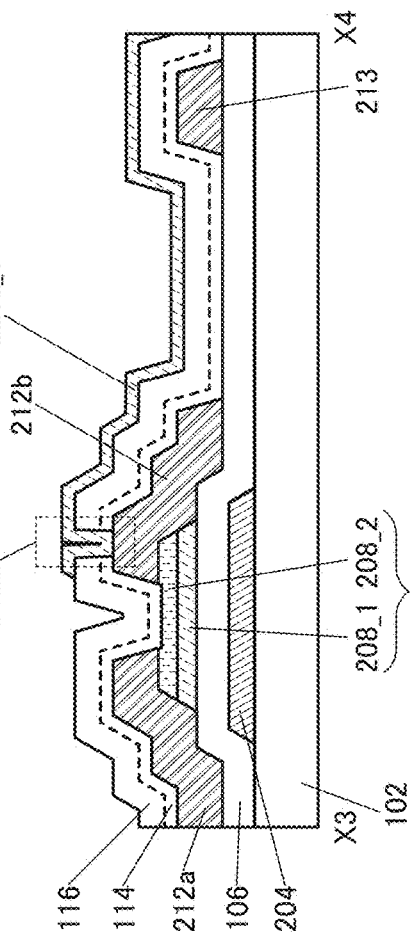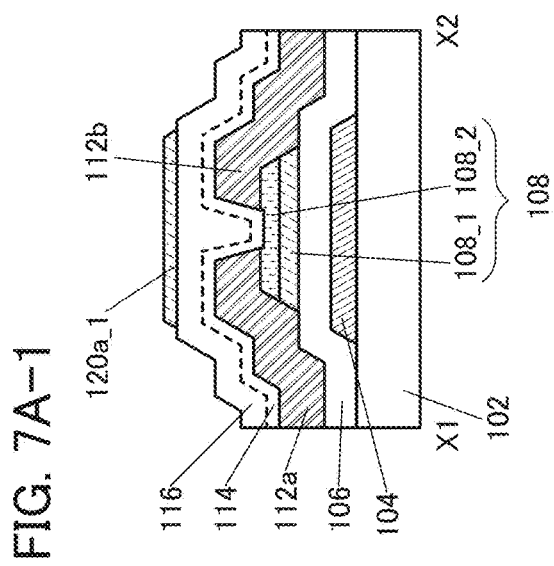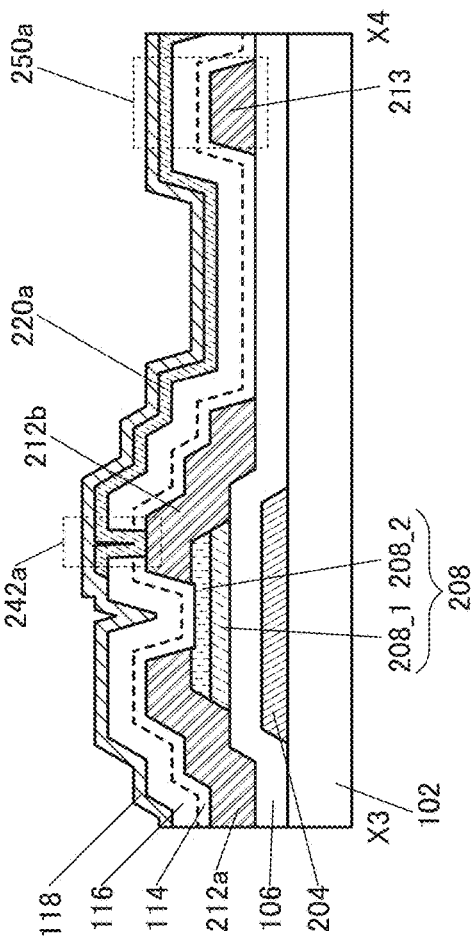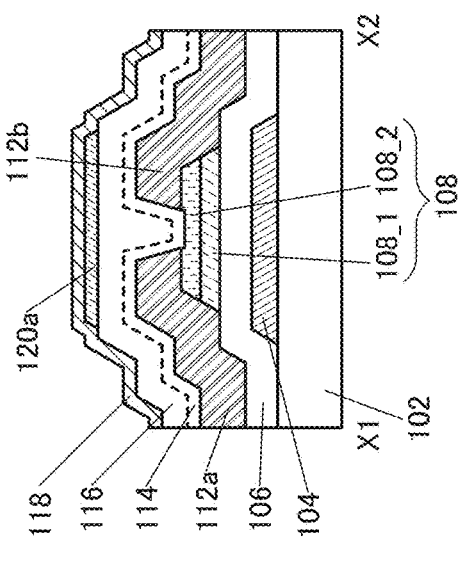

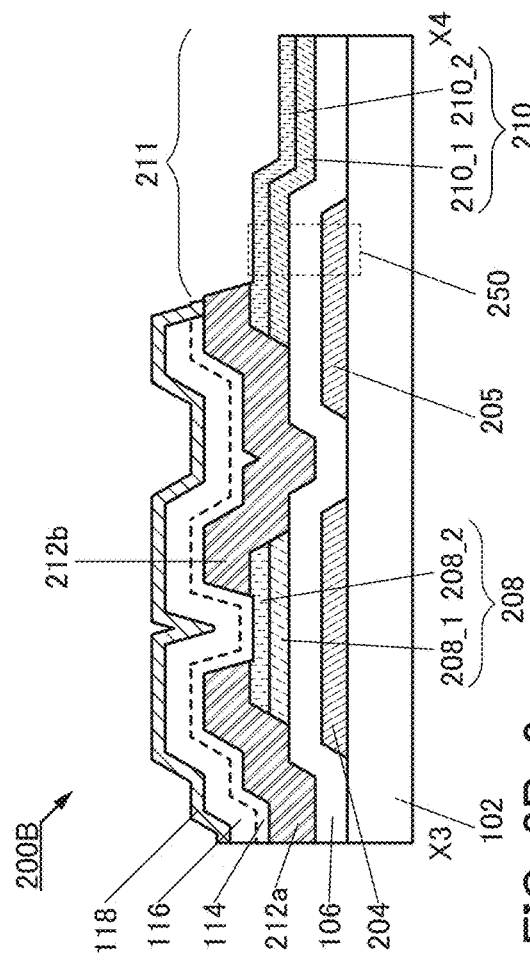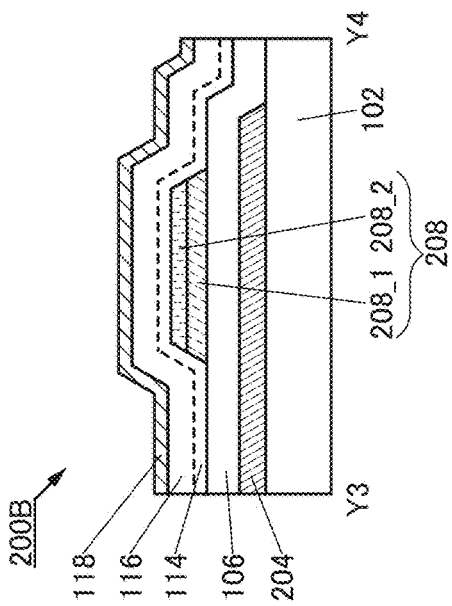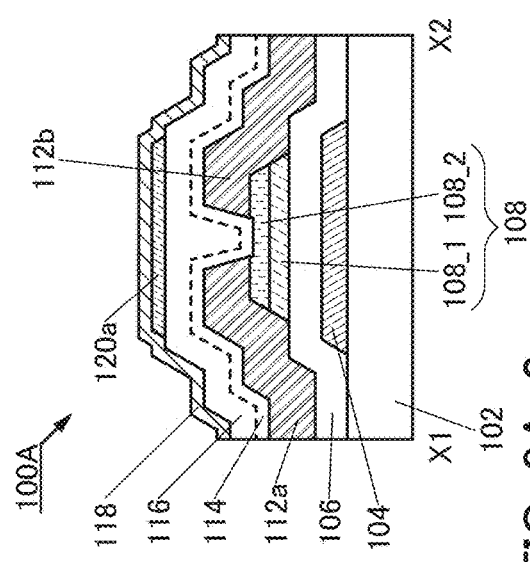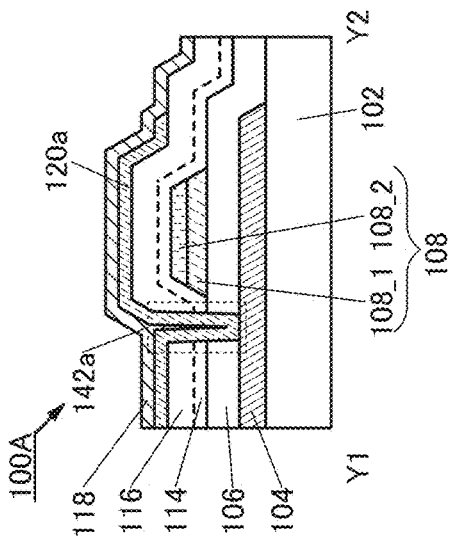

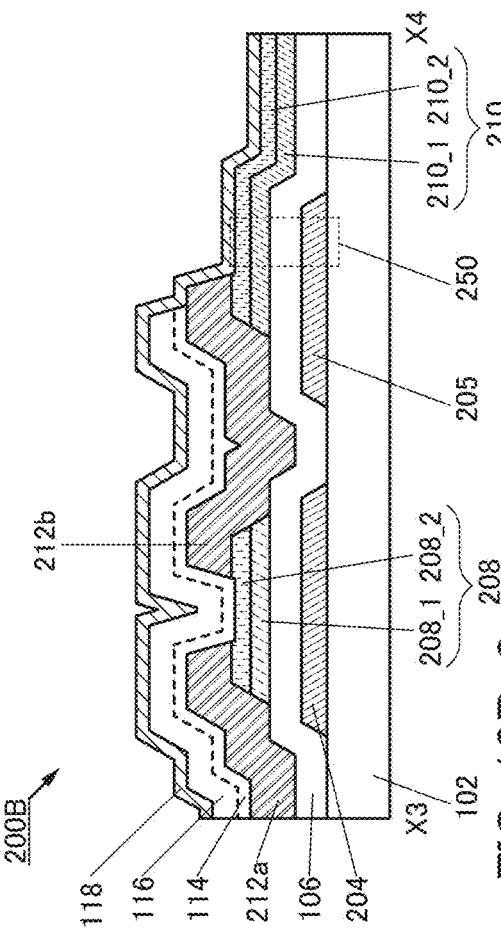
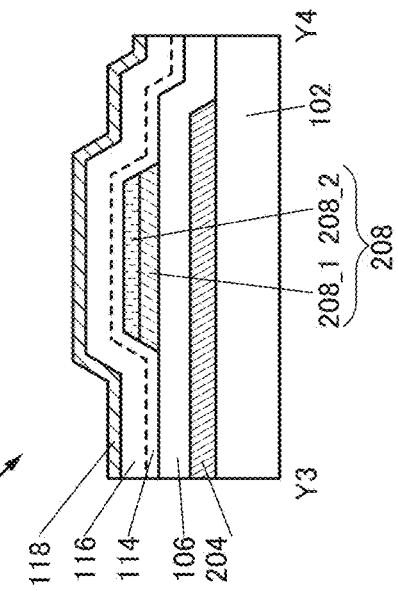
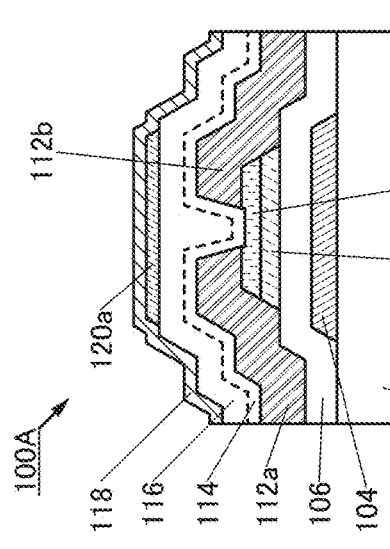
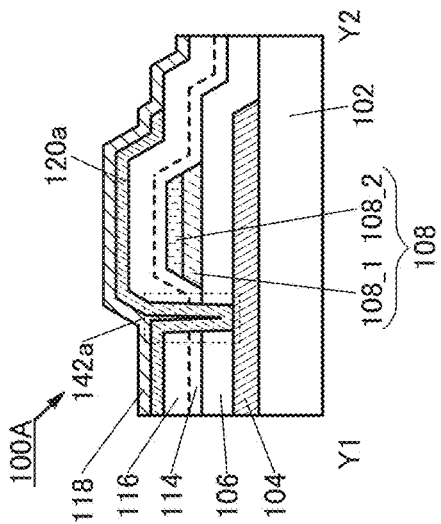
FIG. 10A-1
FIG. 10B-1
FIG. 10A-2
FIG. 10B-2

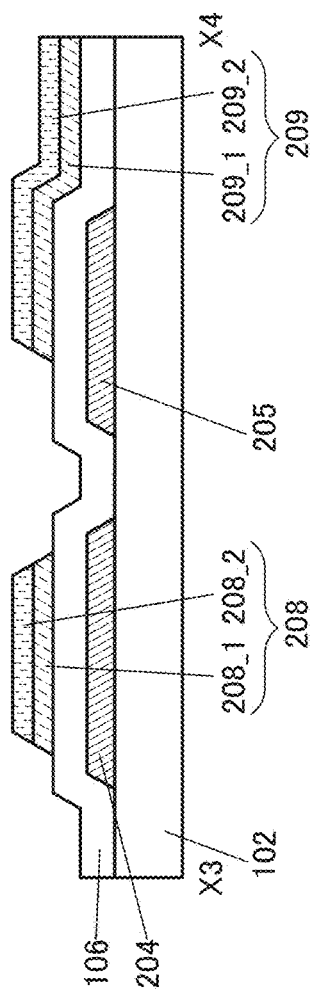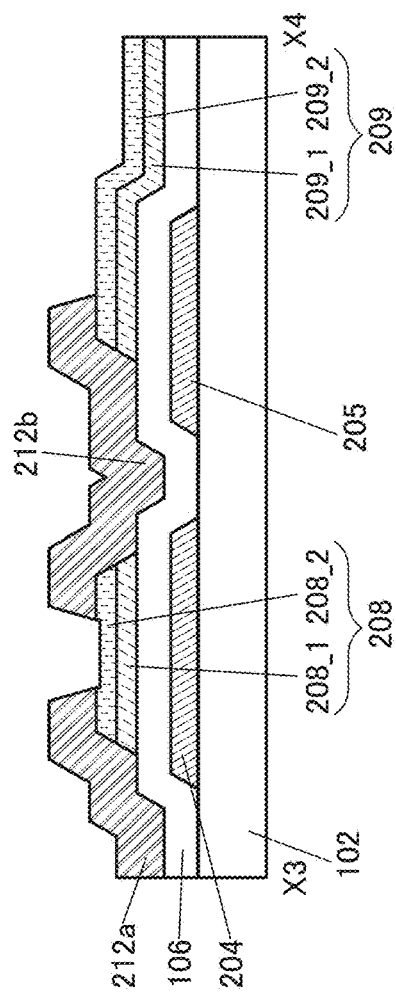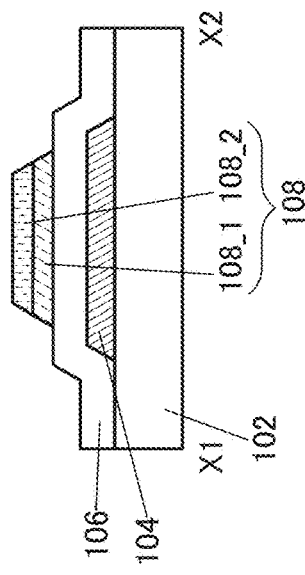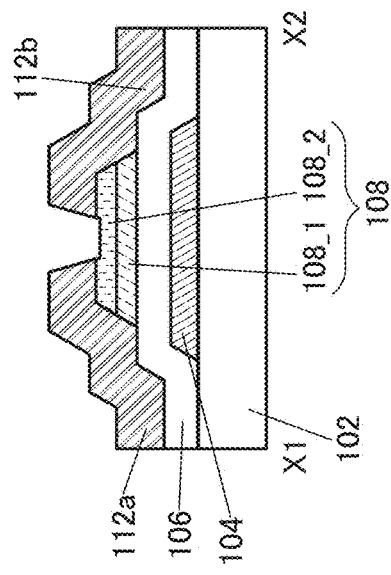

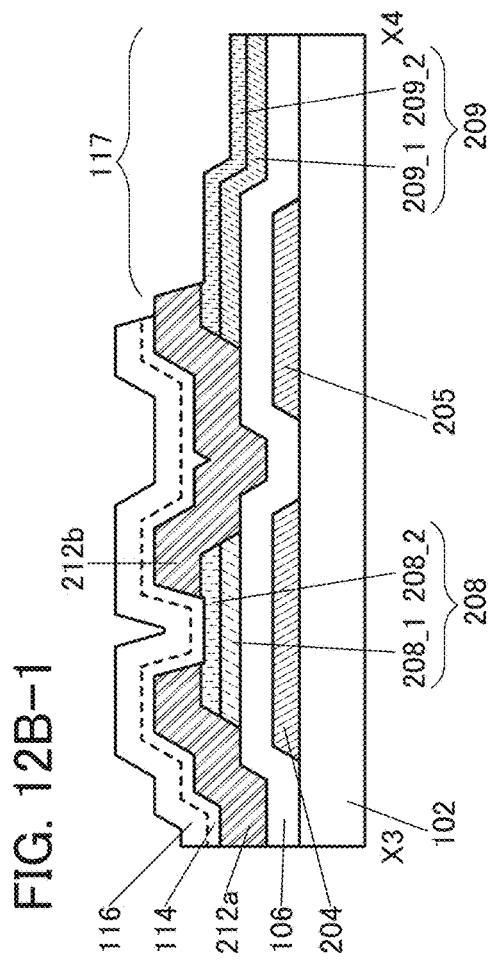
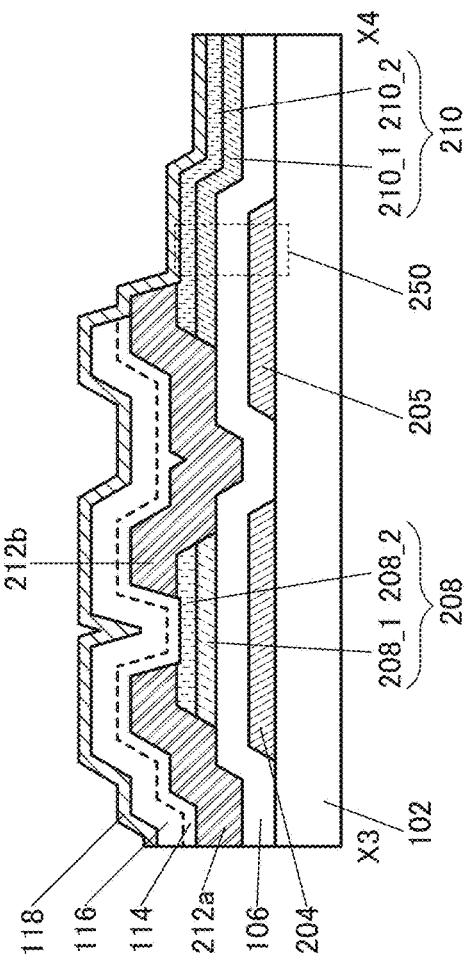
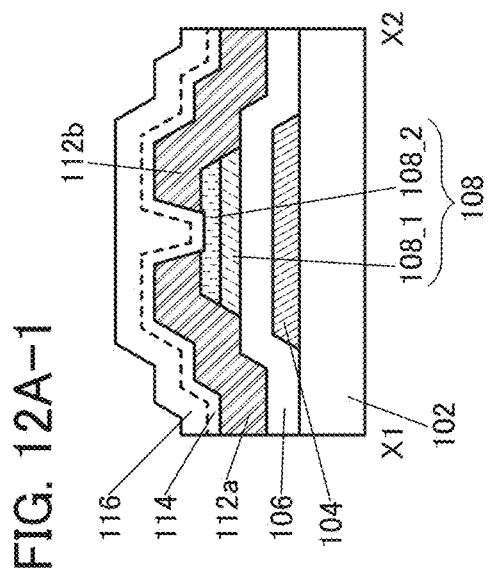
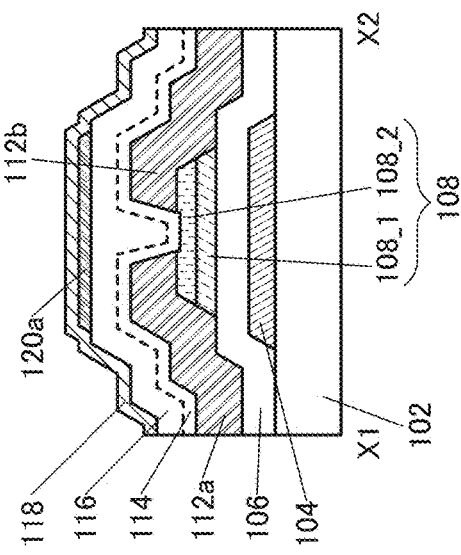

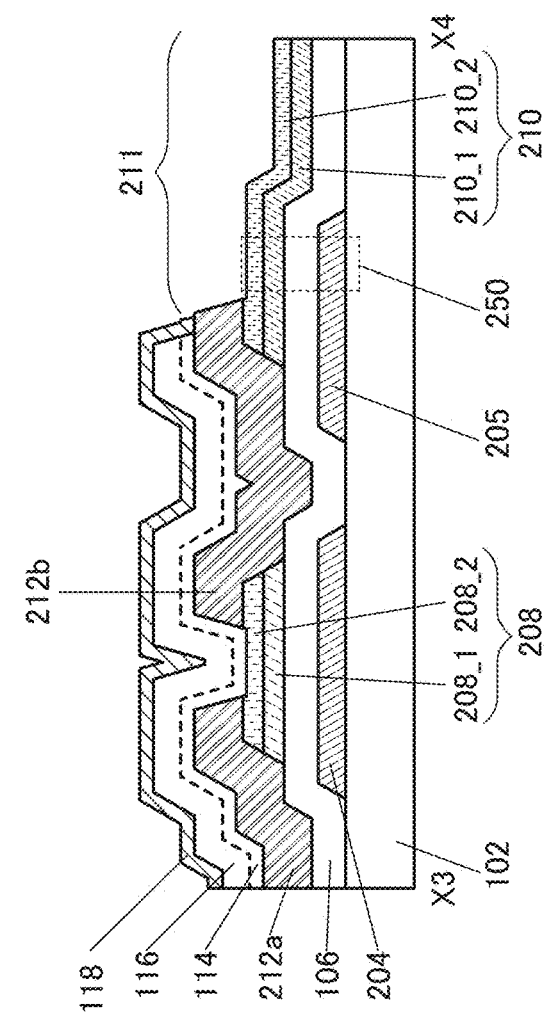
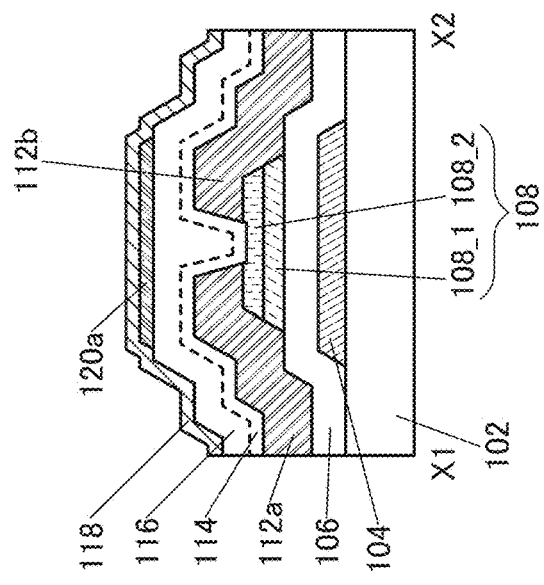

DISPLAY DEVICE AND ELECTRONIC DEVICE

TECHNICAL FIELD

One embodiment of the present invention relates to a display device and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

As a semiconductor material that can be used in a transistor, an oxide semiconductor has been attracting attention. For example, a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium is disclosed (see Patent Document 1).

A technique for using oxide semiconductor transistors for display devices such as liquid crystal displays and organic electroluminescent (EL) displays has attracted attention. The off-state current of the oxide semiconductor transistors is extremely low. Patent Document 2 and Patent Document 3 each disclose a technique in which such an extremely low off-state current is used to reduce the refresh frequency at the time of displaying still images and the power consumption of the liquid crystal displays or the organic EL displays. Note that such a driving method that reduces the power consumption of display devices is referred to as idling stop (IDS) driving, in this specification.

REFERENCE

Patent Documents

[Patent Document 1] Japanese Published Patent Application No. 2014-007399
[Patent Document 2] Japanese Published Patent Application No. 2011-141522
[Patent Document 3] Japanese Published Patent Application No. 2011-141524

DISCLOSURE OF INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and a current flows through the transistor.

Furthermore, in a transistor that uses an oxide semiconductor film in a channel region, oxygen vacancies which are formed in the oxide semiconductor film adversely affect the transistor characteristics. For example, oxygen vacancies formed in the oxide semiconductor film are bonded with hydrogen to serve as carrier supply sources. The carrier supply sources generated in the oxide semiconductor film cause a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, especially in the channel region of the oxide semiconductor film, the amount of oxygen vacancies is preferably small or the amount with which the normally-on characteristics are not exhibited.

In the case where a plurality of different circuits are formed on an insulating surface (e.g., in the case where a pixel portion and a driver circuit are formed over the same substrate) to manufacture a display device, excellent switching characteristics such as a high on/off ratio are needed for a transistor used for the pixel portion, and high operation speed is needed for a transistor used for the driver circuit. In particular, the higher the resolution of a display device is, as in an ultra-high-definition (also referred to as 4K resolution, 4K2K, or 4K) display device or a super-high-definition (also referred to as 8K resolution, 8K4K, or 8K) display device, the shorter the writing time of a display image is; thus, it is preferable that the transistor used for the driver circuit operate at high speed.

In view of the foregoing problems, an object of one embodiment of the present invention is to improve the field-effect mobility and reliability of a transistor including a metal oxide film. Another object of one embodiment of the present invention is to inhibit a change in the electrical characteristics of a transistor including a metal oxide film and to improve the reliability of the transistor. Another object of one embodiment of the present invention is to provide a display device with high display quality and high resolution. Another object of one embodiment of the present invention is to provide a display device with reduced power consumption. Another object of one embodiment of the present invention is to provide a novel display device. Another object of one embodiment of the present invention is to provide a novel electronic device.

Note that the description of the above objects does not preclude the existence of other objects. In one embodiment of the present invention, there is no need to achieve all the objects. Objects other than the above objects will be apparent from and can be derived from the description of the specification and the like.

One embodiment of the present invention is a display device including a pixel portion and a driver circuit for driving the pixel portion. The driver circuit includes a first transistor. The pixel portion includes a second transistor and a pixel electrode electrically connected to the second transistor. The first transistor includes a first gate electrode, a second gate electrode, and a first metal oxide film serving as a channel between the first gate electrode and the second gate electrode. The first gate electrode and the second gate electrode are electrically connected to each other. The second transistor includes a second metal oxide film serving as a channel. The pixel electrode is formed using a third metal oxide film. The third metal oxide film includes a region having higher hydrogen concentration than the second metal oxide film. The first metal oxide film, the second metal oxide film, and the third metal oxide film each include a first region and a second region. The first region contains In or Zn, and oxygen. The second region contains In or an element M, and oxygen. The first region and the second region are dispersed or distributed in a mosaic pattern.

Note that the display device may have the following structure: an insulating film is over the first metal oxide film and the second transistor; the insulating film has an opening over the second transistor; the second metal oxide film is over a gate insulating film; the third metal oxide film and one of the first gate electrode and the second gate electrode are over the insulating film; and the third metal oxide film is electrically connected to the second transistor in the opening of the insulating film.

Alternatively, the display device may have the following structure: a first insulating film and a second insulating film are stacked in this order over the first metal oxide film and the second transistor; the first insulating film and the second insulating film each have an opening over the second transistor; the second metal oxide film is over a gate insulating film; one of the first gate electrode and the second gate electrode is over the first insulating film; the third metal oxide film is over the second insulating film; and the third metal oxide film is electrically connected to the second transistor in the openings of the first insulating film and the second insulating film.

The first insulating film may include an inorganic insulating film and the second insulating film may include an organic resin film.

The second transistor may include a third gate electrode and a gate insulating film. The second metal oxide film and the third metal oxide film may be over the gate insulating film.

One embodiment of the present invention is a display device including a pixel portion and a driver circuit for driving the pixel portion. The driver circuit includes a first transistor. The pixel portion includes a second transistor and a pixel electrode electrically connected to the second transistor. A first insulating film and a second insulating film are stacked in this order over the second transistor. The first insulating film and the second insulating film each have an opening over the second transistor. The first transistor includes a first gate electrode, a second gate electrode, and a first metal oxide film serving as a channel between the first gate electrode and the second gate electrode. The first gate electrode and the second gate electrode are electrically connected to each other. The second transistor includes a second metal oxide film serving as a channel. One of the first gate electrode and the second gate electrode is over the first insulating film. The pixel electrode is over the second insulating film. The pixel electrode is electrically connected to the second transistor in the openings of the first insulating film and the second insulating film. The first metal oxide film and the second metal oxide film each include a first region and a second region. The first region contains In or Zn, and oxygen. The second region contains In or an element M, and oxygen. The first region and the second region are dispersed or distributed in a mosaic pattern.

The first insulating film may include an inorganic insulating film and the second insulating film may include an organic resin film.

The hydrogen concentration of the third metal oxide film may be higher than or equal to $1 \times 10^{20}$ atoms/cm$^3$.

The first metal oxide film, the second metal oxide film, and the third metal oxide film may each include a region where an In content accounts for 40% or higher and 50% or lower of the total sum of In, M, and Zn atoms and a region where an M content accounts for 5% or higher and 30% or lower of the total sum of In, M, and Zn atoms.

In each of the first metal oxide film, the second metal oxide film, and the third metal oxide film, when the atomic ratio of In to M and Zn is 4:x:y, x may be greater than or equal to 1.5 and less than or equal to 2.5 and y may be greater than or equal to 2 and less than or equal to 4.

In each of the first metal oxide film, the second metal oxide film, and the third metal oxide film, when the atomic ratio of In to M and Zn is 5:x:y, x may be greater than or equal to 0.5 and less than or equal to 1.5 and y may be greater than or equal to 5 and less than or equal to 7.

The element M may be one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

The first transistor may have a dual-gate structure and the second transistor may have a single-gate structure.

Another embodiment of the present invention is a display module including any of the display devices and a touch sensor. Another embodiment of the present invention is an electronic device including any of the display devices or the display module, and a receiver, an operation key, or a battery.

One embodiment of the present invention can improve the field-effect mobility and reliability of a transistor including a metal oxide film. One embodiment of the present invention can inhibit a change in the electrical characteristics of a transistor including a metal oxide film and can improve the reliability of the transistor. One embodiment of the present invention can provide a display device with high display quality and high resolution. One embodiment of the present invention can provide a display device with reduced power consumption. One embodiment of the present invention can provide a novel display device. One embodiment of the present invention can provide a novel electronic device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 1A-1, 1A-2, 1B-1, and 1B-2 are cross-sectional views illustrating a display device.

FIGS. 4A-1, 4A-2, 4B-1, and 4B-2 are cross-sectional views illustrating a display device.

FIGS. 5A-1 to 5A-3 and 5B-1 to 5B-3 are cross-sectional views illustrating a method for manufacturing a display device.

FIGS. 6A-1, 6A-2, 6B-1, and 6B-2 are cross-sectional views illustrating a method for manufacturing a display device.

FIGS. 7A-1, 7A-2, 7B-1, and 7B-2 are cross-sectional views illustrating a method for manufacturing a display device.

FIGS. 8A-1, 8A-2, 8B-1, and 8B-2 are cross-sectional views illustrating a display device.

FIGS. 10A-1, 10A-2, 10B-1, and 10B-2 are cross-sectional views illustrating a display device.

FIGS. 11A-1, 11A-2, 11B-1, and 11B-2 are cross-sectional views illustrating a method for manufacturing a display device.

FIGS. 12A-1, 12A-2, 12B-1, and 12B-2 are cross-sectional views illustrating a method for manufacturing a display device.

FIGS. 13A-1 and 13B-1 are cross-sectional views illustrating a method for manufacturing a display device.

BEST MODE FOR CARRYING OUT THE INVENTION

Figure 2A:
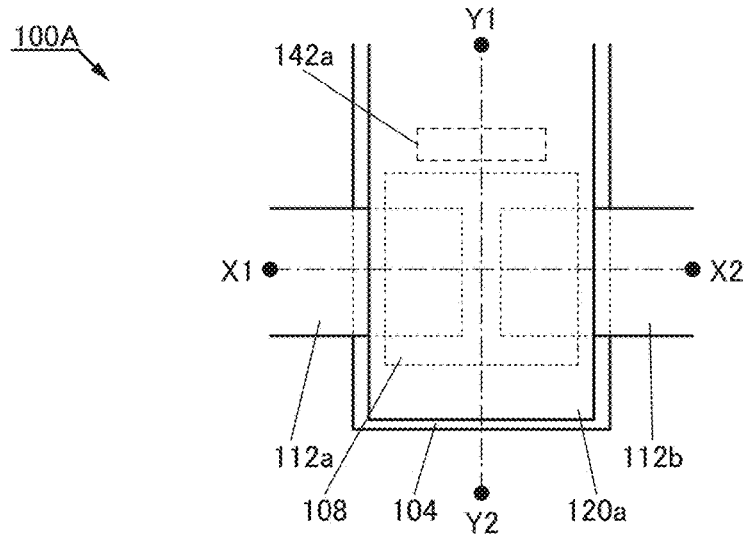
FIGS. 2A and 2B are top views illustrating a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate depending on a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function." There is no particular limitation on the "object having any electric function" as long as electric signals can be transmitted and received between components that are connected through the object. Examples of an "object having any electric function" include, as well as an electrode and a wiring, a switching element such as a transistor, a resistor, an inductor, a capacitor, and an element with a variety of functions.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state or cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is a $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.5 V to −0.8 V; therefore, it can be said that the off-state current of the transistor is $1\times10^{-19}$ A or lower. Since there is a $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like is used (e.g., a temperature in the range of 5° C. to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of ($I_d$=0 A) and an extrapolated straight line that is tangent with the highest inclination to a plotted curve ($V_g\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, an impurity in a semiconductor refers to an element that is not a main component of a semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, a metal oxide having at least one of an amplification function, a rectification function, and a switching function can be referred to as a metal oxide semiconductor (abbreviated to an OS). That is, an OS FET is a transistor including a metal oxide or an oxide semiconductor.

In this specification and the like, a metal oxide including nitrogen is also referred to as a metal oxide in some cases. Alternatively, a metal oxide including nitrogen may be referred to as a metal oxynitride.

Embodiment 1

In this embodiment, a display device of one embodiment of the present invention and a method for manufacturing the display device will be described with reference to FIGS. 1A-1, 1A-2, 1B-1, and 1B-2, FIGS. 2A and 2B, FIG. 3, FIGS. 4A-1, 4A-2, 4B-1, and 4B-2, FIGS. 5A-1 to 5A-3 and 5B-1 to 5B-3, FIGS. 6A-1, 6A-2, 6B-1, and 6B-2, FIGS. 7A-1, 7A-2, 7B-1, and 7B-2, FIGS. 8A-1, 8A-2, 8B-1, and 8B-2, FIGS. 9A and 9B, FIGS. 10A-1, 10A-2, 10B-1, and 10B-2, FIGS. 11A-1, 11A-2, 11B-1, and 11B-2, FIGS. 12A-1, 12A-2, 12B-1, and 12B-2, FIGS. 13A-1 and 13B-1, FIGS. 14A to 14C, FIGS. 15A to 15C, and FIGS. 16A and 16B.

<1-1. Structure Example 1 of Display Device>

Figure 2B:
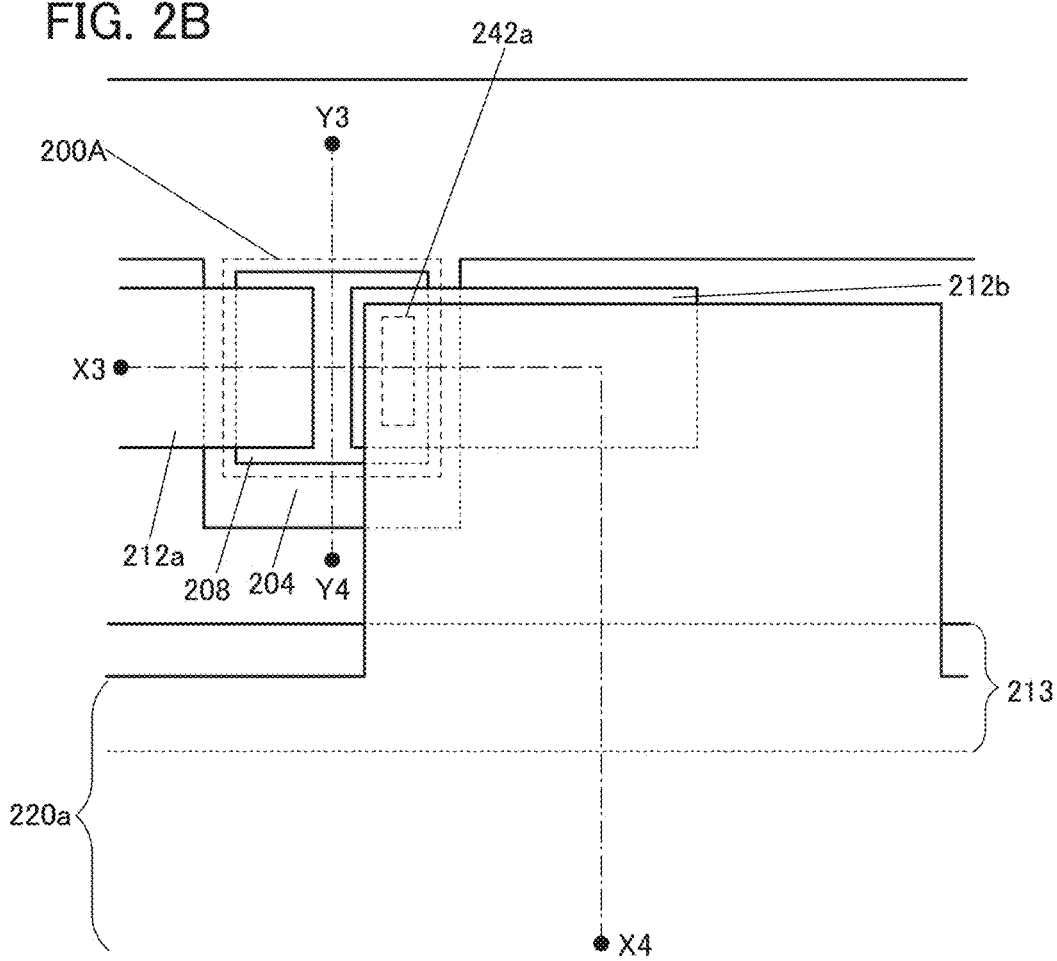

FIGS. 2A and 2B are top views of transistors included in a driver circuit and a display portion of a display device of one embodiment of the present invention. FIG. 2A is a top view of a transistor 100A included in the driver circuit, and FIG. 2B is a top view of a transistor 200A included in a pixel portion. FIG. 1A-1 corresponds to a cross-sectional view taken along dashed-dotted line X1-X2 in FIG. 2A, FIG. 1A-2 corresponds to a cross-sectional view taken along dashed-dotted line Y1-Y2 in FIG. 2A, FIG. 1B-1 corresponds to a cross-sectional view taken along dashed-dotted line X3-X4 in FIG. 2B, and FIG. 1B-2 corresponds to a cross-sectional view taken along dashed-dotted line Y3-Y4 in FIG. 2B. Note that in FIGS. 2A and 2B, some components of the transistors 100A and 200A (e.g., an insulating film functioning as a gate insulating film) are not illustrated to avoid complexity. In the transistors, the directions of the dashed-dotted lines X1-X2 and X3-X4 may be called channel length directions, and the directions of the dashed-dotted lines Y1-Y2 and Y3-Y4 may be called channel width directions. As in FIGS. 2A and 2B, some components are not illustrated in some cases in top views of transistors described below.

As illustrated in FIGS. 1A-1 and 1A-2, the driver circuit includes the transistor 100A.

The transistor 100A includes a conductive film 104 over a substrate 102, an insulating film 106 over the substrate 102 and the conductive film 104, a metal oxide film 108 over the insulating film 106, a conductive film 112a over the metal oxide film 108, and a conductive film 112b over the metal oxide film 108. Furthermore, an insulating film 114, an insulating film 116 over the insulating film 114, and an insulating film 118 over the insulating film 116 are formed over the transistor 100A, specifically over the metal oxide film 108, the conductive film 112a, and the conductive film 112b.

The insulating films 106, 114, and 116 have an opening 142a. A conductive film 120a is electrically connected to the conductive film 104 through the opening 142a.

Note that the transistor 100A is what is called a channel-etched transistor, and has a dual-gate structure.

As illustrated in FIGS. 1B-1 and 1B-2, the pixel portion includes the transistor 200A, a conductive film 220a functioning as a pixel electrode, a conductive film 213 functioning as a capacitor wiring, and a capacitor 250a.

The transistor 200A includes a conductive film 204 over the substrate 102, the insulating film 106 over the substrate 102 and the conductive film 204, a metal oxide film 208 over the insulating film 106, a conductive film 212a over the metal oxide film 208, and a conductive film 212b over the metal oxide film 208. Furthermore, the insulating film 114, the insulating film 116 over the insulating film 114, and the insulating film 118 over the insulating film 116 are formed over the transistor 200A, specifically over the metal oxide film 208, the conductive film 212a, and the conductive film 212b.

The insulating films 114 and 116 have an opening 242a. The conductive film 220a functioning as the pixel electrode is electrically connected to the conductive film 212b through the opening 242a. The conductive film 213 functioning as the capacitor wiring is formed over the insulating film 106. The conductive film 213 is formed at the same time as the conductive films 112a, 112b, 212a, and 212b; alternatively, the conductive film 213 may be formed at the same time as the conductive films 104 and 204. The conductive film 213, the insulating films 114 and 116, and the conductive film 220a form the capacitor 250a.

Note that the transistor 200A is what is called a channel-etched transistor, and has a single-gate structure.

The conductive film 120a included in the transistor 100A and the conductive film 220a functioning as the pixel electrode are formed in the same step. The conductive films 120a and 220a are preferably formed using an oxide conductor (OC) film that will be described later. When an oxide conductor film is used for the conductive films 120a and 220a, oxygen can be added to the insulating films 114 and 116. Oxygen added to the insulating films 114 and 116 can move to the metal oxide films 108 and 208 to fill oxygen vacancies in the metal oxide films 108 and 208. As a result, the reliability of the transistors 100A and 200A can be increased. Note that the conductive films 120a and 220a may be formed using a material that can also be used for the conductive films 104, 112a, 112b, 204, 212a, and 212b.

The insulating film 106 functions as first gate insulating films of the transistors 100A and 200A. The insulating films 114 and 116 function as a second gate insulating film of the transistor 100A. The insulating film 118 functions as protective insulating films of the transistors 100A and 200A. In the transistor 100A, the conductive film 104 functions as a first gate electrode, the conductive film 112a functions as a source electrode, the conductive film 112b functions as a drain electrode, and the conductive film 120a functions as a second gate electrode. In the transistor 200A, the conductive film 204 functions as a gate electrode, the conductive film 212a functions as a source electrode, and the conductive film 212b functions as a drain electrode.

In the transistor 100A, the conductive film 120a is electrically connected to the conductive film 104 through the opening 142a as illustrated in FIG. 1A-2.

Furthermore, as illustrated in FIG. 1A-2, the metal oxide film 108 is positioned between the two conductive films functioning as the gate electrodes so as to face the conductive films 104 and 120a. The length of the conductive film 120a in the channel length direction and that in the channel width direction are longer than the length of the metal oxide film 108 in the channel length direction and that in the channel width direction, respectively, and the metal oxide film 108 is entirely covered with the conductive film 120a with the insulating films 114 and 116 positioned therebetween.

In other words, the conductive film 104 and the conductive film 120a are connected through the opening provided in the insulating films 106, 114, and 116, and each include a region positioned outside an edge portion of the metal oxide film 108.

With this structure, the metal oxide film 108 included in the transistor 100A can be electrically surrounded by electric fields of the conductive films 104 and 120a. A device structure of a transistor, like that of the transistor 100A, in which electric fields of a first gate electrode and a second gate electrode electrically surround a metal oxide film where a channel region is formed can be referred to as a surrounded channel (S-channel) structure.

Since the transistor 100A has an S-channel structure, an electric field for inducing a channel can be effectively applied to the metal oxide film 108 by the conductive film 104 functioning as the first gate electrode; therefore, the current drive capability of the transistor 100A can be improved and high on-state current characteristics can be obtained. Since the on-state current can be increased, it is possible to reduce the size of the transistor 100A. In addition, since the transistor 100A has a structure where the metal oxide film 108 is surrounded by the conductive film 104 functioning as the first gate electrode and the conductive film 120a functioning as the second gate electrode, the mechanical strength of the transistor 100A can be increased.

In the transistor 100A, the metal oxide film 108 includes a metal oxide film 108_1 over the insulating film 106 and a metal oxide film 108_2 over the metal oxide film 108_1. In the transistor 200A, the metal oxide film 208 includes a metal oxide film 208_1 over the insulating film 106 and a metal oxide film 2082 over the metal oxide film 208_1. The metal oxide films 108_1, 108_2, 208_1, and 208_2 contain the same element. For example, it is preferable that the metal oxide films 108_1, 108_2, 208_1, and 208_2 each independently contain In, M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn.

Furthermore, it is preferable that the metal oxide films 108_1, 108_2, 208_1, and 208_2 each independently have a region in which the atomic proportion of In is higher than that of M. For example, the atomic ratio of In to M and Zn in each of the metal oxide films 108_1, 108_2, 208_1, and 208_2 is preferably In:M:Zn=4:2:3 or in its neighborhood. Note that the term "neighborhood" here includes the following: when In is 4, M is greater than or equal to 1.5 and less than or equal to 2.5 and Zn is greater than or equal to 2 and less than or equal to 4. Alternatively, the atomic ratio of In to M and Zn in each of the metal oxide films 108_1, 108_2, 208_1, and 208_2 is preferably 5:1:6 or in its neighborhood. The metal oxide films 108_1, 108_2, 208_1, and 208_2 having substantially the same composition as described above can be formed using the same sputtering target; thus, the manufacturing cost can be reduced. In the case of using the same sputtering target, the metal oxide films 108_1, 108_2, 208_1, and 208_2 can be successively formed in vacuum in the same chamber. This can prevent impurities from entering the interface between the metal oxide film 108_1 and the metal oxide film 108_2 and the interface between the metal oxide film 208_1 and the metal oxide film 208_2.

A metal oxide having a cloud-aligned composite (CAC) composition is suitably used for the metal oxide films 108_1, 108_2, 208_1, and 208_2. The metal oxide will be described with reference to FIG. 3.

Figure 3:
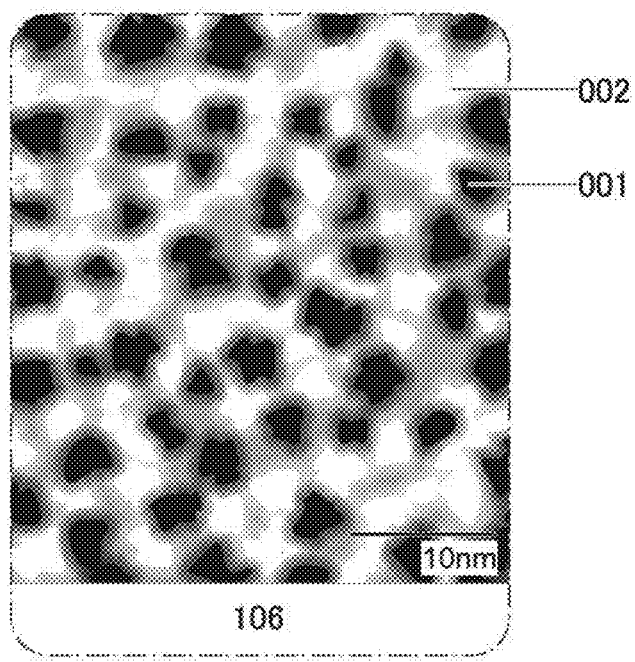
FIG. 3 is a conceptual diagram of a composition of a metal oxide.

FIG. 3 is a conceptual diagram of the metal oxide having a CAC composition. In this specification, a metal oxide of one embodiment of the present invention having a semiconductor function is defined as a cloud-aligned composite metal oxide semiconductor (CAC-MO) or a cloud-aligned composite oxide semiconductor (CAC-OS).

In the CAC-MO or the CAC-OS, as illustrated in FIG. 3 for example, elements contained in the metal oxide are unevenly distributed to form regions 001 and 002 each containing any of the elements as a main component. The regions are mixed to form or to be distributed in a mosaic pattern. In other words, the CAC-MO or the CAC-OS has a composition in which elements contained in the metal oxide are unevenly distributed in regions each having a size greater than or equal to 0.5 nm and less than or equal to 10 nm, preferably greater than or equal to 1 nm and less than or equal to 2 nm, or a similar size. Note that in the following description of a metal oxide, the state in which one or more metal elements are unevenly distributed in regions each having a size greater than or equal to 0.5 nm and less than or equal to 10 nm, preferably greater than or equal to 1 nm and less than or equal to 2 nm, or a similar size and the regions containing the metal element(s) are mixed is referred to as a mosaic pattern or a patch-like pattern.

The CAC-MO or the CAC-OS has a conducting function in a part of the material and has an insulating function in another part of the material; as a whole, the CAC-MO or the CAC-OS has a function of a semiconductor. In the case where the CAC-MO or the CAC-OS is used in a channel of a transistor, the conducting function is to allow electrons (or holes) serving as carriers to flow, and the insulating function is to not allow electrons serving as carriers to flow. By the complementary action of the conducting function and the insulating function, the CAC-MO or the CAC-OS can have a switching function (on/off function). In the CAC-MO or the CAC-OS, separation of the functions can maximize each function.

In this specification and the like, the CAC-MO or the CAC-OS includes conductive regions and insulating regions. For example, one of the regions 001 and 002 illustrated in FIG. 3 may be the conductive region and the other may be the insulating region. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

The CAC-MO or the CAC-OS may contain components having different bandgaps. For example, the CAC-MO or the CAC-OS contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-MO or CAC-OS is used in a channel region of a transistor, high current drive capability in the on state of the transistor, that is, high on-state current and high field-effect mobility, can be obtained.

Note that the CAC-MO or the CAC-OS can also be referred to as a matrix composite or a metal matrix composite. The details of the CAC-MO or the CAC-OS will be described in Embodiment 2.

When the metal oxide films 108_1, 108_2, 208_1, and 208_2 each independently have a CAC composite and a region in which the atomic proportion of In is higher than the atomic proportion of M, the transistors 100A and 200A can have high field-effect mobility. Specifically, the transistors 100A and 200A can have field-effect mobility greater than 40 cm$^2$/Vs, preferably greater than 50 cm$^2$/Vs, further preferably greater than 100 cm$^2$/Vs.

Since the transistor 100A having an S-channel structure has high field-effect mobility and high driving capability, the use of the transistor 100A in the driver circuit, a typical example of which is a gate driver that generates a gate signal, allows the display device to have a narrow bezel width (narrow bezel). The use of the transistor 100A in a source driver (particularly in a demultiplexer connected to an output terminal of a shift register included in the source driver) that supplies a signal from a signal line included in the display device can reduce the number of wirings connected to the display device.

Furthermore, the transistors 100A and 200A are each a channel-etched transistor and thus can be fabricated through a smaller number of steps than a transistor formed using low-temperature polysilicon. In addition, the metal oxide films are used for the channels of the transistors 100A and 200A; thus, a laser crystallization step is unnecessary unlike in the case of the transistor formed using low-temperature polysilicon. Accordingly, the manufacturing cost can be reduced even in the case of a display device formed using a large substrate. Transistors having high field-effect mobility like the transistors 100A and 200A are preferably used in a driver circuit and a display portion of a large display device having high resolution such as ultra high definition (4K resolution, 4K2K, or 4K) or super high definition (8K resolution, 8K4K, or 8K), in which case writing can be performed in a short time and display defects can be reduced.

<1-2. Components of Display Device>

Next, components of the display device of this embodiment will be described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6$^{th}$ generation (1500 mm×1850 mm), the 7$^{th}$ generation (1870 mm×2200 mm), the 8$^{th}$ generation (2200 mm×2400 mm), the 9$^{th}$ generation (2400 mm×2800 mm), and the 10$^{th}$ generation (2950 mm×3400 mm). Thus, a large-sized display device can be fabricated.

Alternatively, a flexible substrate may be used as the substrate 102, and the transistors 100A and 200A may be provided directly on the flexible substrate. Alternatively, a separation layer may be provided between the substrate 102 and each of the transistors 100A and 200A. The separation layer can be used when part or the whole of a semiconductor device formed over the separation layer is separated from the substrate 102 and transferred onto another substrate. In such a case, the transistors 100A and 200A can be transferred to a substrate having low heat resistance or a flexible substrate as well.

[Conductive Film]

The conductive films 104, 204, and 120a functioning as the gate electrodes, the conductive films 112a and 212a functioning as the source electrodes, and the conductive films 112b and 212b functioning as the drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 104, 112a, 112b, 120a, 204, 212a, and 212b can be formed using a metal oxide such as an oxide containing indium and tin (In—Sn oxide), an oxide containing indium and tungsten (In—W oxide), an oxide containing indium, tungsten, and zinc (In—W—Zn oxide), and oxide containing indium and titanium (In—Ti oxide), an oxide containing indium, titanium, and tin (In—Ti—Sn oxide), an oxide containing indium and zinc (In—Zn oxide), an oxide containing indium, tin, and silicon (In—Sn—Si oxide), or an oxide containing indium, gallium, and zinc (In—Ga—Zn oxide). The metal oxide can be an oxide conductor or an oxide semiconductor.

Here, an oxide conductor is described. In this specification and the like, an oxide conductor may be referred to as OC. For example, the oxide conductor is obtained in the following manner. Oxygen vacancies are formed in a metal oxide, and then hydrogen is added to the oxygen vacancies, so that a donor level is formed in the vicinity of the conduction band. This increases the conductivity of the metal oxide; accordingly, the metal oxide becomes a conductor. The metal oxide having become a conductor can be referred to as an oxide conductor. An oxide semiconductor generally transmits visible light because of its large energy gap. Since an oxide conductor is a metal oxide having a donor level in the vicinity of the conduction band, the influence of absorption due to the donor level is small in the oxide conductor, and the oxide conductor has a visible light transmitting property comparable to that of an oxide semiconductor.

The hydrogen concentration of the oxide conductor is higher than that of the metal oxide (e.g., oxide semiconductor) functioning as the channel, and is typified by higher than or equal to $8\times10^{19}$ atoms/cm$^3$, preferably higher than or equal to $1\times10^{20}$ atoms/cm$^3$, and further preferably higher than or equal to $5\times10^{20}$ atoms/cm$^3$.

The oxide conductor includes defects and impurities and thus has conductivity. The resistivity of the conductive film containing an oxide conductor is higher than or equal to $1\times10^{-3}$ Ωcm and lower than $1\times10^{4}$ Ωcm, and preferably higher than or equal to $1\times10^{-3}$ Ωcm and lower than $1\times10^{-1}$ Ωcm.

The conductivity of the conductive film containing an oxide conductor is typically higher than or equal to $1\times10^{-2}$ S/m and lower than or equal to $1\times10^{5}$ S/m, or higher than or equal to $1\times10^{3}$ S/m and lower than or equal to $1\times10^{5}$ S/m.

The oxide conductor contains defects as well as impurities. A typical example of the conductive film containing the oxide conductor is a film in which defects are generated by the addition of a rare gas or by the exposure to plasma.

The oxide conductor is preferably formed using the metal oxide having a CAC composition.

A Cu—X alloy film (X is Mn, Ni, Cr, Fe, Co, Mo, Ta, or Ti) may be used for the conductive films 104, 112a, 112b, 120a, 204, 212a, and 212b. The use of the Cu—X alloy film enables the manufacturing cost to be reduced because a wet etching process can be used in the processing. Since the resistance of the Cu—X alloy film is low, the use of the Cu—X alloy film for the conductive films 104, 112a, 112b, 120a, 204, 212a, and 212b can reduce wiring delay. Thus, in manufacturing a large display device, the Cu—X alloy film is suitably used for a wiring.

Among the above-mentioned metal elements, any one or more elements selected from copper, titanium, tungsten, tantalum, and molybdenum are favorably included in the conductive films 112a, 112b, 212a, and 212b. In particular, a tantalum nitride film is suitably used for the conductive films 112a, 112b, 212a, and 212b. A tantalum nitride film has conductivity and a high barrier property against copper or hydrogen. Because a tantalum nitride film releases little hydrogen from itself, it can be favorably used for the conductive film in contact with the metal oxide films 108 and 208 or the conductive film in the vicinity of the metal oxide films 108 and 208. It is favorable to use a copper film for the conductive films 112a, 112b, 212a, and 212b because the resistance of the conductive films 112a, 112b, 212a, and 212b can be reduced.

The conductive films 112a, 112b, 212a, and 212b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Insulating Film Functioning as Gate Insulating Film]

As the insulating film 106 functioning as the gate insulating films of the transistors 100A and 200A, an insulating layer containing at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 106 may have a stacked-layer structure of two, or three or more layers.

The insulating film 106 that is in contact with the metal oxide films 108 and 208 functioning as the channel regions of the transistors 100A and 200A is preferably an oxide insulating film and preferably includes a region including oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has a higher dielectric constant than silicon oxide and silicon oxynitride. Therefore, by using hafnium oxide, the thickness of the insulating film 106 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

Note that one embodiment of the present invention is not limited to the above structure, and a nitride insulating film may be used for the insulating film 106 in contact with the metal oxide films 108 and 208. For example, a silicon nitride film is formed and a surface of the silicon nitride film is oxidized by oxygen plasma treatment or the like performed on the surface of the silicon nitride film. In the case where oxygen plasma treatment or the like is performed on the surface of the silicon nitride film, the surface of the silicon nitride film may be oxidized at the atomic level. For this reason, in the case of performing cross-sectional observation of the transistor, an oxide film is not observed or the silicon nitride film and the metal oxide are observed to be in contact with each other, in some cases. Note that in oxygen plasma treatment, an object is irradiated with plasma generated in an atmosphere containing an oxygen gas. The oxygen gas is a gas containing oxygen, such as oxygen, ozone, or dinitrogen monoxide.

Note that the silicon nitride film has a higher dielectric constant than a silicon oxide film and needs a larger thickness for capacitance equivalent to that of the silicon oxide film. Thus, when the silicon nitride film is included as the gate insulating film of the transistor, the thickness of the insulating film 106 can be increased. This makes it possible to inhibit a decrease in withstand voltage of the transistor and furthermore to increase the withstand voltage, thereby reducing electrostatic discharge damage to the transistor.

In this embodiment, a layered film of a silicon nitride film and a silicon oxide film is formed as the insulating film 106.

[Metal Oxide Film]

The metal oxide films 108 and 208 can be formed using the materials described above.

In the case where the metal oxide films 108 and 208 include an In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, 3:1:2, 4:2:4.1, 5:1:6, 5:1:7, 5:1:8, 6:1:6, or 5:2:5.

In the case where the metal oxide films 108 and 208 are formed using an In-M-Zn oxide, it is preferable to use a target including a polycrystalline In-M-Zn oxide as the sputtering target. The use of the target including a polycrystalline In-M-Zn oxide facilitates formation of the metal oxide films 108 and 208 having crystallinity. Note that the atomic ratio of metal elements in the formed metal oxide films 108 and 208 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed metal oxide films 108 and 208 may be 4:2:3 or in the neighborhood of 4:2:3.

The energy gap of each of the metal oxide films 108 and 208 is 2 eV or more, preferably 2.5 eV or more. With the use of an oxide semiconductor having such a wide energy gap, the off-state current of each of the transistors 100A and 200A can be reduced.

Furthermore, the metal oxide films 108 and 208 each preferably have a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

Even when the metal oxide films 108_1, 108_2, 208_1, and 208_2 each independently have a region in which the atomic proportion of In is higher than the atomic proportion of M, the field-effect mobility might be low if the metal oxide films 108_1, 108_2, 208_1, and 208_2 each have high crystallinity.

Thus, the metal oxide film 108_1 may have a region having lower crystallinity than the metal oxide film 108_2, and the metal oxide film 208_1 may have a region having lower crystallinity than the metal oxide film 208_2. Note that the crystallinity of the metal oxide films 108_1, 108_2, 208_1, and 208_2 can be determined by analysis by X-ray diffraction (XRD) or with a transmission electron microscope (TEM), for example.

In the case where the metal oxide films 108_1 and 208_1 each have a region with low crystallinity, the following effects can be achieved.

First, oxygen vacancies that might be formed in the metal oxide film 108 will be described.

Oxygen vacancies formed in the metal oxide film 108 adversely affect the transistor characteristics and therefore cause a problem. For example, oxygen vacancies formed in the metal oxide film 108 are bonded to hydrogen to serve as a carrier supply source. The carrier supply source generated in the metal oxide film 108 causes a change in the electrical characteristics, typically, shift in the threshold voltage, of the transistor 100A including the metal oxide film 108. Therefore, it is preferable that the amount of oxygen vacancies in the metal oxide film 108 be as small as possible.

In view of this, one embodiment of the present invention is a structure in which insulating films in the vicinity of the metal oxide film 108, specifically the insulating films 114 and 116 formed over the metal oxide film 108, include excess oxygen. Oxygen or excess oxygen is transferred from the insulating films 114 and 116 to the metal oxide film 108, whereby the oxygen vacancies in the metal oxide film can be reduced.

Figure 16A:
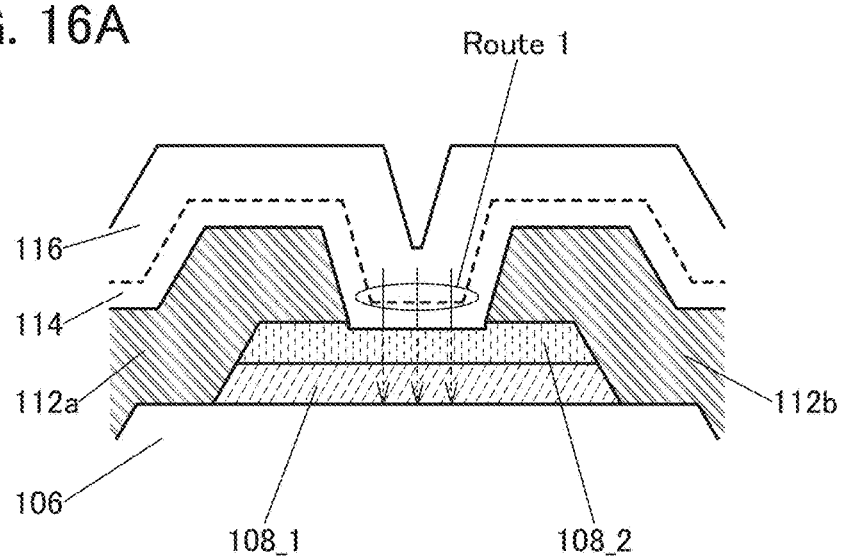
FIGS. 16A and 16B are conceptual diagrams illustrating diffusion paths of oxygen or excess oxygen diffused into a metal oxide film.
Figure 16B:
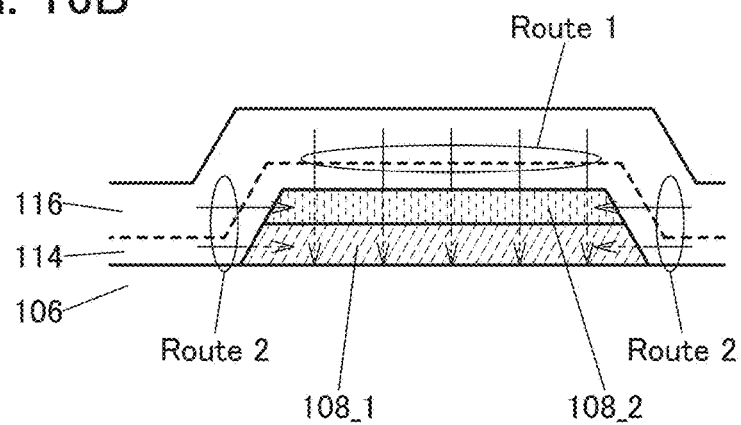

Here, paths of oxygen or excess oxygen diffused into the metal oxide film 108 will be described with reference to FIGS. 16A and 16B. FIGS. 16A and 16B are conceptual diagrams illustrating the paths of oxygen or excess oxygen diffused into the metal oxide film 108. FIG. 16A is the conceptual diagram in the channel length direction and FIG. 16B is the conceptual diagram in the channel width direction. Although the metal oxide film 108 is used for the description here, oxygen is diffused also into the metal oxide film 208 in a similar manner to the case of the metal oxide film 108.

Oxygen or excess oxygen in the insulating films 114 and 116 is diffused to the metal oxide film 108_1 from above, i.e., through the metal oxide film 108_2 (Route 1 in FIGS. 16A and 16B).

Oxygen or excess oxygen in the insulating films 114 and 116 is also diffused into the metal oxide film 108 through side surfaces of the metal oxide films 108_1 and 108_2 (Route 2 in FIG. 16B).

The diffusion of oxygen or excess oxygen through Route 1 illustrated in FIGS. 16A and 16B is sometimes prevented when the metal oxide film 108_2 has high crystallinity, for example. In the case of Route 2 illustrated in FIG. 16B, in contrast, oxygen or excess oxygen can be diffused to the metal oxide films 108_1 and 108_2 through the side surfaces of the metal oxide films 108_1 and 108_2.

Furthermore, in the case where the metal oxide film 108_1 has a region having lower crystallinity than the metal oxide film 108_2, the region serves as a diffusion path of excess oxygen; thus, excess oxygen can be diffused to the metal oxide film 108_2 having crystallinity higher than the metal oxide film 108_1 through Route 2 illustrated in FIG. 16B. Although not illustrated in FIGS. 16A and 16B, when the insulating film 106 contains oxygen or excess oxygen, the oxygen or excess oxygen might be diffused from the insulating film 106 into the metal oxide film 108.

When a stacked-layer structure including the metal oxide films having different crystallinity is employed and the region with low crystallinity is used as a diffusion path of excess oxygen as described above, the transistor can be highly reliable.

Note that in the case where the metal oxide film 108 consists only of a metal oxide film with low crystallinity, the reliability might be lowered because of attachment or entry of impurities (e.g., hydrogen or moisture) to the back channel side of the metal oxide film, i.e., a region corresponding to the metal oxide film 108_2.

Impurities such as hydrogen or moisture entering the metal oxide film 108 adversely affect the transistor characteristics and therefore cause a problem. Therefore, it is preferable that the amount of impurities such as hydrogen or moisture in the metal oxide film 108 be as small as possible.

Accordingly, the crystallinity of the upper layer of the metal oxide film 108 is increased so that impurities can be prevented from entering the metal oxide film 108. In particular, damage at the time of processing into the conductive films 112a and 112b can be prevented when the metal oxide film 108_2 has increased crystallinity. A surface of the metal oxide film 108, i.e., a surface of the metal oxide film 108_2 is exposed to an etchant or an etching gas at the time of processing into the conductive films 112a and 112b. However, when the metal oxide film 108_2 has a region with high crystallinity, the metal oxide film 108_2 has higher etching resistance than the metal oxide film 108_1. Thus, the metal oxide film 1082 functions as an etching stopper.

Note that it is preferable to use, as the metal oxide film 108, a metal oxide film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic." Typical examples of impurities contained in the metal oxide film include water and hydrogen. In this specification and the like, reducing or removing water and hydrogen from a metal oxide film is referred to as dehydration or dehydrogenation in some cases. Moreover, adding oxygen to a metal oxide film or an oxide insulating film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic metal oxide film has few carrier generation sources, and thus can have a low carrier density. Thus, a transistor in which a channel region is formed in the metal oxide film rarely has a negative threshold voltage (is rarely normally on). A highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width W of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

When the metal oxide film 108_1 includes a region having lower crystallinity than the metal oxide film 108_2, in some cases, the metal oxide film 108_1 has a high carrier density.

When the metal oxide film 108_1 has a high carrier density, the Fermi level is sometimes high relative to the conduction band of the metal oxide film 108_1. This lowers the conduction band minimum of the metal oxide film 108_1, so that the energy difference between the conduction band minimum of the metal oxide film 108_1 and the trap state, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the metal oxide film 108_1 has a high carrier density, the metal oxide film 108 can have high field-effect mobility.

[Insulating Film 1 Functioning as Protective Insulating Film]

The insulating films 114 and 116 function as protective insulating films of the transistors 100A and 200A. In addition, the insulating films 114 and 116 each have a function of supplying oxygen to the metal oxide films 108 and 208. That is, the insulating films 114 and 116 contain oxygen. The insulating film 114 is an insulating film that is permeable to oxygen. The insulating film 114 also functions as a film that relieves damage to the metal oxide films 108 and 208 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used for the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by ESR measurement. If the density of defects in the insulating film 114 is high, oxygen is bonded to the defects and the oxygen permeability of the insulating film 114 is decreased.

Note that not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that allows oxygen to pass through is formed as the insulating film 114, oxygen released from the insulating film 116 provided over the insulating film 114 can be moved to the metal oxide films 108 and 208 through the insulating film 114.

Note that the insulating film 114 can be formed using an oxide insulating film having a low density of states due to nitrogen oxide. Note that the density of states due to nitrogen oxide can be formed between the valence band maximum (Ev_os) and the conduction band minimum (Ec_os) of the metal oxide films. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS); the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The level is positioned in the energy gap of each of the metal oxide films 108 and 208. Therefore, when nitrogen oxide is diffused to the interfaces between the insulating film 114 and each of the metal oxide films 108 and 208, an electron is in some cases trapped by the level on the insulating film 114 side. As a result, the trapped electron remains in the vicinity of the interfaces between the insulating film 114 and each of the metal oxide films 108 and 208; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interfaces between the insulating film 114 and each of the metal oxide films 108 and 208.

By using such an oxide insulating film, the insulating film 114 can reduce the shift in the threshold voltage of the transistor, which leads to a smaller change in the electrical characteristics of the transistor.

The nitrogen concentration of the above oxide insulating film measured by secondary ion mass spectrometry (SIMS) is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating film 116.

It is preferable that the number of defects in the insulating film 116 be small, and typically the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from metal oxide films 108 and 208 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited thereto. For example, a single-layer structure of the insulating film 114 or a stacked-layer structure of three or more layers may be used.

[Insulating Film 2 Functioning as Protective Insulating Film]

The insulating film 118 functions as protective insulating films of the transistors 100A and 200A.

The insulating film 118 contains either hydrogen or nitrogen, or both. Alternatively, the insulating film 118 contains nitrogen and silicon. The insulating film 118 has a function of blocking oxygen, hydrogen, water, alkali metal, alkaline earth metal, and the like. It is possible to prevent outward diffusion of oxygen from the metal oxide films 108 and 208, outward diffusion of oxygen included in the insulating films 114 and 116, and entry of hydrogen, water, or the like into the metal oxide films 108 and 208 from the outside by providing the insulating film 118.

As the insulating film 118, a nitride insulating film can be used, for example. Examples of the nitride insulating film include a silicon nitride film, a silicon nitride oxide film, an aluminum nitride film, and an aluminum nitride oxide film.

Although the above-described variety of films such as the conductive films, the insulating films, the metal oxide film, and the metal film can be formed by a sputtering method or a PECVD method, they may be formed by another method, e.g., a thermal chemical vapor deposition (CVD) method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

<1-3. Structure Example 2 of Display Device>

Next, a display device whose protective insulating film has a different stacked-layer structure will be described with reference to FIGS. 4A-1, 4A-2, 4B-1, and 4B-2.

FIG. 4A-1 corresponds to a cross-sectional view taken along dashed-dotted line X1-X2 in FIG. 2A, FIG. 4A-2 corresponds to a cross-sectional view taken along dashed-dotted line Y1-Y2 in FIG. 2A, FIG. 4B-1 corresponds to a cross-sectional view taken along dashed-dotted line X3-X4 in FIG. 2B, and FIG. 4B-2 corresponds to a cross-sectional view taken along dashed-dotted line Y3-Y4 in FIG. 2B.

The display device illustrated in FIGS. 4A-1, 4A-2, 4B-1, and 4B-2 includes the insulating films 114 and 116 over the transistor 200A provided in a pixel portion, and an insulating film 119 functioning as a planarization film over the insulating film 116. The insulating films 114, 116, and 119 have an opening 242b. The conductive film 220a functioning as a pixel electrode is formed over the insulating film 119. The conductive film 220a is electrically connected to the conductive film 212b in the opening 242b. The insulating film 118 is provided over the insulating film 119 and the conductive film 220a. The insulating film 118 has an opening in which part of the conductive film 220a is exposed.

The insulating film 119 is formed using an organic material that can be used for a planarization insulating film. The insulating film 119 can be formed using an organic material such as a polyimide resin or an acrylic resin by a wet process such as a spin coating method or a printing method. Other than the above organic materials, a low-dielectric constant material (low-k material) or the like can be used. Note that the planarization insulating film may be formed by stacking a plurality of insulating films formed using any of these materials. For the insulating film 119, a light-transmitting organic resin typified by polyimide is preferably used. In the case where the display device is a transmissive liquid crystal display device, the use of the light-transmitting organic resin for the insulating film 119 can increase a property of transmitting light from a backlight.

In the display device illustrated in FIGS. 4A-1, 4A-2, 4B-1, and 4B-2, the insulating film 119 functioning as the planarization film is not formed in a driver circuit. Thus, when an oxide conductor film is used for the conductive film 120a, oxygen can be added to the insulating films 114 and 116. The oxygen added to the insulating films 114 and 116 can move to the metal oxide film 108 to fill oxygen vacancies in the metal oxide film 108, leading to an increase in the reliability of the transistor 100A.

Meanwhile, the insulating film 119 functioning as the planarization film is formed over the insulating film 116 in the pixel portion of the display device illustrated in FIGS. 4A-1, 4A-2, 4B-1, and 4B-2. Furthermore, the conductive film 220a functioning as the pixel electrode is formed over the insulating film 119. In the case where the display device is a liquid crystal display device, alignment defects in a liquid crystal layer can be reduced because the conductive film 220a has high planarity. Moreover, the insulating film 119 can widen the distance between the conductive film 204 functioning as a gate wiring and the conductive film 220a and the distance between the conductive film 212a functioning as a signal line and the conductive film 220a, which enables a reduction in wiring delay.

<1-4. Structure Example 3 of Display Device>

Next, a display device in which the conductive film functioning as a pixel electrode has a different shape will be described with reference to FIGS. 8A-1, 8A-2, 8B-1, and 8B-2 and FIGS. 9A and 9B.

Figure 9A:
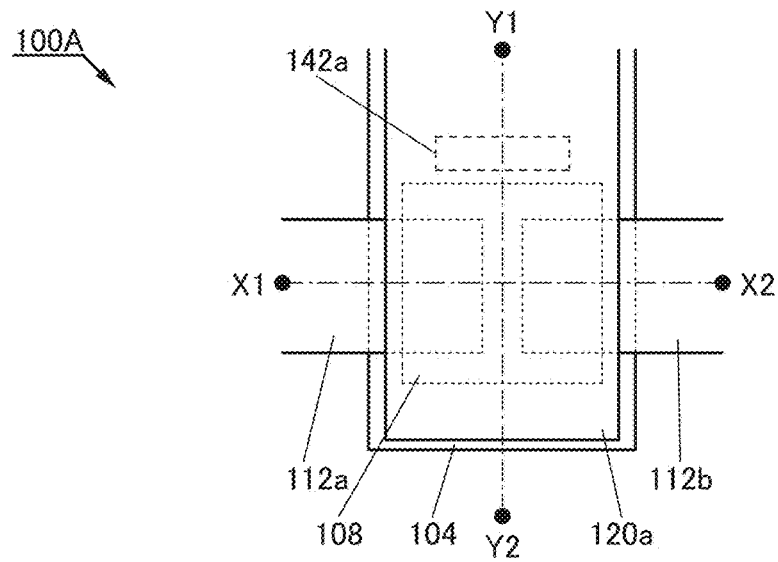
FIGS. 9A and 9B are top views illustrating a display device.
Figure 9B:
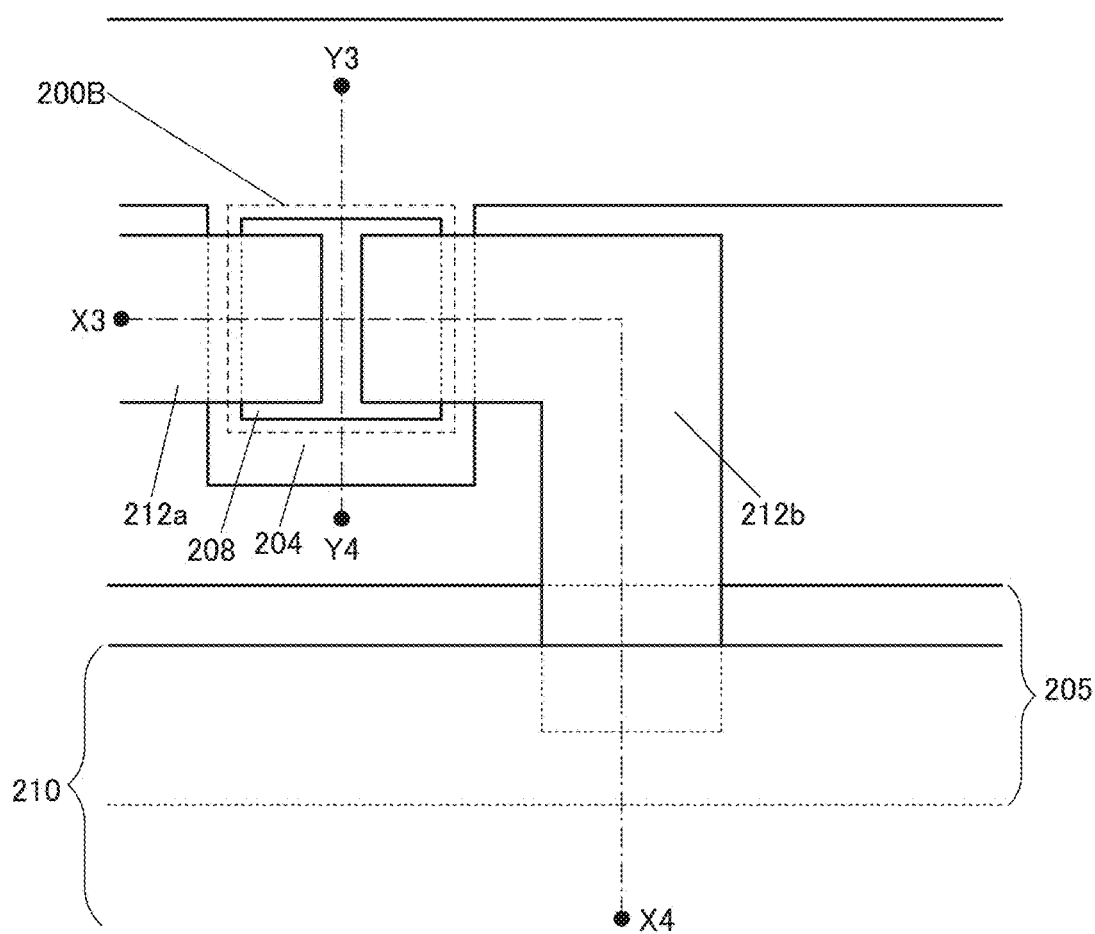

FIGS. 9A and 9B are top views of transistors included in a driver circuit and a display portion provided in a display device of one embodiment of the present invention. FIG. 9A is a top view of a transistor 100A included in the driver circuit, and FIG. 9B is a top view of a transistor 200B included in a pixel portion. FIG. 8A-1 corresponds to a cross-sectional view taken along dashed-dotted line X1-X2 in FIG. 9A, FIG. 8A-2 corresponds to a cross-sectional view taken along dashed-dotted line Y1-Y2 in FIG. 9A, FIG. 8B-1 corresponds to a cross-sectional view taken along dashed-dotted line X3-X4 in FIG. 9B, and FIG. 8B-2 corresponds to a cross-sectional view taken along dashed-dotted line Y3-Y4 in FIG. 9B.

As illustrated in FIGS. 8A-1 and 8A-2, the driver circuit includes the transistor 100A.

As illustrated in FIGS. 8B-1 and 8B-2, the pixel portion includes the transistor 200B, a conductive film 210 functioning as a pixel electrode, and a capacitor 250.

The transistor 200B is different from the transistor 200A illustrated in FIGS. 1A-1, 1A-2, 1B-1, and 1B-2 and the transistor 200A illustrated in FIGS. 4A-1, 4A-2, 4B-1, and 4B-2 in the connection to the conductive film functioning as the pixel electrode. The transistor 200B is connected to the conductive film 210 functioning as the pixel electrode between the insulating film 106 and the conductive film 212b.

The conductive film 210 is formed at the same time as the metal oxide film 108 of the transistor 100A and the metal oxide film 208 of the transistor 200B. In the conductive film 210, an island-shaped conductive film 210_1 and an island-shaped conductive film 210_2 are stacked in this order. The conductive film 210_1 is formed at the same time as the metal oxide films 108_1 and 208_1 and the conductive film 2102 is formed at the same time as the metal oxide films 108_2 and 208_2.

In FIG. 8B-1, the insulating film 118 has an opening 211 in which the conductive film 210 is exposed. Alternatively, the insulating film 118 may cover the conductive film 210 as illustrated in FIG. 10B-1. In the case where the display device is a liquid crystal display device, for example, it is preferable not to provide the insulating film 118 over the conductive film 210 functioning as the pixel electrode. However, the insulating film 118 can be provided over the conductive film 210 depending on a voltage applied to a liquid crystal layer.

An oxide conductor (OC) film is preferably used for the conductive film 210. Thus, the conductive film 210 has higher hydrogen concentration than the metal oxide films 108 and 208 included in the transistors 100A and 200B.

<1-5. Modification Example of Transistor>

Figure 14A:
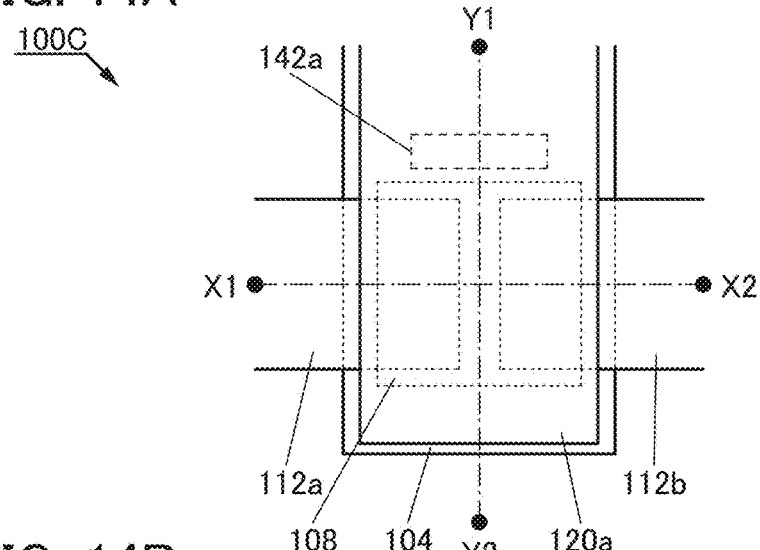
FIGS. 14A to 14C are a top view and cross-sectional views illustrating a transistor.
Figure 14B:
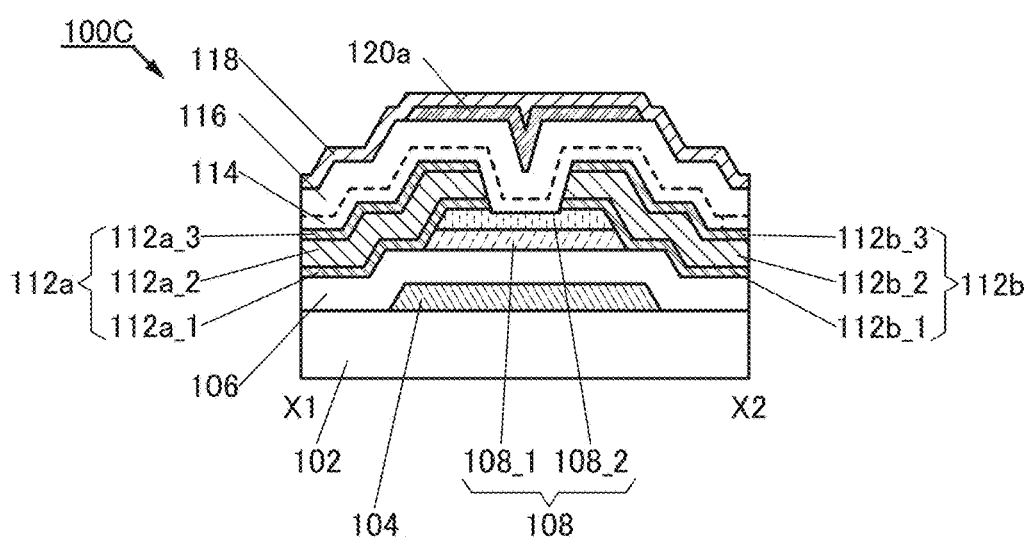
Figure 14C:
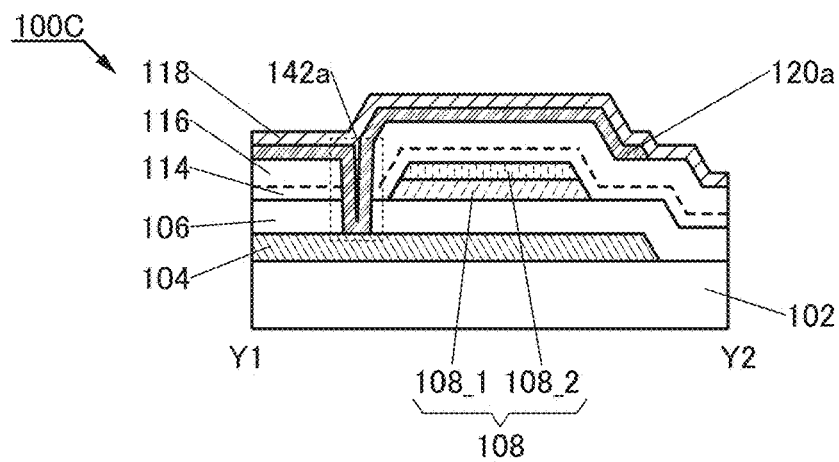

Next, modification examples of a transistor applicable to the transistor described in this embodiment are described. FIG. 14A is a top view of a transistor 100C, FIG. 14B corresponds to a cross-sectional view taken along dashed-dotted line X1-X2 in FIG. 14A, and FIG. 14C corresponds to a cross-sectional view taken along dashed-dotted line Y1-Y2 in FIG. 14A. Note that although the transistor 100C is described as a modification example of the transistor 100A here, the structure of the transistor 100C can be applied to the transistors 200A and 200B as appropriate.

The transistor 100C is different from the above-described transistor 100A in that the conductive films 112a and 112b each have a three-layer structure.

The conductive film 112a of the transistor 100C includes a conductive film 112a_1, a conductive film 112a_2 over the conductive film 112a_1, and a conductive film 112a_3 over the conductive film 112a_2. The conductive film 112b of the transistor 100C includes a conductive film 112b_1, a conductive film 112b_2 over the conductive film 112b_1, and a conductive film 112b_3 over the conductive film 112b_2.

For example, it is preferable that the conductive film 112a_1, the conductive film 112b_1, the conductive film 112a_3, and the conductive film 112b_3 contain one or more elements selected from titanium, tungsten, tantalum, molybdenum, indium, gallium, tin, and zinc. Furthermore, it is suitable that the conductive film 112a_2 and the conductive film 112b_2 contain one or more elements selected from copper, aluminum, and silver.

Specifically, the conductive film 112a_1, the conductive film 112b_1, the conductive film 112a_3, and the conductive film 112b_3 can be formed using an In—Sn oxide or an In—Zn oxide and the conductive film 112a_2 and the conductive film 112b_2 can be formed using copper.

The above structure is suitable because the wiring resistance of the conductive films 112a and 112b can be reduced and diffusion of copper to the metal oxide film 108 can be inhibited. The above structure is suitable also because the contact resistance between the conductive film 112b and the conductive film in contact with the conductive film 112b can be reduced. It is suitable that the above structure is applied to the transistor 200A or the like in the pixel portion because the contact resistance between the conductive film 212b and the conductive film 220a can be reduced. The other components of the transistor 100C are similar to those of the transistor 100A described above and have similar effects.

Figure 15A:
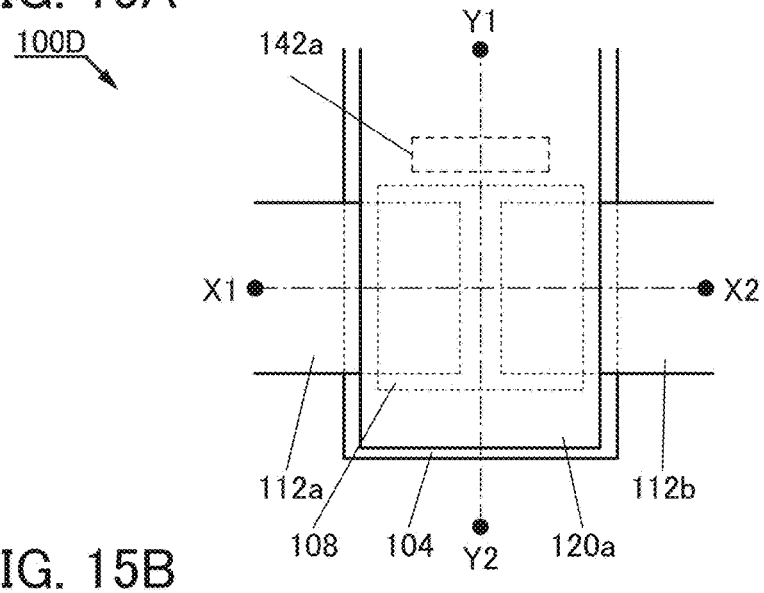
FIGS. 15A to 15C are a top view and cross-sectional views illustrating a transistor.
Figure 15B:
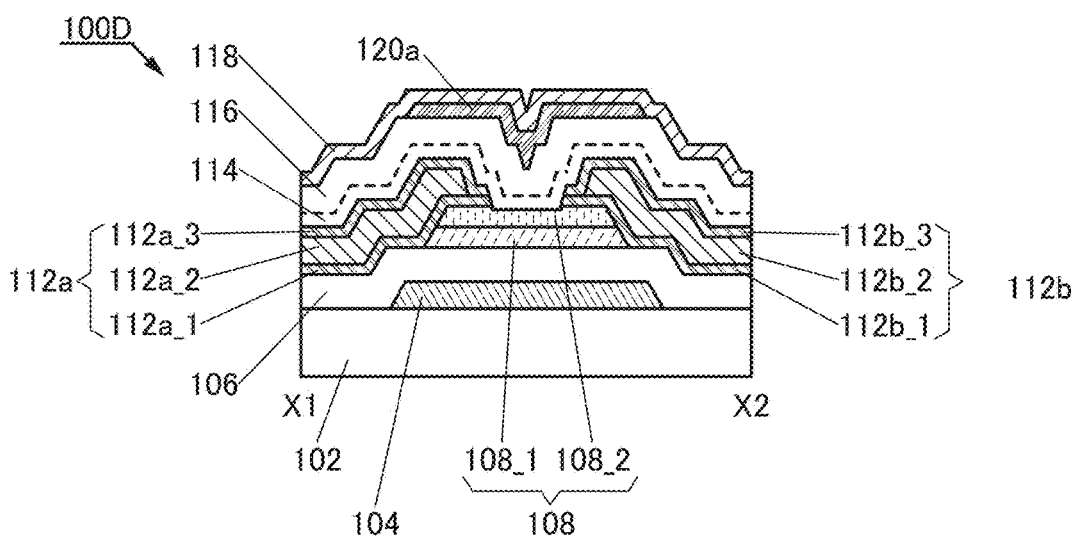
Figure 15C:
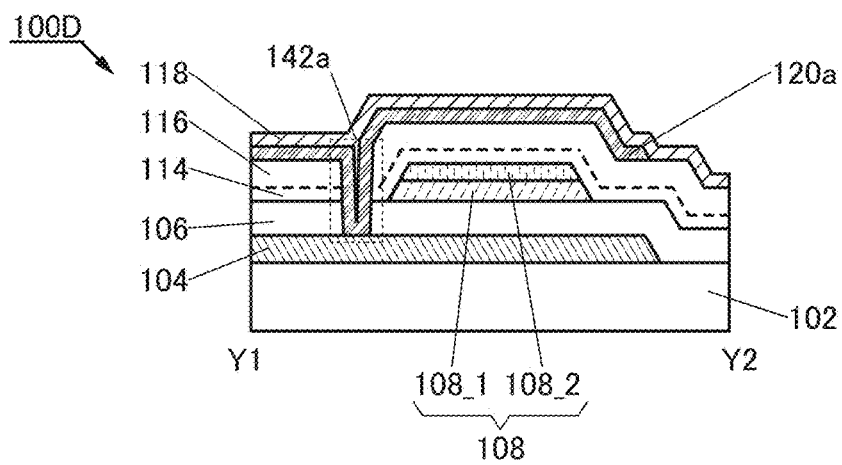

FIG. 15A is a top view of a transistor 100D applicable to the transistor described in this embodiment. FIG. 15B corresponds to a cross-sectional view taken along dashed-dotted line X1-X2 in FIG. 15A and FIG. 15C corresponds to a cross-sectional view taken along dashed-dotted line Y1-Y2 in FIG. 15A.

The transistor 100D is different from the above-described transistor 100A in that the conductive films 112a and 112b each have a three-layer structure. In addition, the transistor 100D is different from the above-described transistor 100C in the shapes of the conductive films 112a and 112b.

The conductive film 112a of the transistor 100D includes the conductive film 112a_1, the conductive film 112a_2 over the conductive film 112a_1, and the conductive film 112a_3 over the conductive film 112a_2. The conductive film 112b of the transistor 100D includes the conductive film 112b_1, the conductive film 112b_2 over the conductive film 112b_1, and the conductive film 112b_3 over the conductive film 112b_2. Note that the conductive film 112a_1, the conductive film 112a_2, the conductive film 112a_3, the conductive film 112b_1, the conductive film 112b_2, and the conductive film 112b_3 can be formed using any of the above-described materials.

An end portion of the conductive film 112a_1 has a region located outward from an end portion of the conductive film 112a_2. The conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2. The conductive film 112b_3 covers a top surface and a side surface of the conductive film 112b_2 and has a region that is in contact with the conductive film 112b_1.

The above structure is suitable because the wiring resistance of the conductive films 112a and 112b can be reduced and diffusion of copper to the metal oxide film 108 can be inhibited. Note that diffusion of copper can be more effectively inhibited in the transistor 100D than in the above-described transistor 100C. The above structure is suitable also because the contact resistance between the conductive film 112b and the conductive film in contact with the conductive film 112b can be low. The other components of the transistor 100D are similar to those of the above-described transistor and have similar effects.

Note that each of the transistors 100A, 100C, 200A, and 200B are fabricated using six photomasks. In contrast, the transistor 100D is fabricated using seven photomasks because two photomasks are required to form the conductive films 112a and 112b.

Figure 17A:
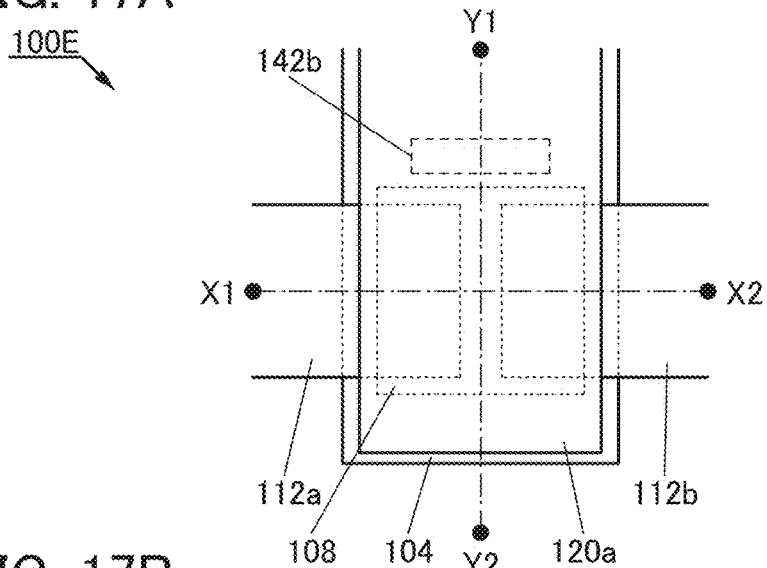
FIGS. 17A to 17C are a top view and cross-sectional views illustrating a transistor.
Figure 17B:
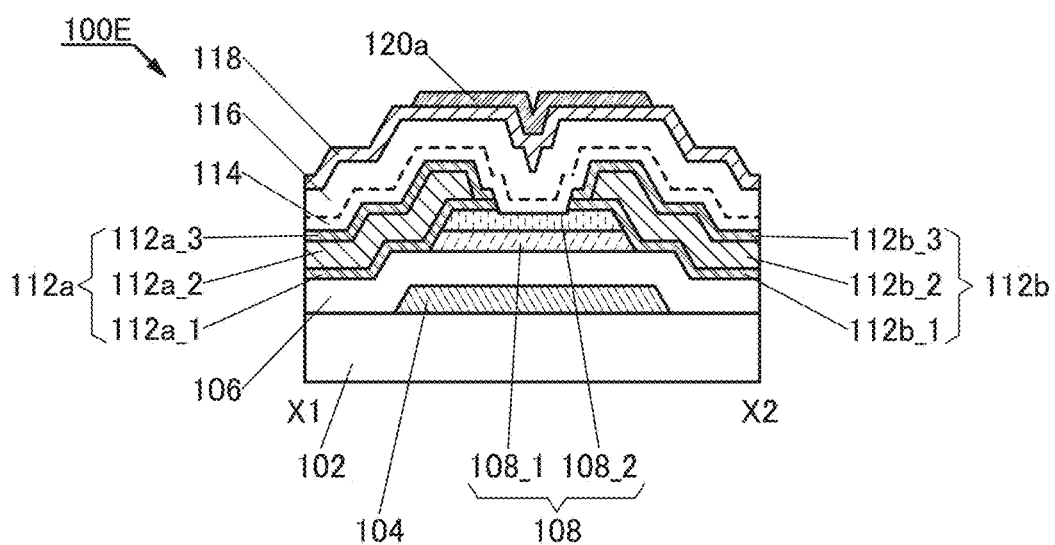
Figure 17C:
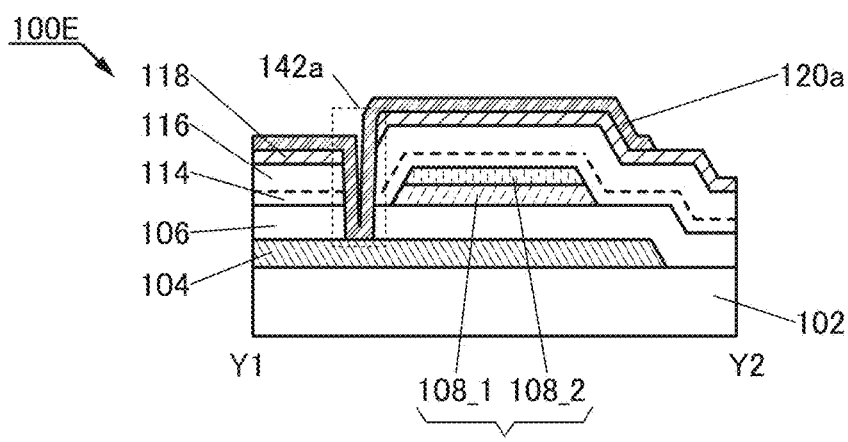

FIG. 17A is a top view of a transistor 100E that is applicable to the transistors described in this embodiment, FIG. 17B corresponds to a cross-sectional view taken along dashed-dotted line X1-X2 in FIG. 17A, and FIG. 17C corresponds to a cross-sectional view taken along dashed-dotted line Y1-Y2 in FIG. 17A.

The transistor 100E illustrated in FIGS. 17A to 17C is different from the above-described transistor 100D in the stacking order of the insulating film 118 and the conductive film 120a. In the transistor 100E, the insulating film 118 is over the insulating film 116, and the conductive film 120a is over the insulating film 118. The conductive film 104 and the conductive film 120a are electrically connected to each other in the opening 142a of the insulating films 106, 114, 116, and 118.

The structures of the above transistors can be freely combined with each other for the transistor of this embodiment.

<1-6. Manufacturing Method 1 of Display Device>

Next, a method for manufacturing the transistors 100A and 200A included in the display device of one embodiment of the present invention will be described with reference to FIGS. 5A-1 to 5A-3 and 5B-1 to 5B-3, FIGS. 6A-1, 6A-2, 6B-1, and 6B-2, and FIGS. 7A-1, 7A-2, 7B-1, and 7B-2.

FIGS. 5A-1 to 5A-3 and 5B-1 to 5B-3, FIGS. 6A-1, 6A-2, 6B-1, and 6B-2, and FIGS. 7A-1, 7A-2, 7B-1, and 7B-2 are cross-sectional views illustrating a method for manufacturing the display device. FIGS. 5A-1 to 5A-3, FIGS. 6A-1 and 6A-2, and FIGS. 7A-1 and 7A-2 are cross-sectional views of the transistor 100A in the channel length direction, and FIGS. 5B-1 to 5B-3, FIGS. 6B-1 and 6B-2, and FIGS. 7B-1 and 7B-2 are cross-sectional views of the transistor 200A in the channel length direction.

First, a conductive film is formed over the substrate 102 and processed through a lithography process and an etching process to form the conductive film 104 functioning as the first gate electrode of the transistor 100A and the conductive film 204 functioning as the gate electrode of the transistor 200A. Then, the insulating film 106 functioning as the first gate insulating films is formed over the conductive film 104 (see FIGS. 5A-1 and 5B-1).

In this embodiment, a glass substrate is used as the substrate 102, and a 50-nm-thick titanium film and a 200-nm-thick copper film are formed as the conductive films 104 and 204 by a sputtering method. A 400-nm-thick silicon nitride film and a 50-nm-thick silicon oxynitride film as the insulating film 106 are formed by a PECVD method.

Note that the above-described silicon nitride film has a three-layer structure of a first silicon nitride film, a second silicon nitride film, and a third silicon nitride film. The three-layer structure can be formed as follows, for example.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as source gases to a reaction chamber of a PECVD apparatus, the pressure in the reaction chamber is adjusted to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as source gases to the reaction chamber of the PECVD apparatus, the pressure in the reaction chamber is adjusted to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as source gases to the reaction chamber of the PECVD apparatus, the pressure in the reaction chamber is adjusted to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the silicon nitride film has the above-described three-layer structure, for example, in the case where a conductive film containing copper is used for the conductive film 104, the following effects can be obtained.

The first silicon nitride film can inhibit diffusion of copper from the conductive films 104 and 204. The second silicon nitride film has a function of releasing hydrogen and can improve withstand voltage of the insulating film functioning as the gate insulating film. The third silicon nitride film releases a small amount of hydrogen and can inhibit diffusion of hydrogen released from the second silicon nitride film.

Next, a metal oxide film 108_1_0 and a metal oxide film 108_2_0 are formed over the insulating film 106 (see FIGS. 5A-2 and 5B-2).

FIGS. 5A-1 and 5B-1 are schematic cross-sectional views illustrating the inside of a deposition apparatus when the metal oxide films 108_1_0 and 108_2_0 are formed over the insulating film 106. In FIGS. 5A-1 and 5B-1, a sputtering apparatus is used as the deposition apparatus, and a target 191 placed inside the sputtering apparatus and plasma 192 generated under the target 191 are schematically illustrated.

In FIGS. 5A-1 and 5B-1, oxygen or excess oxygen added to the insulating film 106 is schematically shown by arrows of broken lines. When an oxygen gas is used in forming the metal oxide film 108_1_0, for example, oxygen can be favorably added to the insulating film 106.

The metal oxide film 108_1_0 is formed over the insulating film 106 to a thickness greater than or equal to 1 nm and less than or equal to 25 nm, preferably greater than or equal to 5 nm and less than or equal to 20 nm. The metal oxide film 108_1_0 is formed using one or both of an inert gas (typified by an Ar gas) and an oxygen gas. Note that the proportion of the oxygen gas in the whole deposition gas (hereinafter also referred to as an oxygen flow rate percentage) in forming the metal oxide film 108_1_0 is higher than or equal to 0% and lower than 30%, preferably higher than or equal to 5% and lower than or equal to 15%.

When the oxygen flow rate percentage for forming the metal oxide film 108_1_0 is set in the above range, the metal oxide film 108_1_0 can have lower crystallinity than the metal oxide film 108_2_0.

Next, the metal oxide film 10820 is formed over the metal oxide film 108_1_0. When the metal oxide film 108_2_0 is formed, plasma discharge is performed in an atmosphere containing an oxygen gas. At this time, oxygen is added to the metal oxide film 108_1_0 over which the metal oxide film 108_2_0 is to be formed. The oxygen flow rate percentage in forming the metal oxide film 108_2_0 is higher than or equal to 30% and lower than or equal to 100%, preferably higher than or equal to 50% and lower than or equal to 100%, and further preferably higher than or equal to 70% and lower than or equal to 100%.

The thickness of the metal oxide film 108_2_0 is greater than or equal to 20 nm and less than or equal to 100 nm, preferably greater than or equal to 20 nm and less than or equal to 50 nm.

As described above, the oxygen flow rate percentage for forming the metal oxide film 108_2_0 is preferably higher than the oxygen flow rate percentage for forming the metal oxide film 108_1_0. In other words, the metal oxide film 108_1_0 is preferably formed under a lower oxygen partial pressure than the metal oxide film 108_2_0.

The substrate temperature at the time of formation of the metal oxide films 108_1_0 and 108_2_0 is set at higher than or equal to room temperature (25° C.) and lower than or equal to 200° C., preferably higher than or equal to room temperature and lower than or equal to 130° C. Setting the substrate temperature in the above range is favorable for large glass substrates (e.g., the above-described 8th- to 10th-generation glass substrates). Specifically, when the substrate temperature for forming the metal oxide films 108_1_0 and 108_2_0 is set at room temperature, bending or distortion of the substrate can be inhibited. To increase the crystallinity of the metal oxide film 108_2_0, the substrate temperature in forming the metal oxide film 108_2_0 is preferably increased.

Note that it is more favorable to successively form the metal oxide film 108_1_0 and the metal oxide film 108_2_0 in a vacuum because impurities can be prevented from being caught at the interfaces.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the metal oxide film can be minimized.

In the case where the metal oxide film is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide film, as much as possible. In particular, the partial pressure of gas molecules corresponding to $H_2O$ (gas molecules with m/z=18) in the chamber in the standby mode of the sputtering apparatus is preferably lower than or equal to $1 \times 10^{-4}$ Pa, further preferably lower than or equal to $5 \times 10^{-5}$ Pa.

In this embodiment, the metal oxide film 108_1_0 is formed by a sputtering method using an In—Ga—Zn metal oxide target (In:Ga:Zn=4:2:4.1 in an atomic ratio). The substrate temperature during the formation of the metal oxide film 108_1_0 is room temperature, and an argon gas at a flow rate of 180 sccm and an oxygen gas at a flow rate of 20 sccm are used as deposition gases (oxygen flow rate percentage: 10%).

In addition, the metal oxide film 108_2_0 is formed by a sputtering method using an In—Ga—Zn metal oxide target (In:Ga:Zn=4:2:4.1 in an atomic ratio). The substrate temperature during the formation of the metal oxide film 108_2_0 is room temperature, and an oxygen gas at a flow rate of 200 sccm is used as a deposition gas (oxygen flow rate percentage: 100%).

When the oxygen flow rate percentage in forming the metal oxide film 108_1_0 is different from that in forming the metal oxide film 108_2_0, a layered film having a plurality of kinds of crystallinity can be formed.

Note that the formation method is not limited to the above-described sputtering method, and a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

Next, the metal oxide films 108_1_0 and 108_2_0 are processed into desired shapes to form the island-shaped metal oxide films 108_1, 108_2, 208_1, and 208_2. In this embodiment, the metal oxide films 108_1 and 108_2 constitute the island-shaped metal oxide film 108 (see FIG. 5A-3), and the metal oxide films 208_1 and 208_2 constitute the island-shaped metal oxide film 208 (see FIG. 5B-3).

After the metal oxide films 108 and 208 are formed, oxygen plasma treatment may be performed on the metal oxide films 108 and 208. As a result, oxygen can be added to surfaces of the metal oxide films 108 and 208, which leads to a reduction in oxygen vacancies in the metal oxide films 108 and 208. It is particularly preferable to reduce oxygen vacancies at side surfaces of the metal oxide films 108 and 208 because leakage current in the transistors can be prevented.

It is suitable that heat treatment (hereinafter referred to as first heat treatment) is performed after the metal oxide films 108 and 208 are formed. By the first heat treatment, hydrogen, water, or the like contained in the metal oxide films 108 and 208 can be reduced. The heat treatment for the purpose of reducing hydrogen, water, or the like may be performed before the metal oxide films 108_1_0 and 108_2_0 are processed into island shapes. Note that the first heat treatment is one kind of treatment for increasing the purity of the metal oxide film.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed in an atmosphere of nitrogen, oxygen, ultra-dry air (air with a water content of 20 ppm or less, preferably 1 ppm or less, further preferably 10 ppb or less), or a rare gas (e.g., argon, helium). It is preferable that hydrogen, water, and the like not be contained in the nitrogen, oxygen, ultra-dry air, or rare gas. Furthermore, after heat treatment is performed in a nitrogen atmosphere or a rare gas atmosphere, heat treatment may be additionally performed in an oxygen atmosphere or an ultra-dry air atmosphere. As a result, hydrogen, water, or the like contained in the metal oxide films can be released and oxygen can be supplied to the metal oxide film at the same time. Consequently, the number of oxygen vacancies in the metal oxide film can be reduced.

Next, a conductive film is formed over the insulating film 106 and the metal oxide films 108 and 208. Then, the conductive film is processed into desired shapes to form the conductive films 112a and 112b, the conductive films 212a and 212b, and the conductive film 213.

In this embodiment, for the conductive films 112a, 112b, 212a, 212b, and 213, a 30-nm-thick titanium film, a 200-nm-thick copper film, and a 10-nm-thick titanium film are formed in this order by a sputtering method.

In this embodiment, the conductive film is processed with a wet etching apparatus. Note that the method for processing the conductive film is not limited to the above-described method, and a dry etching apparatus may be used, for example.

After the conductive films 112a, 112b, 212a, 212b, and 213 are formed, surfaces (on the back channel side) of the metal oxide films 108 and 208 (specifically, the metal oxide films 108_2 and 208_2) may be cleaned. The cleaning may be performed using, for example, a chemical solution such as a phosphoric acid. The cleaning using a chemical solution such as a phosphoric acid can remove impurities (e.g., an element contained in the conductive films 112a, 112b, 212a, and 212b) attached to the surfaces of the metal oxide films 108_2 and 208_2. Note that the cleaning is not necessarily performed; in some cases, the cleaning is not performed.

In the step of forming the conductive films 112a, 112b, 212a, 212b, and 213 and/or the cleaning step, the metal oxide films 108 and 208 are sometimes thinned in regions not covered with the conductive films 112a, 112b, 212a, and 212b.

Note that the regions not covered with the conductive films 112a, 112b, 212a, and 212b, that is, the metal oxide films 108_2 and 208_2, preferably have high crystallinity. Impurities (in particular, constituent elements of the conductive films 112a, 112b, 212a, and 212b) are less likely to be diffused into the metal oxide films with high crystallinity. Thus, highly reliable transistors can be fabricated.

Although FIGS. 5A-3 and 5B-3 illustrate an example in which depressed portions are formed on the surfaces of the metal oxide films 108 and 208 not covered with the conductive films 112a, 112b, 212a, and 212b, i.e., the surfaces of the metal oxide films 1082 and 2082, one embodiment of the present invention is not limited to this example and depressed portions are not necessarily formed on the surfaces of the metal oxide films 108 and 208 not covered with the conductive films 112a, 112b, 212a, and 212bs.

Next, the insulating films 114 and 116 are formed over the metal oxide films 108 and 208 and the conductive films 112a, 112b, 212a, 212b, and 213 (see FIGS. 6A-1 and 6B-1).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as source gases. Typical examples of the deposition gas containing silicon include silane, disilane, trisilane, and silane fluoride. Examples of the oxidizing gas include dinitrogen monoxide and nitrogen dioxide. The flow rate of the oxidizing gas is more than or equal to 20 times and less than or equal to 500 times, preferably more than or equal to 40 times and less than or equal to 100 times, that of the deposition gas.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as source gases, the pressure in the treatment chamber is 20 Pa, and a high-frequency power of 100 W at 13.56 MHz ($1.6 \times 10^{-2}$ W/cm$^2$ as the power density) is supplied to a parallel-plate electrode.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5

W/cm², preferably greater than or equal to 0.25 W/cm² and less than or equal to 0.35 W/cm² is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the metal oxide films 108 and 208 in the step of forming the insulating film 116. Therefore, the insulating film 116 can be formed using the high-frequency power having a high power density while damage to the metal oxide films 108 and 208 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6\times10^{17}$ spins/cm³, preferably lower than or equal to $3\times10^{17}$ spins/cm³, further preferably lower than or equal to $1.5\times10^{17}$ spins/cm³ by ESR measurement. As a result, the reliability of the transistors 100A and 200A can be improved.

It is suitable that heat treatment (hereinafter referred to as second heat treatment) is performed after the insulating films 114 and 116 are formed. The second heat treatment can reduce nitrogen oxide included in the insulating films 114 and 116. By the second heat treatment, part of oxygen contained in the insulating films 114 and 116 can be transferred to the metal oxide films 108 and 208, so that the amount of oxygen vacancies included in the metal oxide films 108 and 208 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, RTA, or the like can be used for the heat treatment.

Next, the openings 142a and 242a are formed in desired regions in the insulating films 114 and 116.

In this embodiment, the openings 142a and 242a are formed with a dry etching apparatus. Note that the opening 142a reaches the conductive film 104, and the opening 242a reaches the conductive film 212b.

Next, a conductive film 120 is formed over the insulating film 116 (see FIGS. 6A-2 and 6B-2).

FIGS. 6A-1 and 6B-1 are schematic cross-sectional views illustrating the inside of a deposition apparatus when the conductive film 120 is formed over the insulating film 116. In FIGS. 6A-1 and 6B-1, a sputtering apparatus is used as the deposition apparatus, and a target 193 placed inside the sputtering apparatus and plasma 194 formed under the target 193 are schematically illustrated.

When the conductive film 120 is formed, plasma discharge is performed in an atmosphere containing an oxygen gas. At this time, oxygen is added to the insulating film 116 over which the conductive film 120 is to be formed. When the conductive film 120 is formed, an inert gas (e.g., a helium gas, an argon gas, or a xenon gas) and the oxygen gas may be mixed.

The oxygen gas is mixed at least when the conductive film 120 is formed. The proportion of the oxygen gas in a deposition gas for forming the conductive film 120 is higher than 0% and lower than or equal to 100%, preferably higher than or equal to 10% and lower than or equal to 100%, further preferably higher than or equal to 30% and lower than or equal to 100%.

In FIGS. 6A-1 and 6B-1, oxygen or excess oxygen added to the insulating film 116 is schematically shown by arrows of broken lines.

In this embodiment, the conductive film 120 is formed by a sputtering method using an In—Ga—Zn metal oxide target (In:Ga:Zn=4:2:4.1 [atomic ratio]). Alternatively, the conductive film 120 may be formed by a sputtering method using an ITO target and an oxygen gas (100%) as a deposition gas.

Note that although oxygen is added to the insulating film 116 when the conductive film 120 is formed in this embodiment, the method for adding oxygen is not limited to this example. For example, oxygen may be further added to the insulating film 116 after the conductive film 120 is formed.

As the method for adding oxygen to the insulating film 116, an ITSO film with a thickness of 5 nm may be formed using a target of an oxide including indium, tin, and silicon (an In—Sn—Si oxide, also referred to as ITSO) ($In_2O_3$:$SnO_2$:$SiO_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm² and less than or equal to 5 W/cm². The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Then, the conductive film 120 is processed into desired shapes to form conductive films 120a_1 and 220a_1 (see FIGS. 7A-1 and 7B-1).

In this embodiment, the conductive film 120 is processed into the conductive films 120a_1 and 220a_1 with a wet etching apparatus.

Next, the insulating film 118 is formed over the insulating film 116 and the conductive films 120a_1 and 220a_1 (see FIGS. 7A-2 and 7B-2).

The insulating film 118 includes either or both of hydrogen and nitrogen. As the insulating film 118, a silicon nitride film is suitably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the metal oxide films 108 and 208.

In the case where a silicon nitride film is formed by a PECVD method as the insulating film 118, a deposition gas containing silicon, nitrogen, and ammonia are preferably used as source gases. A small amount of ammonia compared with the amount of nitrogen is used, whereby ammonia is dissociated in the plasma and activated species are generated. The activated species cut a bond between silicon and hydrogen which are included in a deposition gas including silicon and a triple bond between nitrogen molecules. As a result, formation of the bond between silicon and nitrogen is promoted, leading to the formation of a dense silicon nitride film having few bonds between silicon and hydrogen and few defects. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as source gases. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the conductive films 120a_1 and 220a_1 are formed using an In—Ga—Zn metal oxide target (In:Ga:Zn=4:2:4.1 [atomic ratio]), either or both of hydrogen and nitrogen contained in the insulating film 118 might enter the conductive films 120a_1 and 220a_1. In that case, either or both of hydrogen and nitrogen are bonded to oxygen vacancies in the conductive films 120a_1 and 220a_1 to cause a reduction in the resistance of the conductive films 120a_1 and 220a_1. Accordingly, the conductive films 120a and 220a with low resistance can be formed. Note that the conductive films with low resistance are oxide conductor films. Since either or both of hydrogen and nitrogen contained in the insulating film 118 move to the conductive films 120a and 220a, the conductive films 120a and 220a have higher hydrogen concentration and/or nitrogen concentration than the metal oxide films 108 and 208.

After the insulating film 118 is formed, heat treatment similar to the first heat treatment or the second heat treatment (hereinafter referred to as third heat treatment) may be performed.

By the third heat treatment, oxygen included in the insulating film 116 moves into the metal oxide films 108 and 208 to fill the oxygen vacancies in the metal oxide films 108 and 208.

Through the above process, the display device illustrated in FIGS. 1A-1, 1A-2, 1B-1, and 1B-2 can be manufactured.

<1-7. Manufacturing Method 2 of Display Device>

A method for manufacturing the display device illustrated in FIGS. 4A-1, 4A-2, 4B-1, and 4B-2 is described. To fabricate the display device illustrated in FIGS. 4A-1, 4A-2, 4B-1, and 4B-2, first, components up to the insulating film 116 are formed as in the case of the display device illustrated in FIGS. 1A-1, 1A-2, 1B-1, and 1B-2. Next, the insulating film 119 is formed in the pixel portion. The insulating film 119 can be formed in the following manner: a photosensitive resin is applied to the insulating film 116 and then exposure and development are performed; or a non-photosensitive resin is applied to the insulating film 116 and baked, a resist mask is formed, and the baked non-photosensitive resin is etched using the resist mask.

Then, the conductive films 120a_1 and 220a_1 are formed over the insulating films 116 and 119 in a manner similar to that in the case of the display device illustrated in FIGS. 1A-1, 1A-2, 1B-1, and 1B-2. Note that oxygen can be added to the insulating films 114 and 116 at the time of the formation of the conductive film 120a_1. Thus, oxygen vacancies in the metal oxide film 108 of the transistor 100A and the metal oxide film 208 of the transistor 200A can be reduced.

Next, the insulating film 118 is formed over the insulating films 116 and 119 and the conductive films 120a_1 and 220a_1. Note that either or both of hydrogen and nitrogen contained in the insulating film 118 enter the conductive films 120a_1 and 220a_1 in some cases. In that case, either or both of hydrogen and nitrogen are bonded to oxygen vacancies in the conductive films 120a_1 and 220a_1 to cause a reduction in the resistance of the conductive films 120a_1 and 220a_1. Accordingly, the conductive films 120a and 220a with low resistance can be formed. Since either or both of hydrogen and nitrogen contained in the insulating film 118 move to the conductive films 120a and 220a, the conductive films 120a and 220a have higher hydrogen concentration and/or nitrogen concentration than the metal oxide films 108 and 208.

After that, part of the insulating film 118 that overlaps with the conductive film 220a may be etched.

Through the above process, the display device illustrated in FIGS. 4A-1, 4A-2, 4B-1, and 4B-2 can be manufactured.

<1-8. Manufacturing Method 3 of Display Device>

A method for manufacturing the display device illustrated in FIGS. 8A-1, 8A-2, 8B-1, and 8B-2 is described. First, a conductive film is formed over the substrate 102 and processed through a lithography process and an etching process to form the conductive film 104 functioning as the first gate electrode of the transistor 100A, the conductive film 204 functioning as the gate electrode of the transistor 200A, and a capacitor wiring 205. Then, the insulating film 106 functioning as the first gate insulating films is formed over the conductive film 104. After that, the metal oxide film 108, the metal oxide film 208, and a metal oxide film 209 are formed over the insulating film 106 (see FIGS. 11A-1 and 11B-1). Note that metal oxide films 209_1 and 209_2 constitute the island-shaped metal oxide film 209.

After the metal oxide films 108, 208, and 209 are formed, first heat treatment may be performed.

Next, the conductive films 112a and 112b are formed over the metal oxide film 108, the conductive film 212a is formed over the metal oxide film 208, and the conductive film 212b is formed over the metal oxide films 208 and 209 (see FIGS. 11A-2 and 11B-2).

Then, the insulating films 114 and 116 are formed over the metal oxide films 108, 208, and 209 and the conductive films 112a, 112b, 212a, and 212b (see FIGS. 12A-1 and 12B-1). The insulating films 114 and 116 have an opening 117 in which the metal oxide film 209 is exposed.

After that, the conductive film 120a is formed over the insulating film 116. Subsequently, the insulating film 118 is formed over the insulating films 114 and 116, the conductive films 120a and 212b, and the metal oxide film 209 (see FIGS. 12A-2 and 12B-2). Note that either or both of hydrogen and nitrogen contained in the insulating film 118 enter the metal oxide film 209 in some cases. In that case, either or both of hydrogen and nitrogen are bonded to oxygen vacancies in the metal oxide film 209 to cause a reduction in the resistance of the metal oxide film; as a result, the conductive film 210 is formed. Note that the conductive films 210_1 and 210_2 constitute the conductive film 210. Since either or both of hydrogen and nitrogen contained in the insulating film 118 move to the conductive film 210, the conductive film 210 has higher hydrogen concentration and/or nitrogen concentration than the metal oxide films 108 and 208.

Then, part of the insulating film 118 that overlaps with the conductive film 210 may be etched (see FIGS. 13A-1 and 13B-1).

Through the above process, the display device illustrated in FIGS. 8A-1, 8A-2, 8B-1, and 8B-2 can be manufactured.

Note that the display device illustrated in FIGS. 10A-1, 10A-2, 10B-1, and 10B-2 can be fabricated through the steps up to the step in FIGS. 12A-2 and 12B-2.

At least part of this embodiment can be implemented in combination with any of the other embodiments and examples described in this specification as appropriate.

Embodiment 2

In this embodiment, the metal oxide film of one embodiment of the present invention will be described with reference to FIG. 18, FIGS. 19A to 19L, and FIGS. 20A to 20C.

<Composition of CAC-OS>

Described below is the detail of a metal oxide having a CAC composition that can be used in the transistor disclosed in one embodiment of the present invention. As a typical example of the metal oxide having a CAC composition, a CAC-OS will be described here.

In the CAC-OS, as illustrated in FIG. 3 for example, elements contained in the metal oxide are unevenly distributed to form the regions 001 and 002 each containing any of the elements as a main component. The regions are mixed to form or to be distributed in a mosaic pattern. In other words, the CAC-OS has a composition in which elements included in a metal oxide are unevenly distributed. Materials including unevenly distributed elements each have a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$+Ga$_{(1-x0)}$O$_3$ (ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different oxygen gas flow rate percentages in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate percentage) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 18:
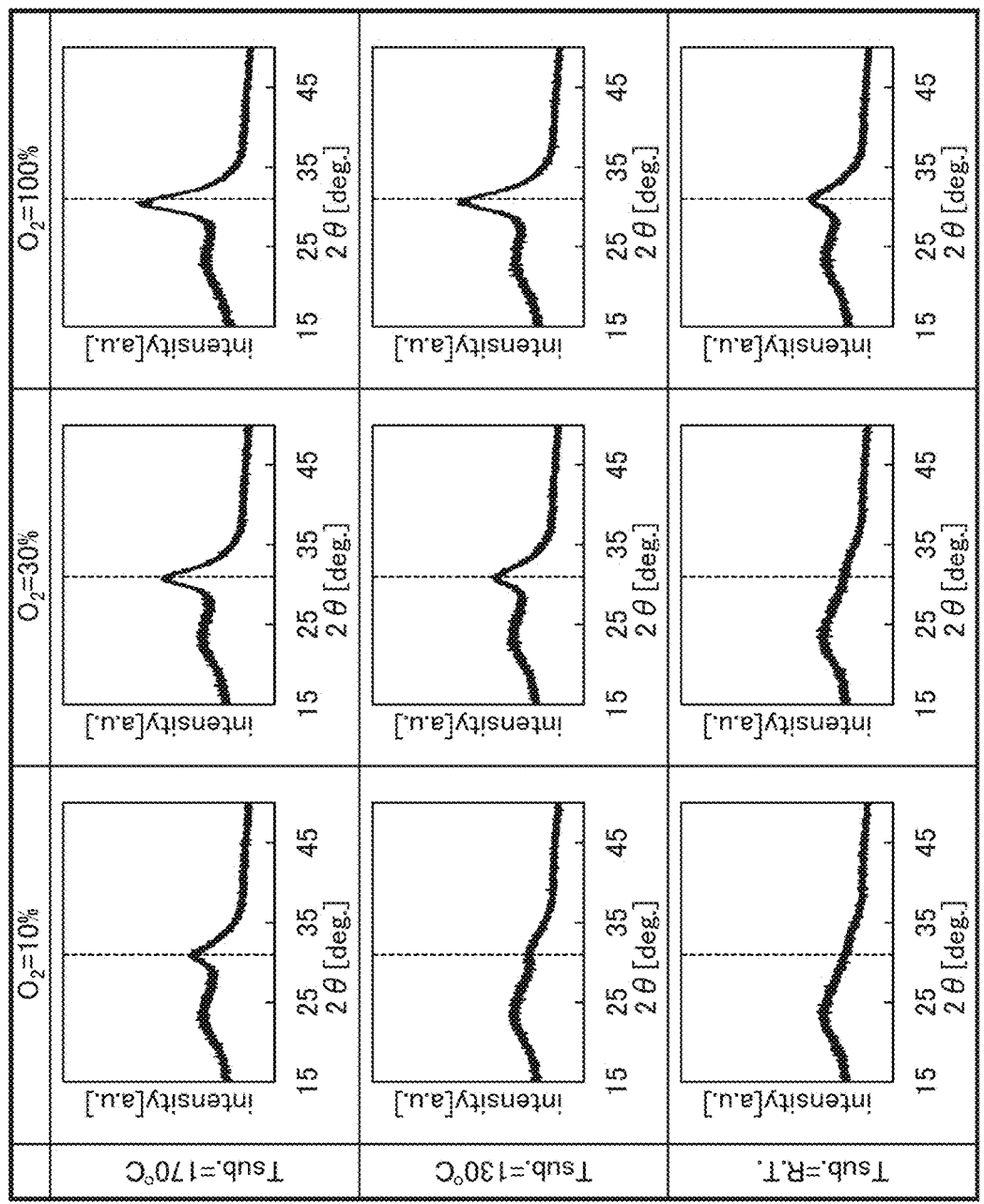
FIG. 18 shows measured XRD spectra of samples.

FIG. 18 shows XRD spectra measured by an out-of-plane method. In FIG. 18, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate percentage of 10%; the middle column shows the measurement results of the samples formed with an oxygen gas flow rate percentage of 30%; the right column shows the measurement results of the samples formed with an oxygen gas flow rate percentage of 100%.

In the XRD spectra shown in FIG. 18, the higher the substrate temperature at the time of formation is or the higher the oxygen gas flow rate percentage at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 18, as the substrate temperature at the time of formation is lower or the oxygen gas flow rate percentage at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate percentage.

<<Analysis with Electron Microscope>>

This section describes the observation and analysis results of the samples formed at a substrate temperature of R.T. and with an oxygen gas flow rate percentage of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nmϕ is performed.

Figures 19A, 19B, 19C, 19D, 19E, 19F, 19G, 19H, 19I, 19J, 19K, 19L:
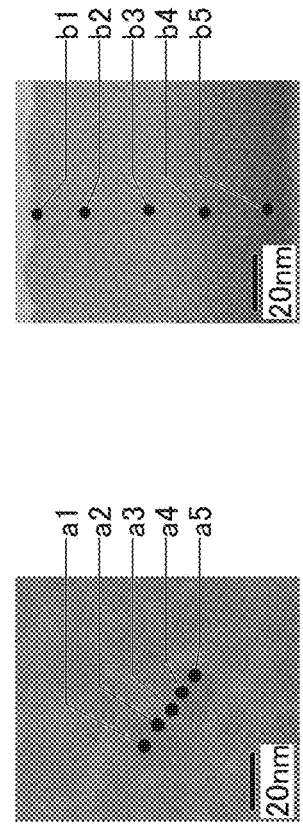
FIGS. 19A and 19B are TEM images of samples and FIGS. 19C to 19L are electron diffraction patterns thereof.

FIG. 19A is a plan-view TEM image of the sample formed at a substrate temperature of R.T. and with an oxygen gas flow rate percentage of 10%. FIG. 19B is a cross-sectional TEM image of the sample formed at a substrate temperature of R.T. and with an oxygen gas flow rate percentage of 10%.

<<Analysis of Electron Diffraction Patterns>>

This section describes electron diffraction patterns obtained by irradiation of the sample formed at a substrate temperature of R.T. and an oxygen gas flow rate percentage of 10% with an electron beam with a probe diameter of 1 nm (also referred to as a nanobeam).

Electron diffraction patterns of points indicated by black dots a1, a2, a3, a4, and a5 in the plan-view TEM image in FIG. 19A of the sample formed at a substrate temperature of R.T. and an oxygen gas flow rate percentage of 10% are observed. Note that the electron diffraction patterns are observed while electron beam irradiation is performed at a constant rate for 35 seconds. FIGS. 19C, 19D, 19E, 19F, and 19G show the results of the points indicated by the black dots a1, a2, a3, a4, and a5, respectively.

In FIGS. 19C, 19D, 19E, 19F, and 19G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 19B of the sample formed at a substrate temperature of R.T. and an oxygen gas flow rate percentage of 10% are observed. FIGS. 19H, 19I, 19J, 19K, and 19L show the results of the points indicated by the black dots b1, b2, b3, b4, and b5, respectively.

In FIGS. 19H, 19I, 19J, 19K, and 19L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot assigned to the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate percentage of 10% has regions with high luminance in a ring pattern and a plurality of bright spots appear in the ring-like pattern. Accordingly, the sample formed at a substrate temperature of R.T. and with an oxygen gas flow rate percentage of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate percentage is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate percentage of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 20A:
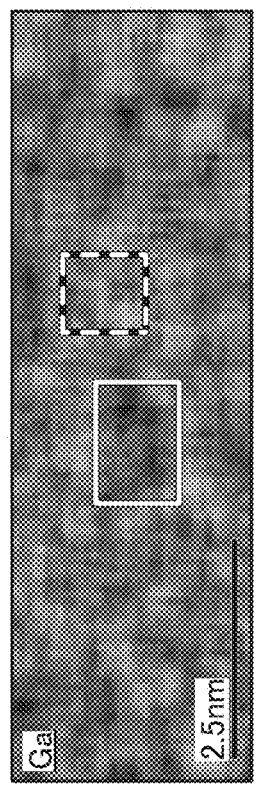
FIGS. 20A to 20C show EDX mapping images of a sample.
Figure 20B:
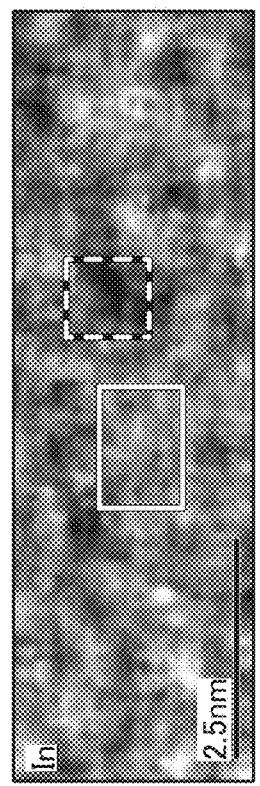
Figure 20C:
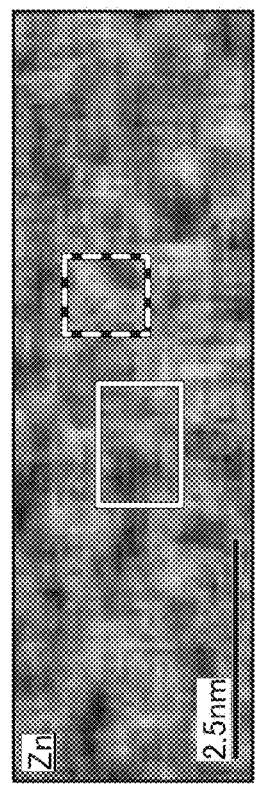

FIGS. 20A to 20C show EDX mapping images in a cross section of the sample formed at a substrate temperature of R.T. and with an oxygen gas flow rate percentage of 10%. FIG. 20A shows an EDX mapping image of Ga atoms. The proportion of the Ga atoms in all the atoms is 1.18 atomic % to 18.64 atomic %. FIG. 20B shows an EDX mapping image of In atoms. The proportion of the In atoms in all the atoms is 9.28 atomic % to 33.74 atomic %. FIG. 20C shows an EDX mapping image of Zn atoms. The proportion of the Zn atoms in all the atoms is 6.69 atomic % to 24.99 atomic %. FIGS. 20A to 20C show the same region in the cross section of the sample formed at a substrate temperature of R.T. and with an oxygen gas flow rate percentage of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 20A to 20C is 7200000 times.

The EDX mapping images in FIGS. 20A to 20C show relative distribution of brightness indicating that each element has a distribution in the sample formed at a substrate temperature of R.T. and with an oxygen gas flow rate percentage of 10%. Areas surrounded by solid lines and areas surrounded by dashed lines in FIGS. 20A to 20C are examined.

In FIG. 20A, a relatively dark region occupies a large area in the area surrounded by the solid line, while a relatively bright region occupies a large area in the area surrounded by the dashed line. In FIG. 20B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 20C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 20C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 20A to 20C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 20A to 20C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be inhibited and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has a high reliability. Thus, the CAC-OS is suitably used in a variety of semiconductor devices typified by a display.

<Transistor Including Metal Oxide Film>

Next, a transistor including a metal oxide film will be described.

With the use of the metal oxide film in a transistor, the transistor can have high carrier mobility and high switching characteristics. Moreover, the transistor can have high reliability.

A metal oxide film with a low carrier density is preferably used in a transistor. For example, the carrier density of the metal oxide film is lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

In order to reduce the carrier density of the metal oxide film, the impurity concentration of the metal oxide film is reduced so that the density of defect states can be reduced. In this specification and the like, a state with a low impurity concentration and a low density of defect states is referred to as a highly purified intrinsic or substantially highly purified intrinsic state. A highly purified intrinsic or substantially highly purified intrinsic metal oxide film has few carrier generation sources, and thus can have a low carrier density. A highly purified intrinsic or substantially highly purified intrinsic metal oxide film has a low density of defect states and accordingly has a low density of trap states in some cases.

Charge trapped by the trap states in the metal oxide film takes a long time to be released and may behave like fixed charge. Thus, a transistor in which a channel region is formed in an oxide semiconductor having a high density of trap states might have unstable electrical characteristics.

To obtain stable electrical characteristics of the transistor, it is effective to reduce the impurity concentration of the metal oxide film. In order to reduce the impurity concentration of the metal oxide film, the impurity concentration of a film which is adjacent to the metal oxide film is preferably reduced. As examples of the impurities, hydrogen, nitrogen, alkali metal, alkaline earth metal, iron, nickel, silicon, and the like are given.

Here, the influence of impurities in the metal oxide film is described.

When silicon or carbon that is one of Group 14 elements is contained in the metal oxide film, defect states are formed in an oxide semiconductor. Thus, the concentration of silicon or carbon in the oxide semiconductor and around an interface with the oxide semiconductor (measured by SIMS) is set lower than or equal to $2\times10^{18}$ atoms/cm$^3$, and preferably lower than or equal to $2\times10^{17}$ atoms/cm$^3$.

When the metal oxide film contains alkali metal or alkaline earth metal, defect states are formed and carriers are generated, in some cases. Thus, a transistor including a metal oxide film that contains alkali metal or alkaline earth metal is likely to be normally on. Therefore, it is preferable to reduce the concentration of alkali metal or alkaline earth metal in the metal oxide film. Specifically, the concentration of alkali metal or alkaline earth metal in the metal oxide film measured by SIMS is set lower than or equal to $1\times10^{18}$ atoms/cm$^3$, and preferably lower than or equal to $2\times10^{16}$ atoms/cm$^3$.

When the metal oxide film contains nitrogen, the metal oxide film easily becomes n-type by generation of electrons serving as carriers and an increase of carrier density. Thus, a transistor whose semiconductor includes an oxide semiconductor that contains nitrogen is likely to be normally on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the metal oxide film reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

The oxygen vacancies (Vo) in the metal oxide film can be reduced by introduction of oxygen into the metal oxide film. That is, the oxygen vacancies (Vo) in the metal oxide film disappear when the oxygen vacancies (Vo) are filled with oxygen. Accordingly, diffusion of oxygen in the metal oxide film can reduce the oxygen vacancies (Vo) in a transistor and improve the reliability of the transistor.

As a method for introducing oxygen into the metal oxide film, for example, an oxide in which oxygen content is higher than that in the stoichiometric composition is provided in contact with the oxide semiconductor. That is, in the oxide, a region containing oxygen in excess of that in the stoichiometric composition (hereinafter also referred to as an excess oxygen region) is preferably formed. In particular, in the case of using the metal oxide film in a transistor, an oxide including an excess oxygen region is provided in a base film, an interlayer film, or the like in the vicinity of the transistor, whereby oxygen vacancies in the transistor are reduced, and the reliability can be improved.

When a metal oxide film with sufficiently reduced impurity concentration is used for a channel formation region in a transistor, the transistor can have stable electrical characteristics.

At least part of this embodiment can be implemented in combination with any of the other embodiments and examples described in this specification as appropriate.

Embodiment 3

In this embodiment, a display device using a horizontal electric field mode liquid crystal element as a display element is described with reference to FIG. 21.

Figure 21:
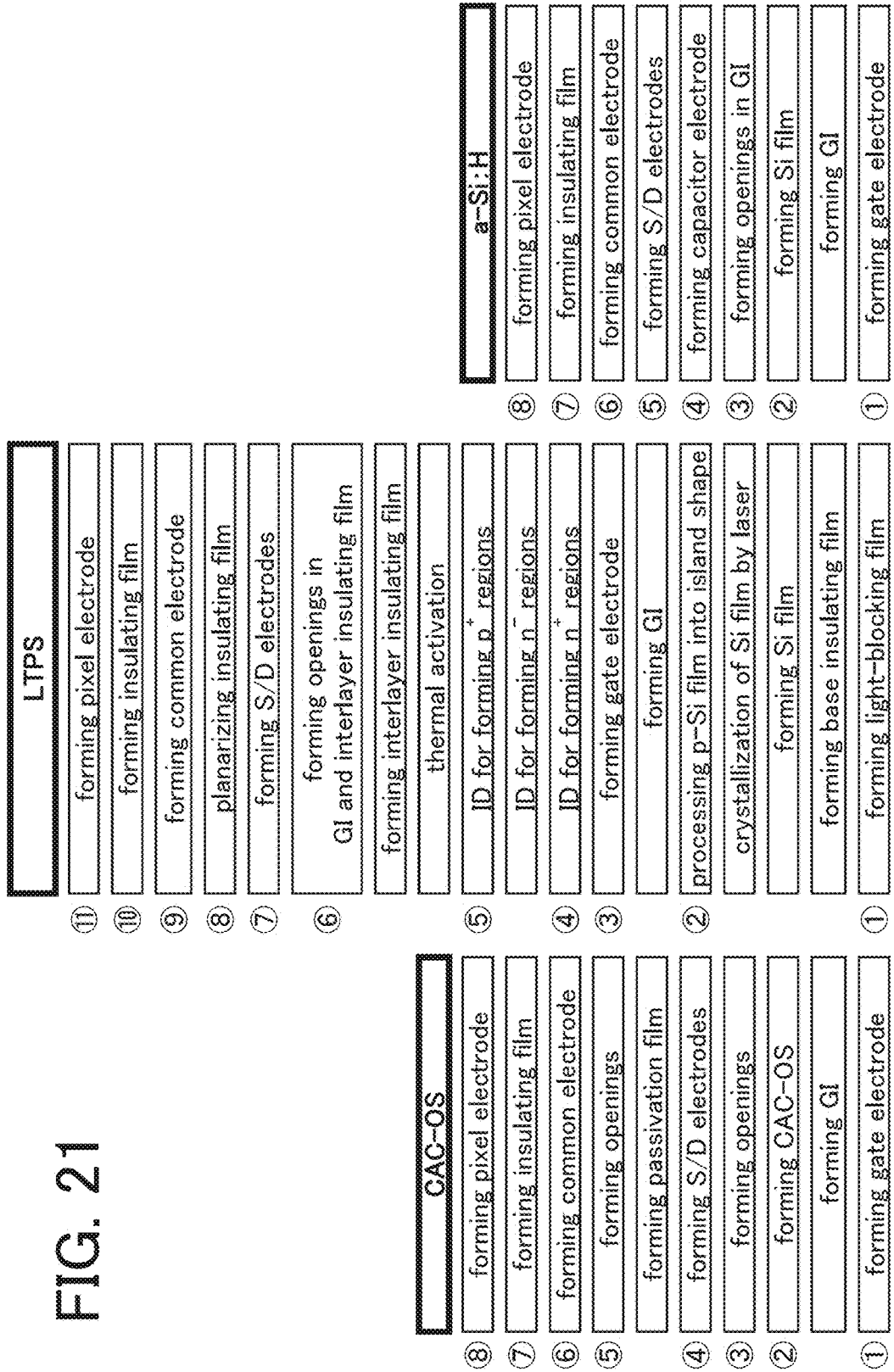
FIG. 21 illustrates manufacturing processes of display devices using a horizontal electric field mode liquid crystal element.

FIG. 21 shows flow charts showing manufacturing processes of display devices using horizontal electric field mode liquid crystal elements. FIG. 21 shows examples of manufacturing processes in the case of using an oxide semiconductor (in particular, CAC-OS), in the case of using low-temperature poly-silicon (LTPS), and in the case of using hydrogenated amorphous silicon (a-Si:H) as a channel of a transistor.

<3-1. CAC-OS>

The case of using a CAC-OS in the transistor is described. First, a gate electrode (GE) is formed with a sputtering apparatus (SP). Note that one mask is used when the gate electrode is processed.

Then, a gate insulating film (GI: gate insulator) is formed over the gate electrode with a PECVD apparatus. After that, an oxide semiconductor (OS) film to be an active layer is formed over the gate insulating film with a sputtering apparatus. Note that one mask is used when the oxide semiconductor film is processed into an island shape.

Then, parts of the gate insulating film are processed to form openings to the gate electrode. Note that one mask is used when the openings are formed.

Then, a conductive film is formed over the gate insulating film and the oxide semiconductor film with a sputtering apparatus, and the conductive film is processed to form a source electrode and a drain electrode (S/D electrodes). Note that one mask is used when the source electrode and the drain electrode are formed.

After that, a passivation film is formed over the oxide semiconductor film, the source electrode, and the drain electrode with a PECVD apparatus.

Then, the passivation film is partly processed to form openings that reach the source electrode and the drain electrode. Note that one mask is used when the openings are formed.

Then, a conductive film is formed over the passivation film with a sputtering apparatus to cover the openings formed in the passivation film, and the conductive film is processed to form a common electrode. Note that one mask is used when the common electrode is formed.

Then, an insulating film is formed over the passivation film and the common electrode with a PECVD apparatus. After that, openings that reach the source electrode and the drain electrode are formed in parts of the insulating film. Note that one mask is used when the insulating film is formed (when the openings are formed in the parts of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using CAC-OS, a total of eight masks are used for manufacturing the horizontal electric field mode liquid crystal display device.

<3-2. LTPS>

The case of using LTPS in the transistor is described. First, a light-blocking film is formed with a sputtering apparatus. Note that one mask is used when the light-blocking film is processed.

Then, a base insulating film is formed over the light-blocking film with a PECVD apparatus. After that, a Si film to be an active layer is formed over the base insulating film with a PECVD apparatus, followed by excimer laser annealing (ELA) for crystallization of the Si film. Owing to the ELA process, the Si film for the active layer becomes a crystalline silicon (poly-silicon or p-Si) film. Note that large equipment is required to perform ELA on a large area. Linear irregularities and the like peculiar to ELA occur in some cases.

Then, the p-Si film is processed into an island shape. Note that one mask is used when the p-Si film is processed into an island shape.

Then, a gate insulating film (GI) is formed over the p-Si film with a PECVD apparatus, followed by the formation of a gate electrode (GE) over the gate insulating film with a sputtering apparatus. Note that one mask is used when the gate electrode is formed. A part of the gate insulating film is removed when the gate electrode is formed.

After that, impurity implantation is performed with an ion doping (ID) apparatus to form n' regions in the p-Si film. Note that one mask is used when the $n^+$ regions are formed. Then, impurity implantation is performed with an ion doping apparatus to form $n^-$ regions in the p-Si film. Note that when the $n^-$ regions are formed, a mask is not used and doping is performed on an entire surface. Then, impurity implantation is performed with an ion doping apparatus to form $p^+$ regions in the p-Si film. Note that one mask is used to form the $p^+$ regions.

After that, thermal activation is performed. An annealing furnace, an RTA apparatus, or the like may be used for the thermal activation.

Then, an interlayer insulating film is formed over the p-Si film and the gate electrode with a PECVD apparatus. After that, parts of the interlayer insulating film and parts of the gate insulating film are processed to form openings to the $n^+$ regions and the $p^+$ regions. Note that one mask is used when the openings are formed.

Then, a conductive film is formed with a sputtering apparatus over the interlayer insulating film in which the openings are formed, and the conductive film is processed to form a source electrode and a drain electrode (S/D electrodes). Note that one mask is used when the source electrode and the drain electrode are formed.

After that, a planarization insulating film is formed over the source electrode and the drain electrode with a coater apparatus. As the planarization insulating film, an organic resin film may be used, for example. Note that one mask is used when the planarization insulating film is formed.

Then, a conductive film is formed over the planarization insulating film with a sputtering apparatus, and the conductive film is processed to form a common electrode. Note that one mask is used when the common electrode is formed.

Then, an insulating film is formed over the common electrode with a PECVD apparatus. After that, openings that reach the source electrode and the drain electrode are formed in parts of the insulating film. Note that one mask is used when the insulating film is formed (when the openings are formed in the parts of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using LTPS, a total of eleven masks are used for manufacturing the horizontal electric field mode liquid crystal display device.

<3-3. a-Si:H>

The case of using a-Si:H in the transistor is described. First, a gate electrode (GE) is formed with a sputtering apparatus. Note that one mask is used when the gate electrode is processed.

Then, a gate insulating film (GI) is formed over the gate electrode with a PECVD apparatus. After that, a silicon (Si) film to be an active layer is formed over the gate insulating film with a PECVD apparatus. Note that one mask is used when the silicon film is processed into an island shape.

Then, a part of the gate insulating film is processed to form an opening to the gate electrode. Note that one mask is used when the opening is formed.

Then, a conductive film is formed over the gate insulating film with a sputtering apparatus, and the conductive film is processed to form a capacitor electrode. Note that one mask is used when the capacitor electrode is processed.

Then, a conductive film is formed over the gate insulating film and the silicon film with a sputtering apparatus, and the conductive film is processed to form a source electrode and a drain electrode (S/D electrodes). Note that one mask is used when the source electrode and the drain electrode are formed.

Then, a conductive film is formed over the source electrode and the drain electrode with a sputtering apparatus, and the conductive film is processed to form a common electrode. Note that one mask is used when the common electrode is formed.

Then, an insulating film is formed over the common electrode with a PECVD apparatus. After that, openings that reach the source electrode and the drain electrode are formed in parts of the insulating film. Note that one mask is used when the insulating film is formed (when the openings are formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using a-Si:H, a total of eight masks are used for manufacturing the horizontal electric field mode liquid crystal display device.

Note that in each of the flow charts of the CAC-OS, the LTPS, and the a-Si:H, steps of forming the common electrode, forming the insulating film over the common electrode, and forming the pixel electrode are peculiar to the manufacturing process of the horizontal electric field mode liquid crystal display device. Therefore, a process different from that of the horizontal electric field mode liquid crystal display device is used in the case of manufacturing a liquid crystal display device using a vertical electric field mode (e.g., VA mode) liquid crystal element or in the case of using an organic EL element as a display element.

As illustrated in FIG. 21, in the case of using the CAC-OS in the transistor for the horizontal electric field mode liquid crystal element, the transistor can be fabricated by a simpler process than in the case of using LTPS. Moreover, the transistor using the CAC-OS can be manufactured with the same number of masks as those used for manufacturing the transistor using a-Si:H and has higher mobility than a transistor using s-Si:H. Thus, when the transistor using the CAC-OS is employed, part or the whole of a driver circuit (gate driver or source driver) can be provided in a display device.

Table 1 shows the characteristics of each of the processes.

TABLE 1

|  | CAC-OS | | LTPS | | a-Si:H | |
| --- | --- | --- | --- | --- | --- | --- |
|  | TN, VA | Horizontal electric field | TN, VA | Horizontal electric field | TN, VA | Horizontal electric field |
| The number of masks for forming LCD | 6-7 | 6-8 | 9 | 11 | 4-5 | 8 or less |
| The number of masks for forming FET | (5) | | (6) | | (4) | |
| Maximum process temperature | 350° C. or less | | 400° C. or less | | 350° C. or less | |
| Gate driver | Possible | | Possible | | Possible | |
| Mobility [cm$^2$/Vs] | 100 or less | | 100 or less | | 1 or less | |
| on/off ratio | 20 or less | | 9 or less | | 7 or less | |
| Device cost | Low | | High | | Low | |
| Plant cost | Low | | High | | Low | |

As shown in Table 1, in the case of using CAC-OS, the number of masks is almost equivalent to that in the case of using a-Si:H, and the electrical characteristics such as the field-effect mobility (or simply referred to as mobility) and the on/off ratio are superior to those in the case of using a-Si:H. Thus, using CAC-OS achieves a display device having high display quality. Moreover, as shown in Table 1, the maximum process temperature, the device cost, and the plant cost for CAC-OS are lower than those of LTPS. Accordingly, the manufacturing cost for the display device can be saved.

Note that as compared to a transistor using silicon, a transistor using an oxide semiconductor typified by CAC-OS achieves advantageous effects such as a low off-state current, no or very few short-channel effects, a high withstand voltage, and a small change in temperature characteristics. In addition, a transistor using an oxide semiconductor can operate at a high speed because of having a switching speed or frequency characteristics comparable to those of a transistor using silicon. Thus, a display device including a transistor using an oxide semiconductor can have high display quality and high reliability.

At least part of this embodiment can be implemented in combination with any of the other embodiments and examples described in this specification as appropriate.

Embodiment 4

In this embodiment, examples of a display device that includes the transistor described in the above embodiments are described below with reference to FIG. 22 to FIG. 28.

Figure 22:
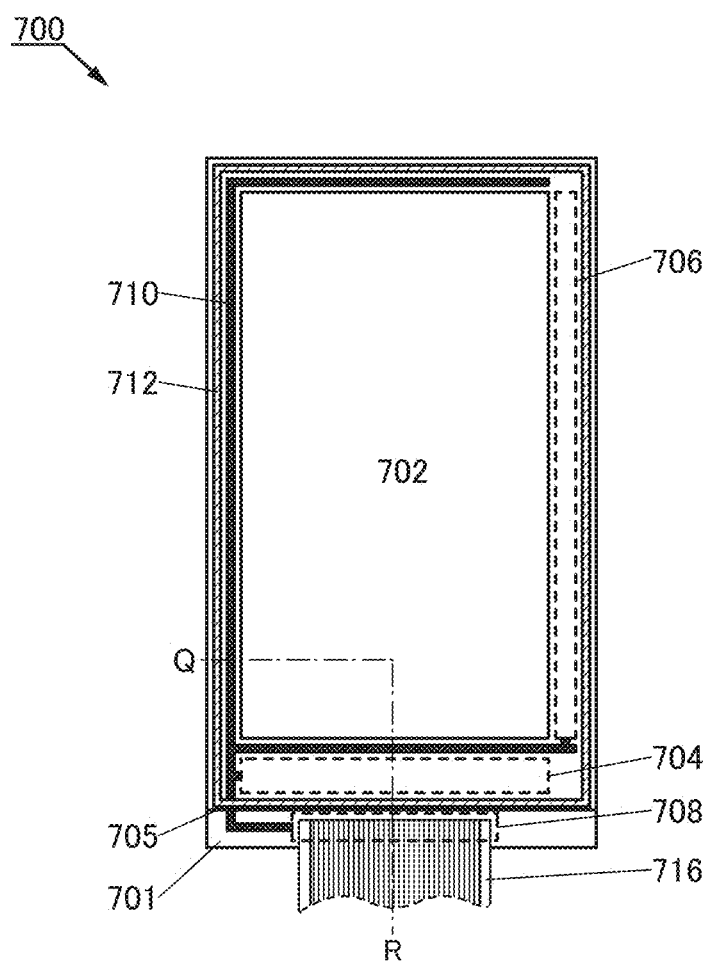
FIG. 22 is a top view illustrating one embodiment of a display device.

FIG. 22 is a top view illustrating an example of a display device. A display device 700 in FIG. 22 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are bonded to each other with the sealant 712. That is, the pixel portion 702, the source driver circuit portion 704, and the gate driver circuit portion 706 are enclosed by the first substrate 701, the sealant 712, and the second substrate 705. Although not illustrated in FIG. 22, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), or a digital micro shutter (DMS) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of displaying color images are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be inhibited, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element as a display element and a structure including an EL element as a display element are described with reference to FIG. 23 to FIG. 28. FIG. 23 to FIG. 25 and FIG. 27 are each a cross-sectional view taken along dashed-dotted line Q-R in FIG. 22 and each illustrate the structure including a liquid crystal element as a display element. FIG. 26 and FIG. 28 are each a cross-sectional view taken along dashed-dotted line Q-R in FIG. 22 and each illustrate the structure including an EL element as a display element.

Portions common to FIG. 23 to FIG. 28 are described first, and then, different portions are described.

<4-1. Portions Common to Display Devices>

The display device 700 in FIG. 23 to FIG. 28 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor (not illustrated). The source driver circuit portion 704 includes a transistor 752.

The transistor 750 and the transistor 752 each have a structure similar to that of the transistor 100D described above. Note that the transistor 750 does not include a second gate electrode. The transistor 750 and the transistor 752 may each have the structure of any of the other transistors described in the above embodiments.

The transistor used in this embodiment includes a metal oxide film that is highly purified and in which formation of oxygen vacancies is inhibited. The off-state current of the transistor can be low. Accordingly, an electrical signal such as an image signal can be held for a long time, and a long writing interval can be set in an on state. Accordingly, the frequency of refresh operation can be reduced, which reduces power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

Although FIG. 23 to FIG. 28 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables images to be displayed on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<4-2. Structure Example of Display Device Including Liquid Crystal Element>

Figure 23:
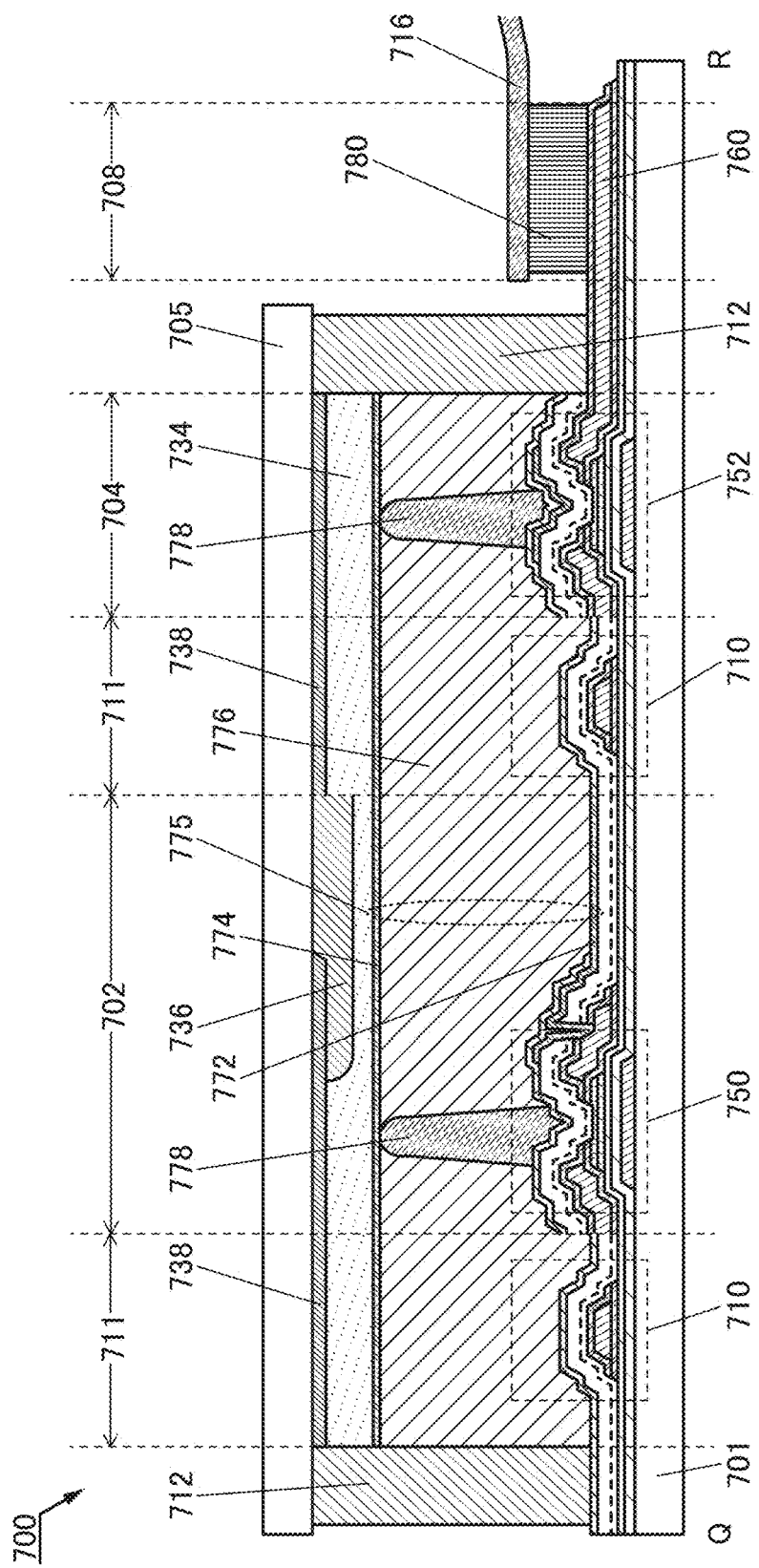
FIG. 23 is a cross-sectional view illustrating one embodiment of a display device.

The display device 700 in FIG. 23 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 23 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over a gate insulating film of the transistor 750 and functions as a pixel electrode, that is, one electrode of the display element. The conductive film 772 has a function of a reflective electrode. The display device 700 in FIG. 23 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used for the conductive film 772.

Figure 24:
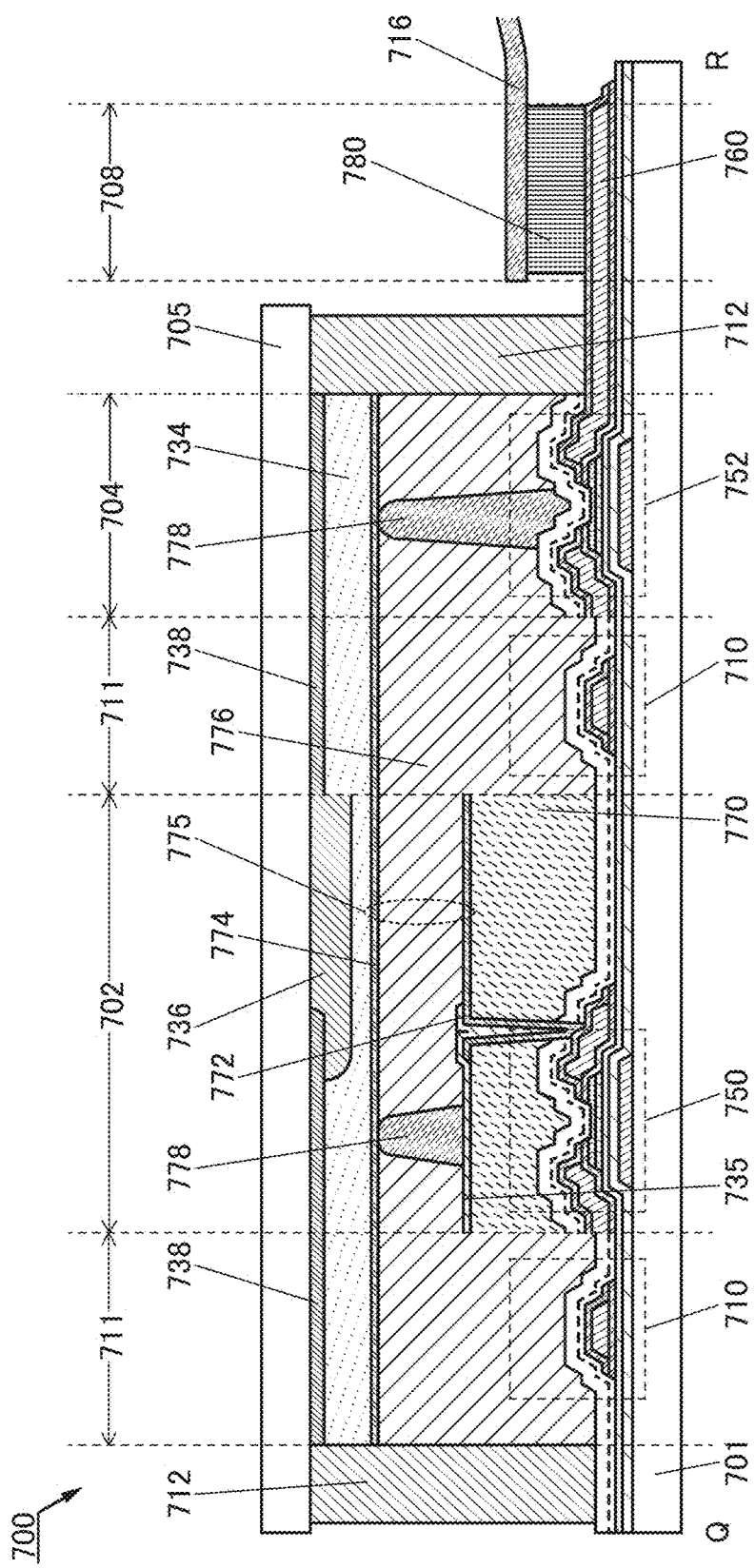
FIG. 24 is a cross-sectional view illustrating one embodiment of a display device.

As illustrated in FIG. 24, an insulating film 770 functioning as a planarization film may be formed in the pixel portion 702. The conductive film 772 is formed over the insulating film 770. Furthermore, an insulating film 735 having an opening is formed over the conductive film 772.

Note that the display device 700 is not limited to the examples in FIG. 23 and FIG. 24, each of which illustrates a reflective color liquid crystal display device, and may be a transmissive color liquid crystal display device in which a conductive film that transmits visible light is used for the conductive film 772. Alternatively, the display device 700 may be what is called a transflective color liquid crystal display device in which a reflective color liquid crystal display device and a transmissive color liquid crystal display device are combined.

Figure 25:
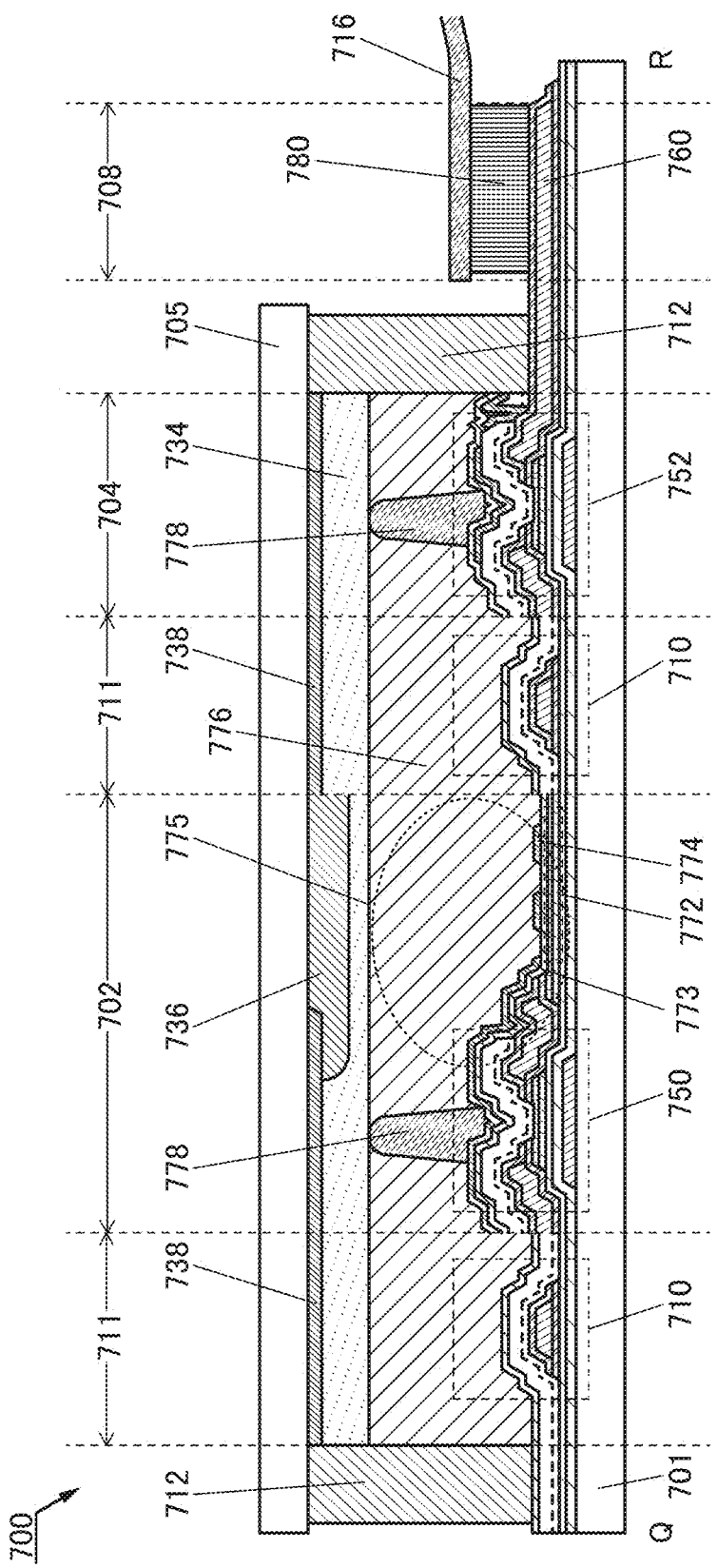
FIG. 25 is a cross-sectional view illustrating one embodiment of a display device.
Figure 26:
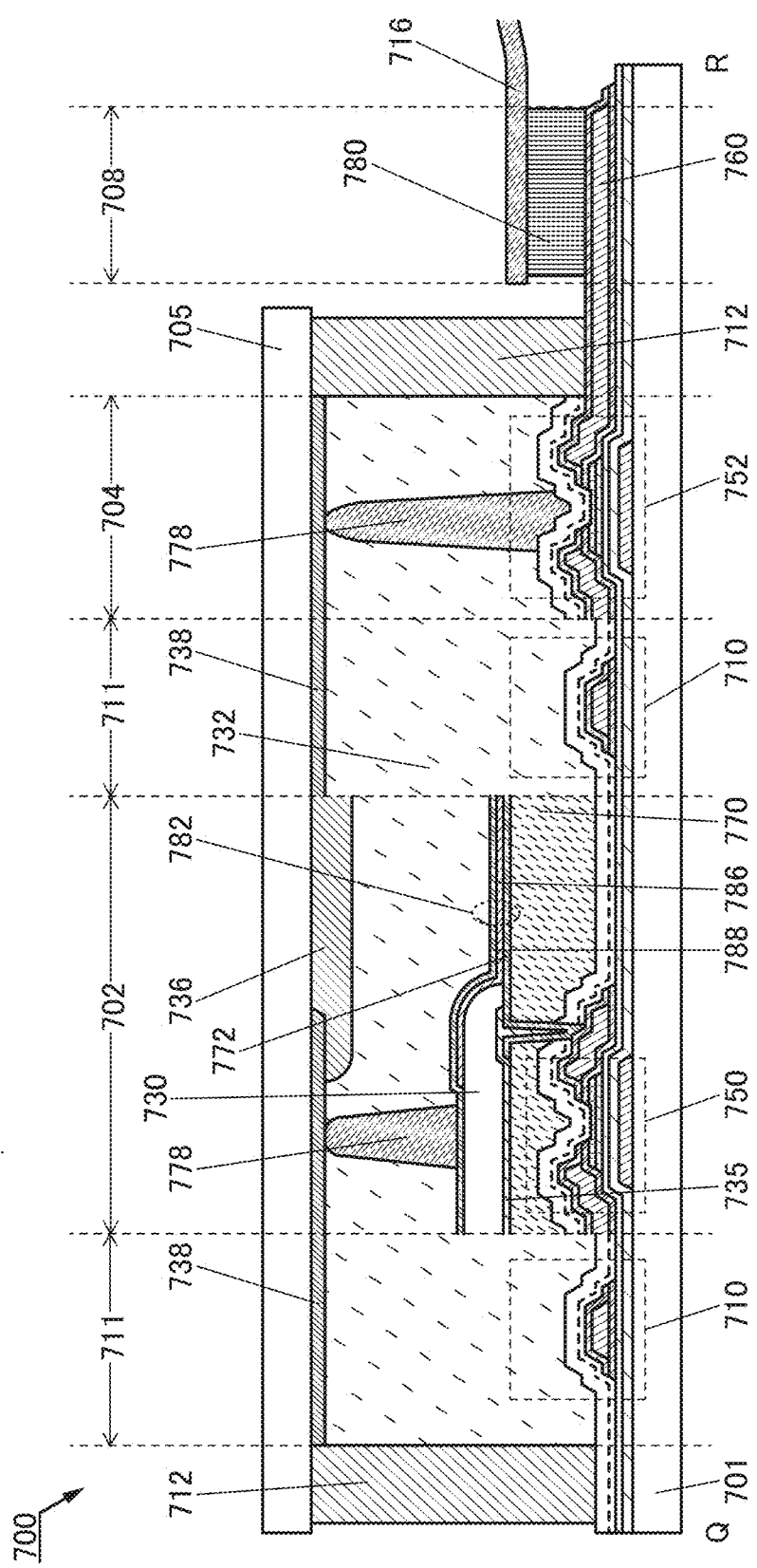
FIG. 26 is a cross-sectional view illustrating one embodiment of a display device.

FIG. 25 illustrates an example of a transmissive color liquid crystal display device. FIG. 25 is a cross-sectional view taken along dashed-dotted line Q-R in FIG. 22 and illustrates the structure including a liquid crystal element as a display element. The display device 700 illustrated in FIG. 25 is an example of employing a horizontal electric field mode (e.g., a fringe field switching (FFS) mode) as a driving mode of the liquid crystal element. In the structure illustrated in FIG. 25, an insulating film 773 is provided over the conductive film 772 functioning as the pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 23 to FIG. 25, the conductive film 772 and/or the conductive film 774 may be provided with an alignment film on a side in contact with the liquid crystal layer 776. Although not illustrated in FIG. 23 to FIG. 25, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, an FFS mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<4-3. Display Device Including Light-Emitting Element>

The display device 700 illustrated in FIG. 26 includes a light-emitting element 782. The light-emitting element 782 includes a conductive film 772, an EL layer 786, and a conductive film 788. The display device 700 illustrated in FIG. 26 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 illustrated in FIG. 26, an insulating film 730 is provided over the transistor 750. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 may be covered with the insulating film 734 as in FIG. 23. A space between the light-emitting element 782 and the coloring film 736 is filled with a sealing film 732. The structure of the display device 700 is not limited to the example in FIG. 26, in which the coloring film 736 is provided. For example, a structure without the coloring film 736 may also be employed in the case where the EL layer 786 is formed by separate coloring.

The insulating film 730 can be formed using a heat-resistant organic material, such as a polyimide resin, an acrylic resin, a polyimide amide resin, a benzocyclobutene resin, a polyamide resin, or an epoxy resin. Note that the insulating film 730 may be formed by stacking a plurality of insulating films formed from these materials.

<4-4. Structure Example of Display Device Provided with Input/Output Device>

An input/output device may be provided in the display devices 700 illustrated in FIG. 25 and FIG. 26. As an example of the input/output device, a touch panel or the like can be given.

Figure 27:
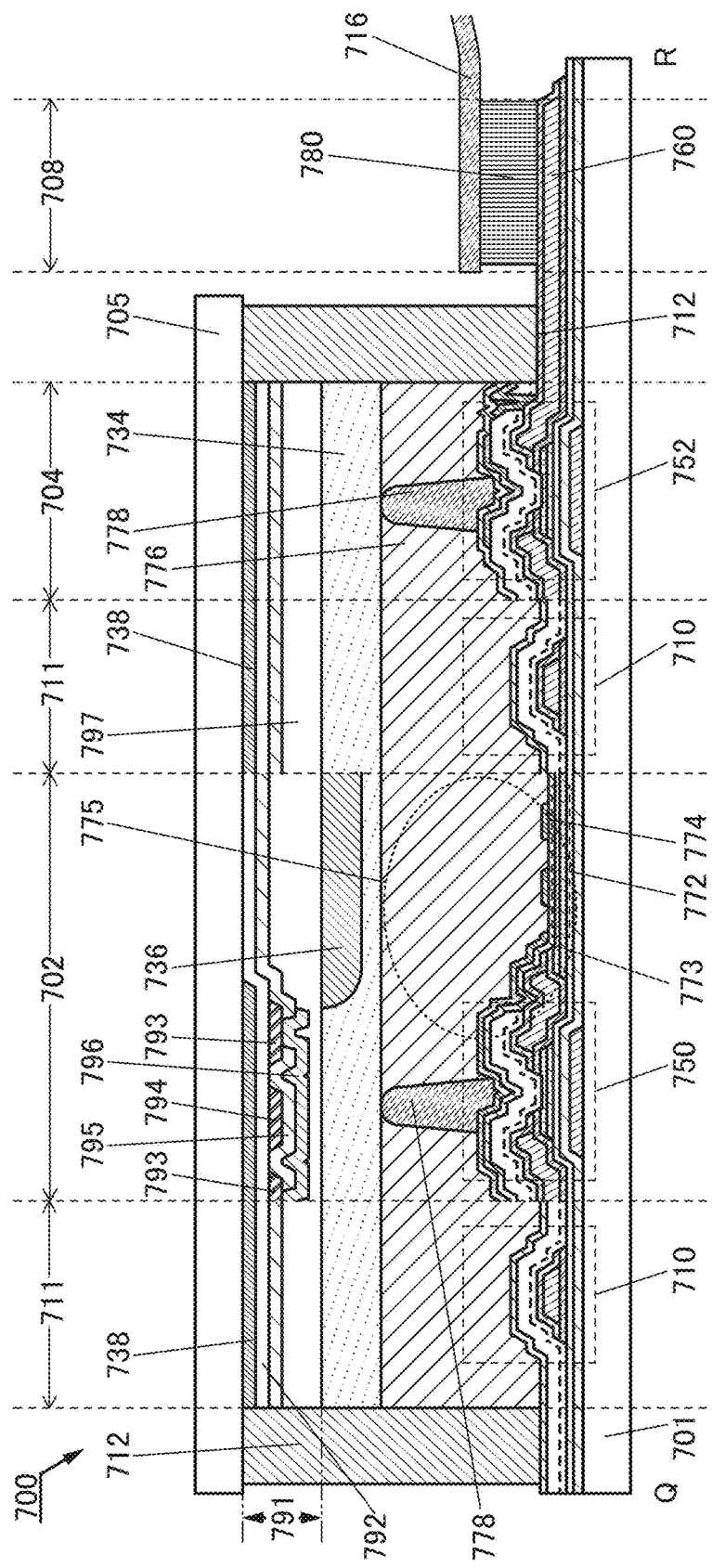
FIG. 27 is a cross-sectional view illustrating one embodiment of a display device.
Figure 28:
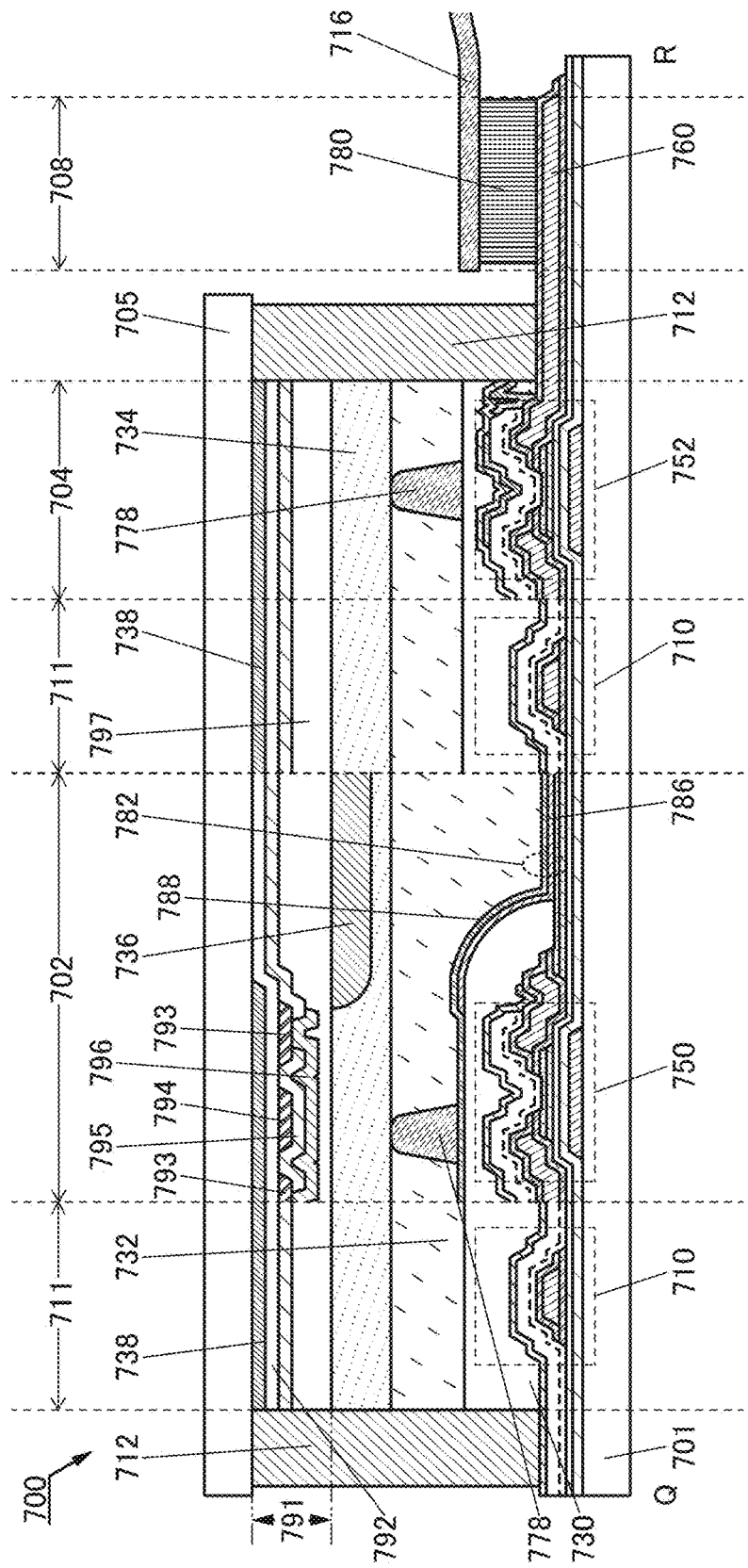
FIG. 28 is a cross-sectional view illustrating one embodiment of a display device.

FIG. 27 illustrates a structure in which the display device 700 illustrated in FIG. 25 is provided with a touch panel 791.

FIG. 28 illustrates a structure in which the display device 700 illustrated in FIG. 26 is provided with the touch panel 791.

FIG. 27 is a cross-sectional view of the structure in which the display device 700 illustrated in FIG. 25 is provided with the touch panel 791, and FIG. 28 is a cross-sectional view of the structure in which the display device 700 illustrated in FIG. 26 is provided with the touch panel 791.

First, the touch panel 791 illustrated in FIG. 27 and FIG. 28 is described below.

The touch panel 791 illustrated in FIG. 27 and FIG. 28 is what is called an in-cell touch panel provided between the second substrate 705 and the coloring film 736. The touch panel 791 is formed on the second substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. Changes in the capacitance between the electrodes 793 and 794 can be detected when an object such as a finger or a stylus approaches, for example.

A portion in which the electrode 793 intersects with the electrode 794 is illustrated in the upper portion of the transistor 750 illustrated in FIG. 27 and FIG. 28. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 27 and FIG. 28 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 27, it is preferable that the electrode 793 not overlap with the liquid crystal element 775. As illustrated in FIG. 28, it is preferable that the electrode 793 not overlap with the light-emitting element 782. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/sq. and less than or equal to 100 Ω/sq.

Although the structure of the in-cell touch panel is illustrated in each of FIG. 27 and FIG. 28, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments and examples described in this specification as appropriate.

Embodiment 5

In this embodiment, the display device of one embodiment of the present invention is described with reference to FIGS. 29A to 29C.

<Circuit Configuration of Display Device>

A display device illustrated in FIG. 29A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n depending on the potential of the scan line GL_m.

Figure 29A:
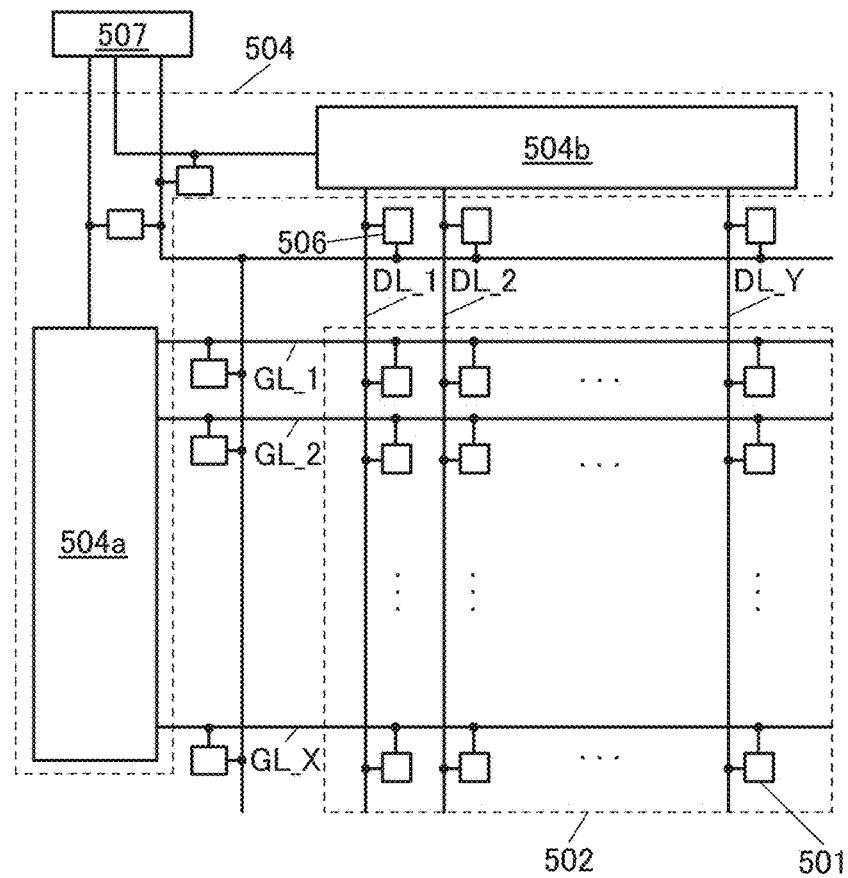
FIGS. 29A to 29C are a block diagram and circuit diagrams each illustrating a display device.

The protection circuit 506 shown in FIG. 29A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As shown in FIG. 29A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 29A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 29B:
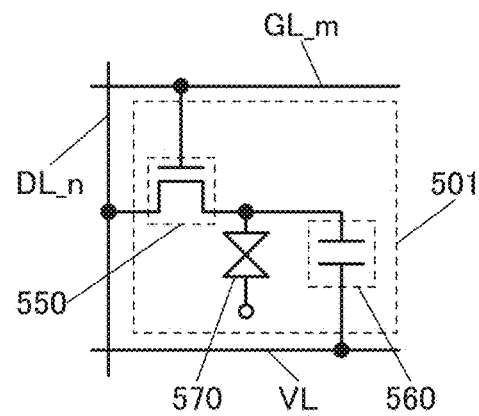

Each of the plurality of pixel circuits 501 in FIG. 29A can have the structure illustrated in FIG. 29B, for example.

The pixel circuit 501 in FIG. 29B includes a liquid crystal element 570, a transistor 550, and a capacitor 560. As the transistor 550, the transistor described in the above embodiment can be used.

The potential of one of a pair of electrodes of the liquid crystal element 570 is set as appropriate depending on the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an ASM mode, an OCB mode, an FLC mode, an AFLC mode, an MVA mode, a PVA mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 has a function of controlling whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate depending on the specifications of the pixel circuit 501. The capacitor 560 functions as a storage capacitor for storing written data.

For example, in the display device including the pixel circuits 501 in FIG. 29B, the gate driver 504a in FIG. 29A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 29C:
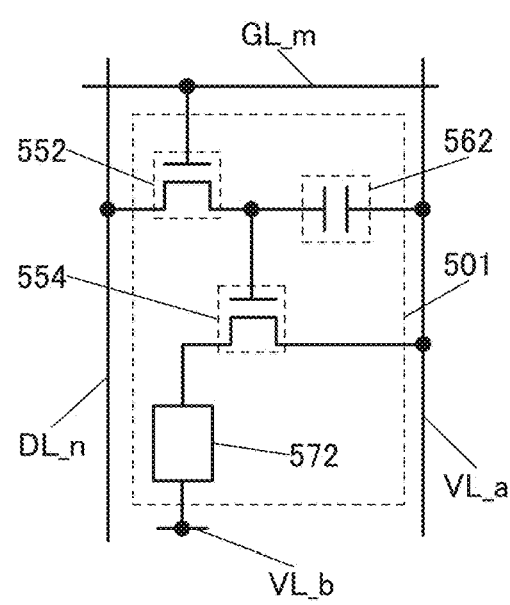

Each of the plurality of pixel circuits 501 in FIG. 29A can have a configuration illustrated in FIG. 29C, for example.

The pixel circuit 501 illustrated in FIG. 29C includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

For example, in the display device including the pixel circuit 501 in FIG. 29C, the pixel circuits 501 are sequentially selected row by row by the gate driver 504a illustrated in FIG. 29A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled by the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments and examples described in this specification as appropriate.

Embodiment 6

Figure 30:
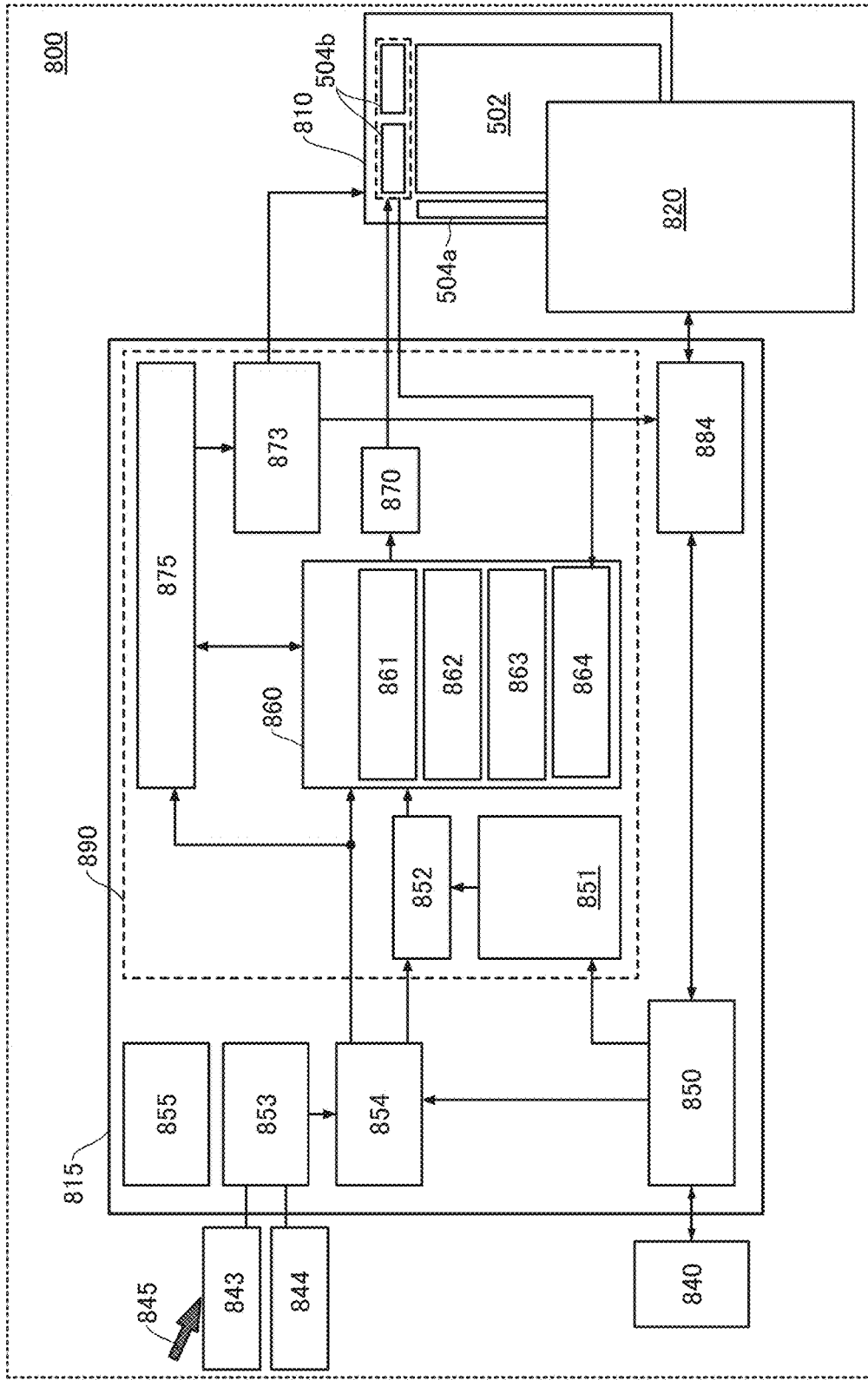
FIG. 30 is a block diagram illustrating a configuration example of a controller IC.

FIG. 30 is a block diagram illustrating a configuration example of a display device 800. The display device 800 includes a display unit 810, a touch sensor unit 820, a controller IC 815, and a host 840. The display device 800 may include an optical sensor 843 and an open/close sensor 844, as necessary. The display unit 810 includes the pixel portion 502, the gate driver 504a, and the source driver 504b.

<<Controller IC>>

In FIG. 30, the controller IC 815 includes an interface 850, a frame memory 851, a decoder 852, a sensor controller 853, a controller 854, a clock generation circuit 855, an image processing portion 860, a memory 870, a timing controller 873, a register 875, and a touch sensor controller 884.

Communication between the controller IC 815 and the host 840 is performed through the interface 850. Image data, a variety of control signals, and the like are transmitted from the host 840 to the controller IC 815. Information on a touch position or the like obtained by the touch sensor controller 884 is transmitted from the controller IC 815 to the host 840. Note that the decision whether the circuits included in the controller IC 815 are chosen or not is made as appropriate depending on the standard of the host 840, the specifications of the display device 800, and the like.

The frame memory 851 is a memory for storing the image data input to the controller IC 815. In the case where compressed image data is transmitted from the host 840, the frame memory 851 can store the compressed image data. The decoder 852 is a circuit for decompressing the compressed image data. When decompression of the image data is not needed, processing is not performed in the decoder 852. Alternatively, the decoder 852 can be provided between the frame memory 851 and the interface 850.

The image processing portion 860 has a function of performing various kinds of image processing on image data. The image processing portion 860 includes, for example, a gamma correction circuit 861, a dimming circuit 862, and a toning circuit 863.

In the case where a display element that emits light when current flows, such as an organic EL or an LED, is used as a display element of the display device 800, the image processing portion 860 may include a correction circuit 864. In that case, the source driver 504b preferably includes a circuit for detecting current flowing in the display element. The correction circuit 864 has a function of adjusting the luminance of the display element on the basis of a signal transmitted from the source driver 504b.

The image data processed in the image processing portion 860 is output to the source driver 504b through the memory 870. The memory 870 is a memory for temporarily storing image data. The source driver 504b has a function of processing the input image data and writing the image data to a source line of the pixel portion 502. Note that there is no limitation on the number of the source drivers 504b, and a necessary number of the source drivers 504b for pixels in the pixel portion 502 are provided.

The timing controller 873 has a function of generating timing signals to be used in the source driver 504b, the touch sensor controller 884, and the gate driver 504a.

The touch sensor controller 884 has a function of controlling a driver circuit of the touch sensor unit 820. A signal including touch information read from the touch sensor unit 820 is processed in the touch sensor controller 884 and transmitted to the host 840 through the interface 850. The host 840 generates image data reflecting the touch information and transmits the image data to the controller IC 815. Note that the controller IC 815 can reflect the touch information in the image data.

The clock generation circuit 855 has a function of generating a clock signal used in the controller IC 815. The controller 854 has a function of processing a variety of control signals transmitted from the host 840 through the interface 850 and controlling a variety of circuits in the controller IC 815. The controller 854 also has a function of controlling power supply to a variety of circuits in the controller IC 815. Hereinafter, temporary stop of power supply to a circuit that is not used is referred to as power gating. Note that a power supply line is not illustrated in FIG. 30.

The register 875 stores data used for the operation of the controller IC 815. The data stored in the register 875 includes a parameter used to perform correction processing in the image processing portion 860, parameters used to generate waveforms of a variety of timing signals in the timing controller 873, and the like. The register 875 is provided with a scan chain register including a plurality of registers.

The sensor controller 853 is electrically connected to the optical sensor 843. The optical sensor 843 senses light 845 and generates a sensor signal. The sensor controller 853 generates a control signal on the basis of the sensor signal. The control signal generated in the sensor controller 853 is output to the controller 854, for example.

The image processing portion 860 can adjust the luminance of the pixel depending on the brightness of the light 845 measured with the optical sensor 843 and the sensor controller 853. In other words, the luminance of the pixel can be reduced in an environment where the brightness of the light 845 is low to reduce glare and the power consumption. In an environment where the brightness of the light 845 is high, the luminance of the pixel can be increased to obtain a display quality with excellent visibility. The adjustment can be made on the basis of the luminance a user has set. Here, the adjustment can be referred to as dimming or dimming treatment. In addition, a circuit that performs the treatment is referred to as a dimming circuit.

The optical sensor 843 and the sensor controller 853 can have a function of measuring the tone of the light 845, so that the tone can be corrected. For example, in an environment with a reddish hue of sunset, the user of the display device 800 recognizes the reddish hue as white because of chromatic adaptation. In that case, the display of the display device 800 is seen bluish white. Thus, red (R) is emphasized in the display device 800 so that the tone can be corrected. Here, the adjustment can be referred to as toning or toning treatment. In addition, a circuit that performs the treatment is referred to as a toning circuit.

The image processing portion 860 might include another processing circuit such as an RGB-RGBW conversion circuit depending on the specifications of the display device 800. The RGB-RGBW conversion circuit has a function of converting image data of red, green, and blue (RGB) into image data of red, green, blue, and white (RGBW). That is, in the case where the display device 800 includes pixels of four colors of RGBW, power consumption can be reduced by displaying a white (W) component in the image data using the white (W) pixel. Note that in the case where the display device 800 includes pixels of four colors of RGBY (red, green, blue, and yellow), an RGB-RGBY conversion circuit can be used, for example.

<Parameter>

Image correction processing such as gamma correction, dimming, or toning corresponds to processing of generating output correction data Y with respect to input image data X. The parameter that the image processing portion 860 uses is a parameter for converting the image data X into the correction data Y.

Figure 31A:
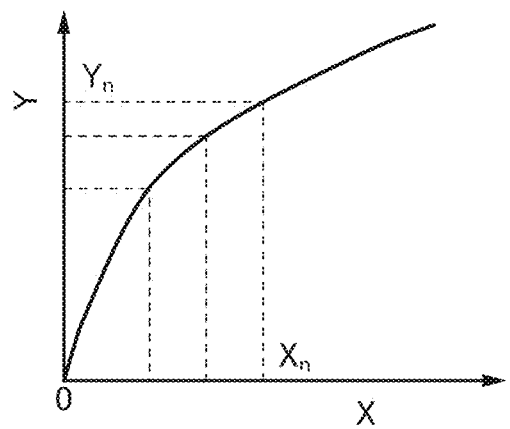
FIGS. 31A to 31C are diagrams for illustrating parameters.
Figure 31B:
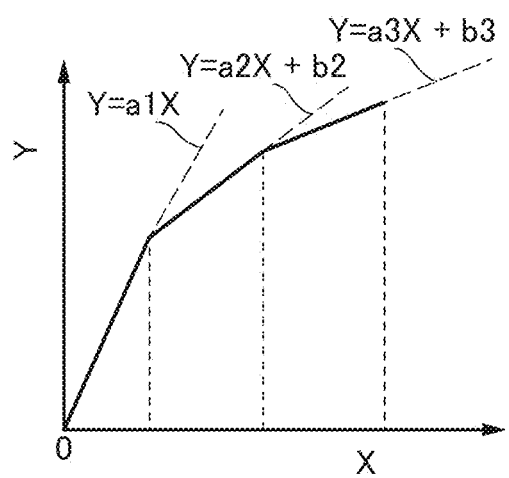

As a parameter setting method, there are a table method and a function approximation method. In a table method explained in FIG. 31A, correction data $Y_n$ with respect to image data $X_n$ is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as explained in FIG. 31B. Note that a1, a2, b2, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 31C:
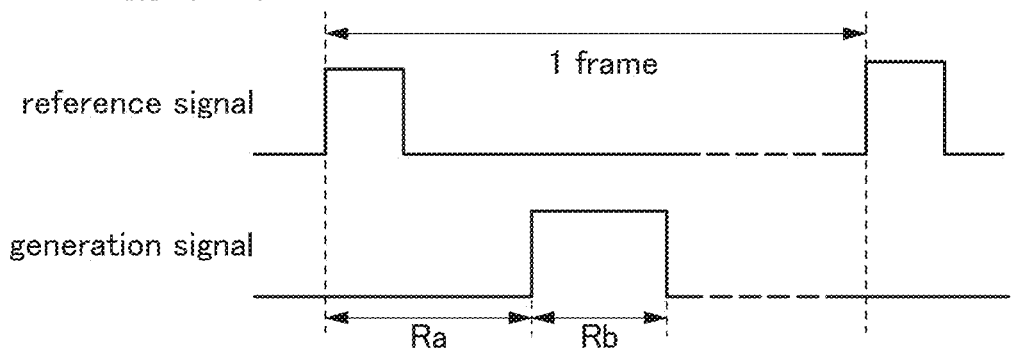

The parameter that the timing controller 873 uses indicates timing at which a generation signal of the timing controller 873 becomes "L" (or "H") with respect to a reference signal as explained in FIG. 31C. A parameter Ra (or Rb) indicates the number of clock cycles that corresponds to timing at which the parameter becomes "L" (or "H") with respect to the reference signal.

The above parameter for correction can be stored in the register 875. Other parameters that can be stored in the register 875 include luminance, tones, and energy saving settings (time taken to make display dark or turn off display) of the display device 800, sensitivity of the touch sensor controller 884, and the like.

<Power Gating>

In the case where image data transmitted from the host 840 is not changed, the controller 854 can perform power gating of some circuits in the controller IC 815. Specifically, for example, the operation of circuits (the frame memory 851, the decoder 852, the image processing portion 860, the memory 870, the timing controller 873, and the register 875) in a region 890 can be temporarily stopped. Power gating can be performed in the case where a control signal that indicates no change in the image data is transmitted from the host 840 to the controller IC 815 and detected by the controller 854.

Alternatively, a timer function may be incorporated into the controller 854 so that when the image data is not changed, the timing of the resumption of power supply to the circuits in the region 890 is determined on the basis of time measured by a timer, for example.

In addition to the power gating of the circuits in the region 890, power gating of the source driver 504b may be performed.

Note that in the configuration illustrated in FIG. 30, the source driver 504b may be provided in the controller IC 815. In other words, the source driver 504b and the controller IC 815 may be formed on the same chip.

Specific circuit configuration examples of the frame memory 851 and the register 875 will be described below.

<Frame Memory 851>

Figures 32A, 32B:
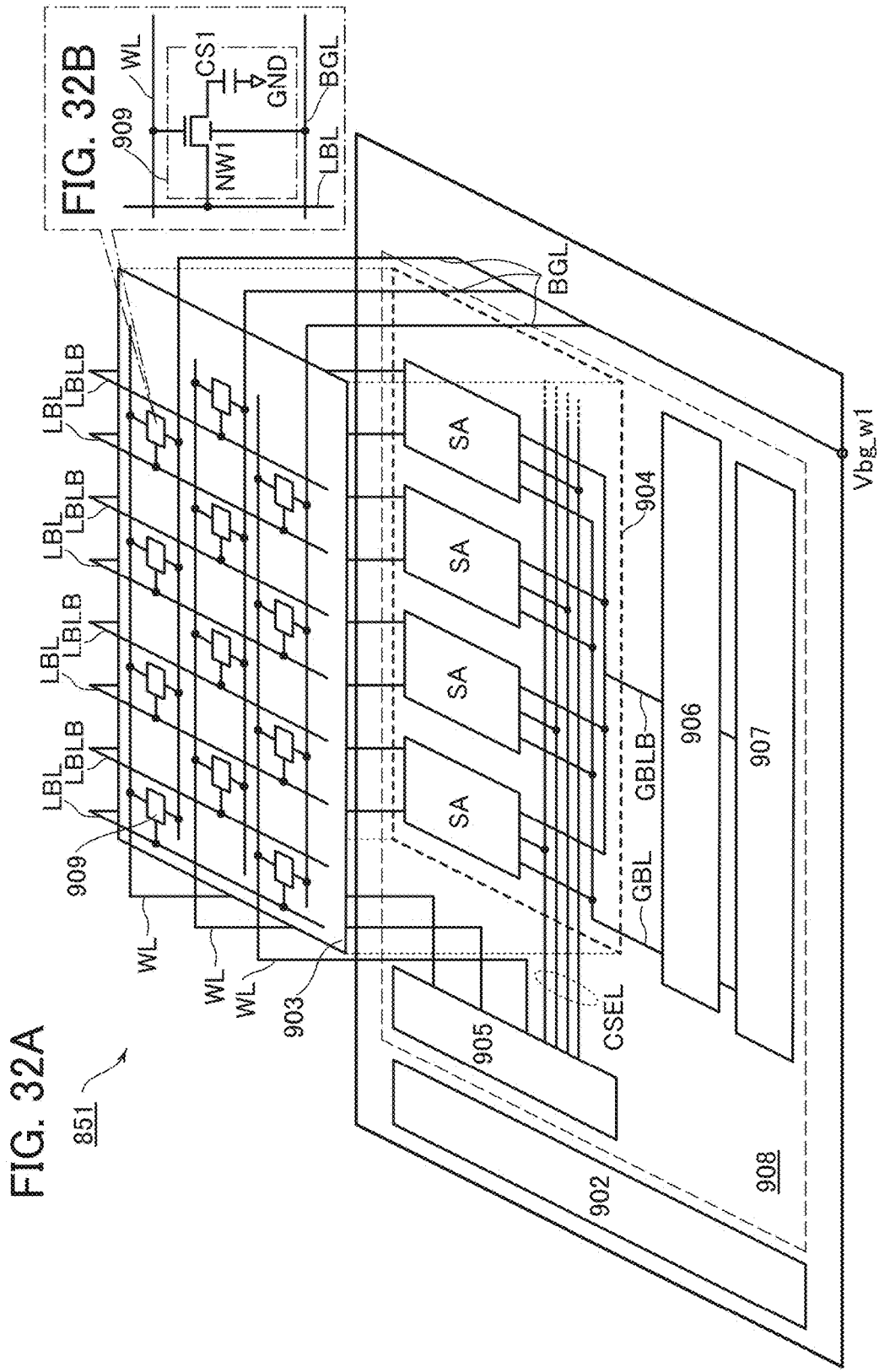
FIGS. 32A and 32B illustrate a configuration example of a frame memory.

FIG. 32A illustrates a configuration example of the frame memory 851. The frame memory 851 includes a control portion 902, a cell array 903, and a peripheral circuit 908. The periphery circuit 908 includes a sense amplifier circuit 904, a driver 905, a main amplifier 906, and an input/output circuit 907.

The control portion 902 has a function of controlling the frame memory 851. For example, the control portion 902 controls the driver 905, the main amplifier 906, and the input/output circuit 907.

The driver 905 is electrically connected to a plurality of wirings WL and CSEL. The driver 905 generates signals output to the plurality of wirings WL and CSEL.

The memory cell array 903 includes a plurality of memory cells 909. The memory cells 909 are electrically connected to wirings WL, LBL (or LBLB), and BGL. The wiring WL is a word line. The wirings LBL and LBLB are local bit lines. Although a folded-bit-line method is employed for the configuration of the cell array 903 in the example of FIG. 32A, an open-bit-line method can also be employed.

FIG. 32B illustrates a configuration example of the memory cell 909. The memory cell 909 includes a transistor NW1 and a capacitor CS1. The memory cell 909 has a circuit configuration similar to that of a memory cell for a dynamic random access memory (DRAM). The transistor NW1 in this example is a transistor having a back gate. The back gate of the transistor NW1 is electrically connected to a wiring BGL. A voltage $V_{bg\_w1}$ is input to the wiring BGL.

The transistor NW1 is a transistor using an oxide semiconductor, which is one type of a metal oxide, in a semiconductor layer where a channel is formed (also referred to as an OS transistor). The use of the OS transistor in the memory cell 909 can inhibit leakage of charge from the capacitor CS1 owing to the extremely low off-state current of the OS transistor; thus, the frequency of refresh operation of the frame memory 851 can be reduced. The frame memory 851 can retain image data for a long time even when power supply is stopped. Moreover, by setting the voltage $V_{bg\_w1}$ to a negative voltage, the threshold voltage of the transistor NW1 can be shifted to the positive potential side and thus the retention time of the memory cell 909 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

The transistors NW1 in the plurality of memory cells 909 included in the cell array 903 are OS transistors; thus, Si transistors formed over a silicon wafer can be used as transistors in other circuits, for example. Accordingly, the cell array 903 can be stacked over the sense amplifier circuit 904. Thus, the circuit area of the frame memory 851 can be reduced, which leads to miniaturization of the controller IC 815.

The cell array 903 is stacked over the sense amplifier circuit 904. The sense amplifier circuit 904 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 904, one wiring GBL is provided for four wirings LBL, and one wiring GBLB is provided for four wirings LBLB. However, the configuration of the sense amplifier circuit 904 is not limited to the configuration example of FIG. 32A.

The main amplifier 906 is connected to the sense amplifier circuit 904 and the input/output circuit 907. The main amplifier 906 has a function of amplifying the potential difference between the wirings GBL and GBLB. The main amplifier 906 is not necessarily provided.

The input/output circuit 907 has a function of outputting a potential corresponding to write data to the wirings GBL and GBLB or the main amplifier 906 and a function of outputting the potentials of the wirings GBL and GBLB or an output potential of the main amplifier 906 to the outside as read data. The sense amplifier SA from which data is read and the sense amplifier SA to which data is written can be selected using the signal of the wiring CSEL. Therefore, there is no need to provide a selection circuit such as a multiplexer in the input/output circuit 907. Thus, the input/output circuit 907 can have a simple circuit configuration and occupy a small area.

<Register 875>

Figure 33:
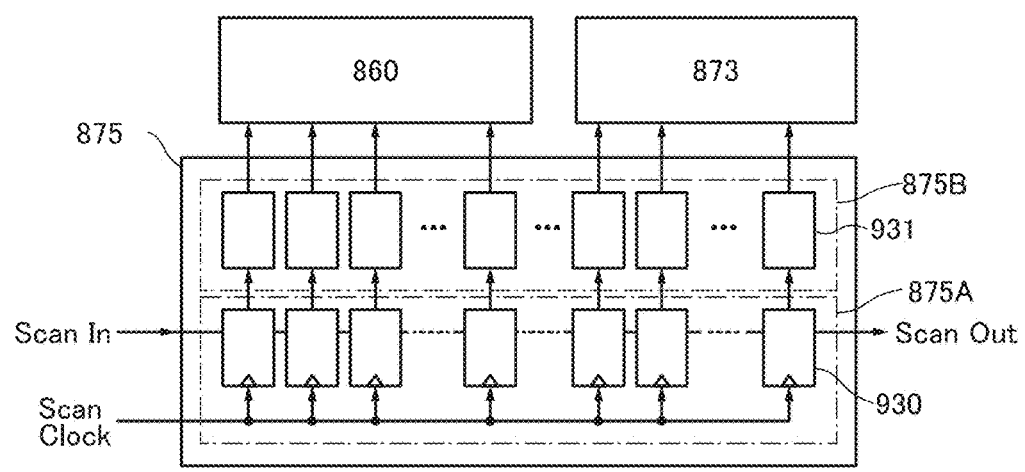
FIG. 33 is a block diagram illustrating a configuration example of a register.

FIG. 33 is a block diagram illustrating a configuration example of the register 875. The register 875 includes a scan chain register portion 875A and a register portion 875B. The scan chain register portion 875A includes a plurality of registers 930. The scan chain register is formed by the plurality of registers 930. The register portion 875B includes a plurality of registers 931.

The register 930 is a nonvolatile register which does not lose data even when power supply is stopped. Here, the register 930 is provided with a retention circuit including an OS transistor to be nonvolatile.

The other register 931 is a volatile register. There is no particular limitation on the circuit configuration of the register 931, and a latch circuit, a flip-flop circuit, or the like is used as long as data can be stored. The image processing portion 860 and the timing controller 873 access the register portion 875B and take data from the corresponding registers 931. Alternatively, the processing contents of the image processing portion 860 and the timing controller 873 are controlled by data supplied from the register portion 875B.

To update data stored in the register 875, first, data in the scan chain register portion 875A is changed. After the data in the registers 930 of the scan chain register portion 875A is rewritten, the data is loaded into the registers 931 of the register portion 875B at the same time.

Accordingly, the image processing portion 860, the timing controller 873, and the like can perform various kinds of processing using the data collectively updated. The operation of the controller IC 815 can be stable because simultaneity can be maintained in updating data. By providing the scan chain register portion 875A and the register portion 875B, data in the scan chain register portion 875A can be updated even during the operation of the image processing portion 860 and the timing controller 873.

At the time of the power gating of the controller IC 815, power supply is stopped after data is stored (saved) in the retention circuit of the register 930. After the power supply is resumed, normal operation is restarted after data in the register 930 is restored (loaded) in the register 931. Note that in the case where the data stored in the register 930 and the data stored in the register 931 do not match each other, it is preferable to save the data of the register 931 in the register 930 and then store the data in the retention circuit of the register 930. The data in the register 930 and that in the register 931 do not match each other while updated data is being inserted in the scan chain register portion 875A, for example.

Figure 34:
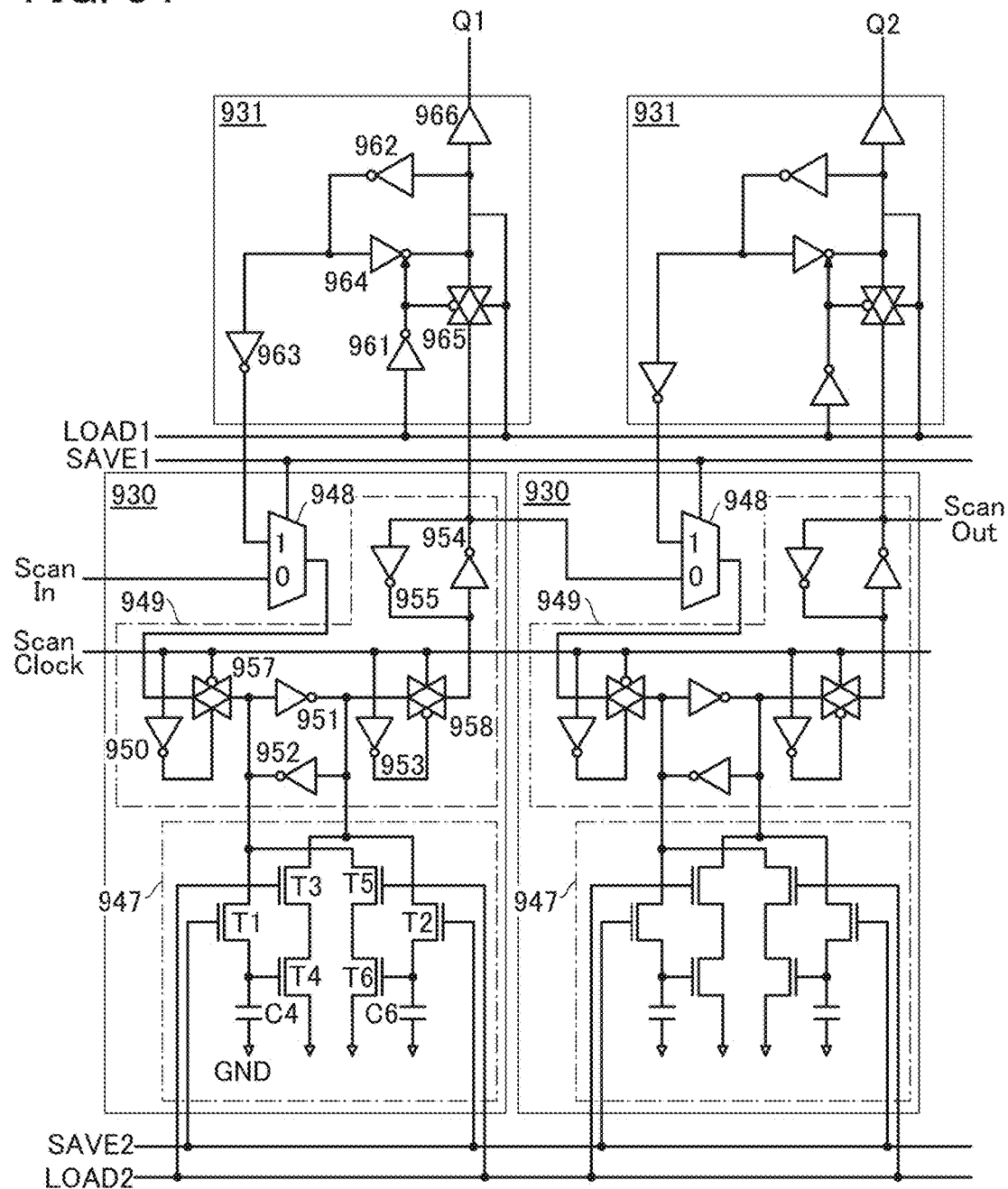
FIG. 34 is a circuit diagram illustrating a configuration example of a register.

FIG. 34 illustrates a circuit configuration example of the registers 930 and 931. FIG. 34 illustrates two registers 930 of the scan chain register portion 875A and corresponding two registers 931. A signal Scan In is input to the register 930, and the register 930 outputs a signal Scan Out.

The registers 930 each include a retention circuit 947, a selector 948, and a flip-flop circuit 949. The selector 948 and the flip-flop circuit 949 form a scan flip-flop circuit. A signal SAVE1 is input to the selector 948.

A signal SAVE2 and a signal LOAD2 are input to the retention circuit 947. The retention circuit 947 includes a transistor T1, a transistor T2, a transistor T3, a transistor T4, a transistor T5, a transistor T6, a capacitor C4, and a capacitor C6. The transistor T1 and the transistor T2 are OS transistors. The transistor T1 and the transistor T2 may each be an OS transistor having a back gate, as with the transistor NW1 of the memory cell 909 (see FIG. 32B).

A 3-transistor gain cell is formed by the transistor T1, the transistor T3, the transistor T4, and the capacitor C4. In a similar manner, a 3-transistor gain cell is formed by the transistor T2, the transistor T5, the transistor T6, and the capacitor C6. The two gain cells store complementary data retained in the flip-flop circuit 949. Since the transistor T1 and the transistor T2 are OS transistors, the retention circuit 947 can retain data for a long time even when power supply is stopped. In the register 930, the transistors other than the transistor T1 and the transistor T2 may be formed using Si transistors.

The retention circuit 947 stores complementary data retained in the flip-flop circuit 949 in response to the signal SAVE2 and loads the retained data in the flip-flop circuit 949 in response to the signal LOAD2.

An output terminal of the selector 948 is electrically connected to an input terminal of the flip-flop circuit 949, and an input terminal of the register 931 is electrically connected to a data output terminal. The flip-flop circuit 949 includes an inverter 950, an inverter 951, an inverter 952, an inverter 953, an inverter 954, an inverter 955, an analog switch 957, and an analog switch 958. The on/off state of each of the analog switch 957 and the analog switch 958 is controlled by a scan clock signal. The flip-flop circuit 949 is not limited to the circuit configuration in FIG. 34 and a variety of flip-flop circuits 949 can be employed.

An output terminal of the register 931 is electrically connected to one of two input terminals of the selector 948, and an output terminal of the flip-flop circuit 949 in the previous stage is electrically connected to the other input terminal of the selector 948. Note that data is input from the outside of the register 875 to the input terminal of the selector 948 in the previous stage of the scan chain register portion 875A.

The register 931 includes an inverter 961, an inverter 962, an inverter 963, a clocked inverter 964, an analog switch 965, and a buffer 966. The register 931 loads the data of the flip-flop circuit 949 on the basis of a signal LOAD1. The transistors of the register 931 may be formed using Si transistors.

Operation Examples

Operation examples of the controller IC 815 and the register 875 of the display device 800 before shipment, at boot-up of an electronic device including the display device 800, and at normal operation will be described separately.

<Before Shipment>

Parameters relating to the specifications and the like of the display device 800 are stored in the register 875 before shipment. These parameters include, for example, the number of pixels, the number of touch sensors, and parameters used to generate waveforms of the variety of timing signals in the timing controller 873. In the case where the image processing portion 860 includes the correction circuit 864, the correction data therefrom is also stored as a parameter in the register 875. A dedicated ROM may be provided and the parameters may be stored in the ROM other than the register 875.

<At Boot-Up>

At boot-up of the electronic device including the display device 800, the parameters set by a user or the like which are transmitted from the host 840 are stored in the register 875. These parameters include, for example, luminance and tones of display, the sensitivity of a touch sensor, energy saving settings (time taken to make display dark or turn off display), and a curve or a table for gamma correction. Note that in storing the parameters in the register 875, a scan clock signal and data corresponding to the parameters in synchronization with the scan clock signal are transmitted from the controller 854 to the register 875.

<Normal Operation>

Normal operation can be classified into a state of displaying a moving image or the like, a state capable of performing IDS driving while a still image is displayed, a state of displaying no image, and the like. The image processing portion 860, the timing controller 873, and the like are operating in the state of displaying a moving image or the like; however, the image processing portion 860 and the like are not influenced because only the data of the register 875 in the scan chain register portion 875A is changed. After the data of the scan chain register portion 875A is changed, the data of the scan chain register portion 875A is loaded in the register portion 875B at the same time, so that change of the data of the register 875 is completed. The operation of the image processing portion 860 and the like is switched to the operation corresponding to the data.

In the state capable of performing IDS driving while a still image is displayed, the power gating of the register 875 can be performed as in the other circuits in the region 890. In that case, the complementary data retained in the flip-flop circuit 949 is stored in the retention circuit 947 in response to the signal SAVE2 before the power gating in the register 930 included in the scan chain register portion 875A.

Before the power gating is stopped, the data retained in the retention circuit 947 is loaded in the flip-flop circuit 949 in response to the signal LOAD2 and the data in the flip-flop circuit 949 is loaded in the register 931 in response to the signal LOAD1. In this manner, the data of the register 875 becomes effective in the same state as before the power gating. Note that even when the register 875 is in a state of power gating, the parameter of the register 875 can be changed by stopping the power gating in the case where change of the parameter is requested by the host 840.

In the state of displaying no image, for example, the power gating of the circuits (including the register 875) in the region 890 can be performed. In that case, the operation of the host 840 might also be stopped. When the power gating is stopped, an image (still image) in a state before the power gating can be displayed without waiting for the resumption of the operation of the host 840 because the frame memory 851 and the register 875 are nonvolatile.

For example, in the case where the display device 800 is employed for a display portion of a foldable information terminal, when the information terminal is folded and a display surface of the display device 800 is detected to be unused by a signal from the open/close sensor 844, the power gating of the sensor controller 853, the touch sensor controller 884, and the like can be performed in addition to the power gating of the circuits in the region 890.

When the information terminal is folded, the operation of the host 840 might be stopped depending on the standard of the host 840. Even when the information terminal is unfolded while the operation of the host 840 is stopped, the image data in the frame memory 851 can be displayed before image data, a variety of control signals, and the like are transmitted from the host 840 because the frame memory 851 and the register 875 are nonvolatile.

When the register 875 includes the scan chain register portion 875A and the register portion 875B and the data of the scan chain register portion 875A is changed as described above, the data can be changed smoothly without influencing the image processing portion 860, the timing controller 873, and the like. Each register 930 in the scan chain register portion 875A includes the retention circuit 947, which enables smooth start and stop of power gating.

At least part of this embodiment can be implemented in combination with any of the other embodiments and examples described in this specification as appropriate.

Embodiment 7

In this embodiment, a display module and electronic devices, each of which includes the display device of one embodiment of the present invention, will be described with reference to FIG. 35, FIGS. 36A to 36E, and FIGS. 37A to 37G.

<7-1. Display Module>

Figure 35:
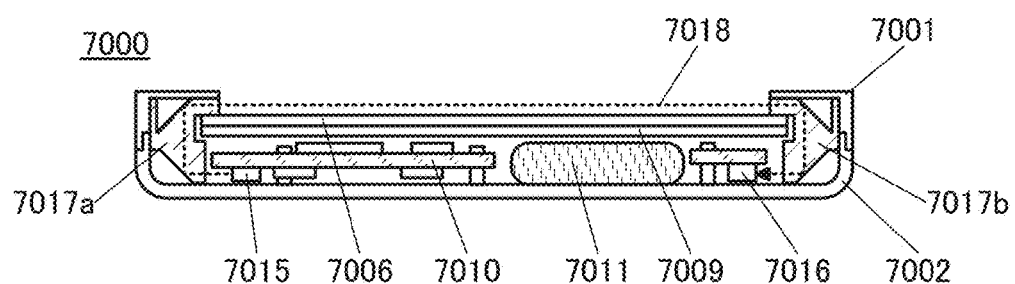
FIG. 35 illustrates a display module.

FIG. 35 is a schematic cross-sectional view of a display module 7000 including an optical touch sensor. In the display module 7000 illustrated in FIG. 35, a display panel 7006 connected to an FPC, a backlight (not illustrated), a frame 7009, a printed circuit board 7010, and a battery 7011 are provided between an upper cover 7001 and a lower cover 7002.

The display device of one embodiment of the present invention can be used for the display panel 7006, for example.

The shapes and sizes of the upper cover 7001 and the lower cover 7002 can be changed as appropriate depending on the size of the display panel 7006.

Although not illustrated, the backlight includes a light source. Note that the light source can be provided over the backlight; alternatively, a structure in which the light source is provided at an end portion of the backlight and a light diffusion plate is also included can be employed. Note that the backlight need not be provided in the case where a self-luminous light-emitting element such as an organic EL element is used or in the case where a reflective panel or the like is employed.

The frame 7009 protects the display panel 7006 and also functions as an electromagnetic shield for blocking electromagnetic waves generated by the operation of the printed circuit board 7010. The frame 7009 may function as a radiator plate.

The printed circuit board 7010 is provided with a power supply circuit and a signal processing circuit for outputting a video signal and a clock signal. As a power source for supplying power to the power supply circuit, an external commercial power source or a power source using the battery 7011 provided separately may be used. The battery 7011 can be omitted in the case of using a commercial power source.

The display module 7000 may be additionally provided with a member such as a polarizing plate, a retardation plate, or a prism sheet.

The display module 7000 includes a light-emitting portion 7015 and a light-receiving portion 7016 provided on the printed circuit board 7010. A pair of light guide portions (a light guide portion 7017a and a light guide portion 7017b) is provided in a region surrounded by the upper cover 7001 and the lower cover 7002.

For example, a plastic or the like can be used for the upper cover 7001 and the lower cover 7002. The upper cover 7001 and the lower cover 7002 can each be thin (e.g., more than or equal to 0.5 mm and less than or equal to 5 mm). In that case, the display module 7000 can be significantly lightweight. In addition, the upper cover 7001 and the lower cover 7002 can be manufactured with a small amount of material, and therefore, manufacturing cost can be reduced.

The display panel 7006 overlaps with the printed circuit board 7010 and the battery 7011 with the frame 7009 located therebetween. The display panel 7006 and the frame 7009 are fixed to the light guide portion 7017a and the light guide portion 7017b.

Light 7018 emitted from the light-emitting portion 7015 travels over the display panel 7006 through the light guide portion 7017a and reaches the light-receiving portion 7016 through the light guide portion 7017b. For example, blocking of the light 7018 by a sensing target such as a finger or a stylus can be detected as touch operation.

A plurality of light-emitting portions 7015 are provided along two adjacent sides of the display panel 7006, for example. A plurality of light-receiving portions 7016 are provided so as to face the light-emitting portions 7015. Accordingly, information about the position of touch operation can be obtained.

As the light-emitting portion 7015, a light source such as an LED element can be used. It is particularly preferable to use a light source that emits infrared light, which is not visually recognized by users and is harmless to users, as the light-emitting portion 7015.

As the light-receiving portion 7016, a photoelectric element that receives light emitted by the light-emitting portion 7015 and converts it into an electrical signal can be used. A photodiode that can receive infrared light can be favorably used.

For the light guide portions 7017a and 7017b, members that transmit at least the light 7018 can be used. With the use of the light guide portions 7017a and 7017b, the light-emitting portion 7015 and the light-receiving portion 7016 can be placed under the display panel 7006, and a malfunction of the touch sensor due to external light reaching the light-receiving portion 7016 can be prevented. It is particularly preferable to use a resin which absorbs visible light and transmits infrared light. This is more effective in preventing the malfunction of the touch sensor.

Although FIG. 35 illustrates the display module including the optical touch sensor, a resistive touch panel or a capacitive touch panel may be provided so as to overlap with the display panel 7006, as appropriate. Alternatively, a counter substrate (sealing substrate) of the display panel 7006 can have a touch panel function. Further alternatively, an optical sensor may be provided in each pixel of the display panel 7006 to form an optical touch panel.

<7-2. Electronic Device 1>

Next, FIGS. 36A to 36E illustrate examples of electronic devices.

Figure 36A:
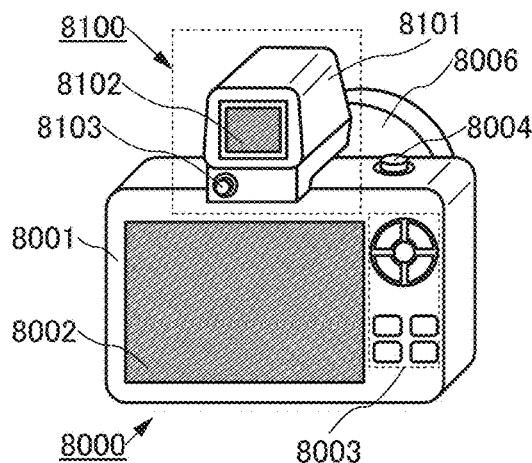
FIGS. 36A to 36E illustrate electronic devices.

FIG. 36A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 36A, the housing 8001 of the camera 8000 may include a finder having a display device.

Figure 36B:
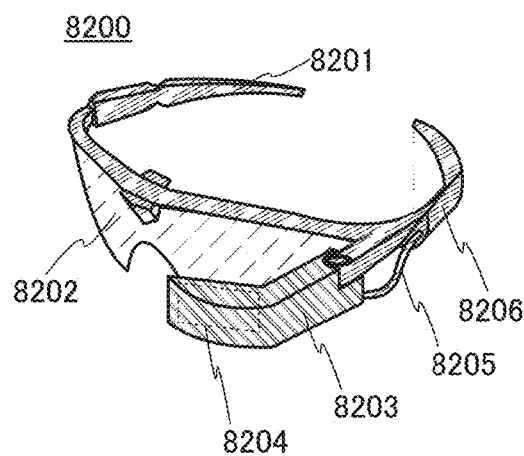

FIG. 36B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 36C:
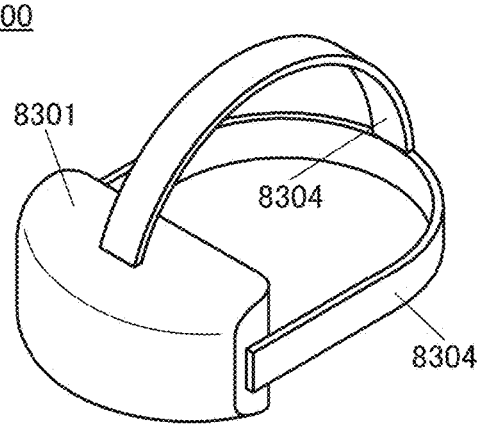
Figure 36D:
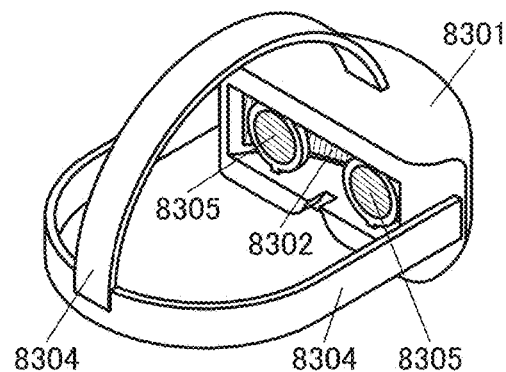
Figure 36E:
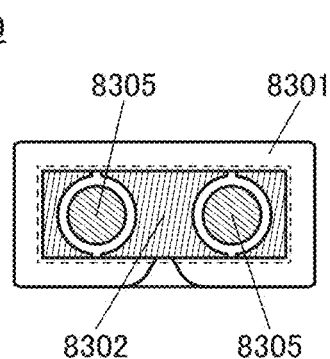
Figure 37A:
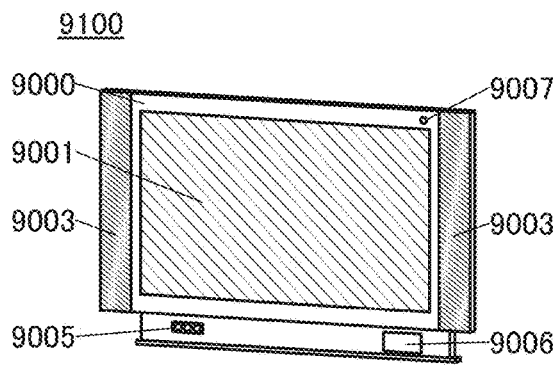
FIGS. 37A to 37G illustrate electronic devices.
Figure 37D:
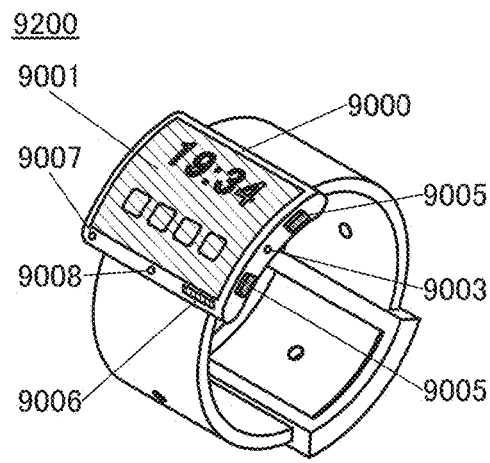
Figure 37B:
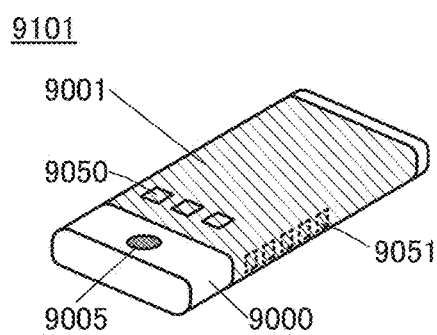
Figure 37E:
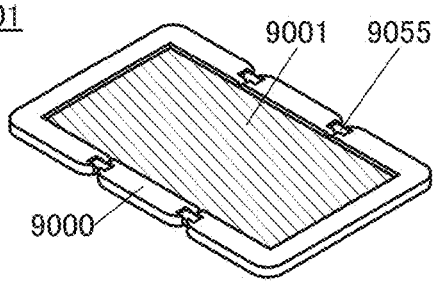
Figure 37C:
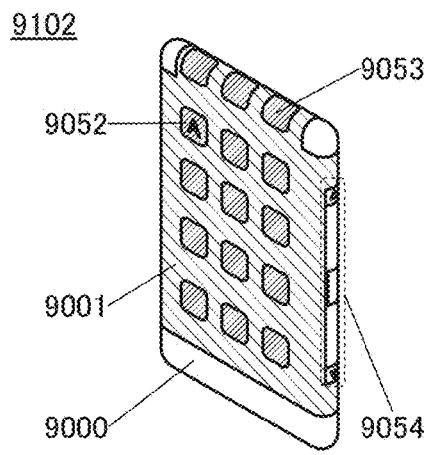
Figure 37F:
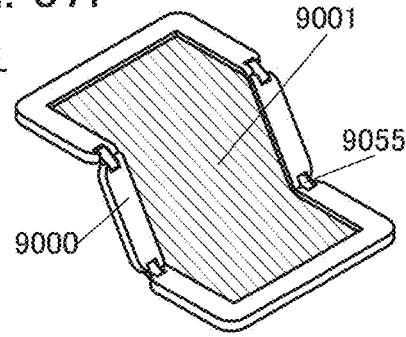
Figure 37G:
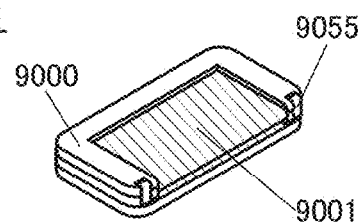

FIGS. 36C to 36E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is suitable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device of one embodiment of the present invention has an extremely high resolution; thus, even when an image is magnified using the lenses 8305 as illustrated in FIG. 36E, the user does not perceive pixels, and thus a more realistic image can be displayed.

<7-3. Electronic Device 2>

Next, FIGS. 37A to 37G illustrate examples of electronic devices that are different from those illustrated in FIGS. 36A to 36E.

The electronic devices illustrated in FIGS. 37A to 37G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 37A to 37G have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 37A to 37G are not limited thereto, and the electronic devices can have a variety of functions. Although not illustrated in FIGS. 37A to 37G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

Next, a broadcasting system including any of the electronic devices will be described. In particular, a system that transmits a broadcast signal will be described here.

<7-4. Broadcasting System>

Figure 38:
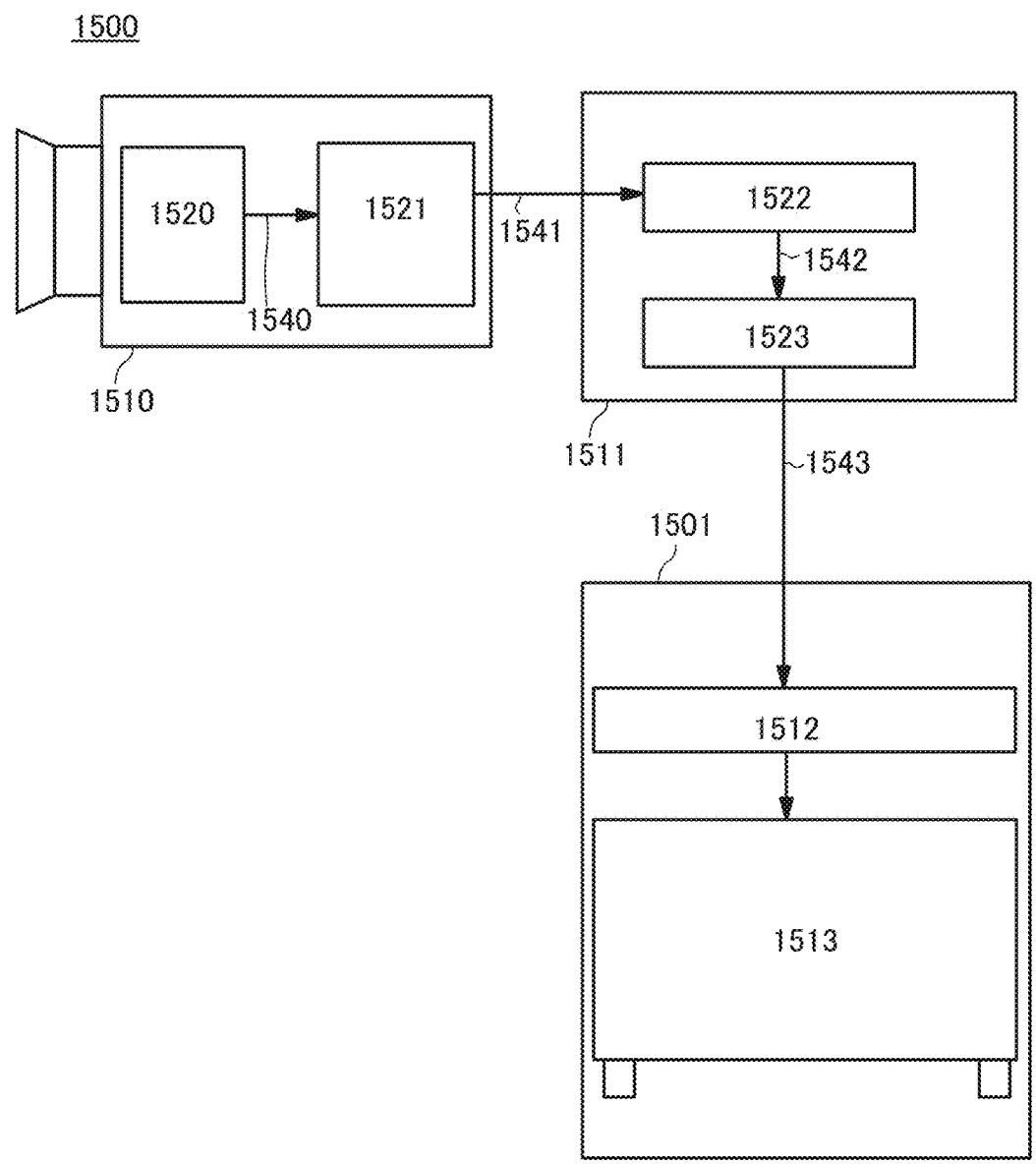
FIG. 38 is a block diagram illustrating a structure example of a broadcasting system.

FIG. 38 is a block diagram that schematically illustrates a structure example of the broadcasting system. The broadcasting system 1500 includes a camera 1510, a transmitter 1511, and an electronic device system 1501. The electronic device system 1501 includes a receiver 1512 and a display device 1513. The camera 1510 includes an image sensor 1520 and an image processor 1521. The transmitter 1511 includes an encoder 1522 and a modulator 1523.

The receiver 1512 and the display device 1513 consist of an antenna, a demodulator, a decoder, a logic circuit, an image processor, and a display unit included in the electronic device system 1501. Specifically, for example, the receiver 1512 includes the antenna, the demodulator, the decoder, and the logic circuit, whereas the display device 1513 includes the image processor and the display unit. The decoder and the logic circuit may be included not in the receiver 1512 but in the display device 1513.

When the camera 1510 is capable of capturing an 8K video, the image sensor 1520 has an adequate number of pixels for capturing a color image with 8K resolution. For example, when one red (R) subpixel, two green (G) subpixels, and one blue (B) subpixel are included in one pixel, the image sensor 1520 with an 8K camera needs at least 7680×4320×4 [R, G+G, and B] pixels, the image sensor 1520 with a 4K camera needs at least 3840×2160×4 pixels, and the image sensor 1520 with a 2K camera needs at least 1920×1080×4 pixels.

The image sensor 1520 generates Raw data 1540 which is unprocessed. The image processor 1521 performs image processing (such as noise removal or interpolation processing) on the Raw data 1540 and generates video data 1541. The video data 1541 is output to the transmitter 1511.

The transmitter 1511 processes the video data 1541 and generates a broadcast signal (carrier wave) 1543 that accords with a broadcast band. The encoder 1522 processes the video data 1541 and generates encoded data 1542. The encoder 1522 performs processing such as encoding of the video data 1541, addition of broadcast control data (e.g., authentication data) to the video data 1541, encryption, or scrambling (data rearrangement for spread spectrum).

The modulator 1523 performs IQ modulation (orthogonal amplitude modulation) on the encoded data 1542 to generate and output the broadcast signal 1543. The broadcast signal 1543 is a composite signal including data on components of I (identical phase) and Q (quadrature phase). A TV broadcast station takes a role in obtaining the video data 1541 and supplying the broadcast signal 1543.

The receiver 1512 included in the electronic device system 1501 receives the broadcast signal 1543.

Figure 39:
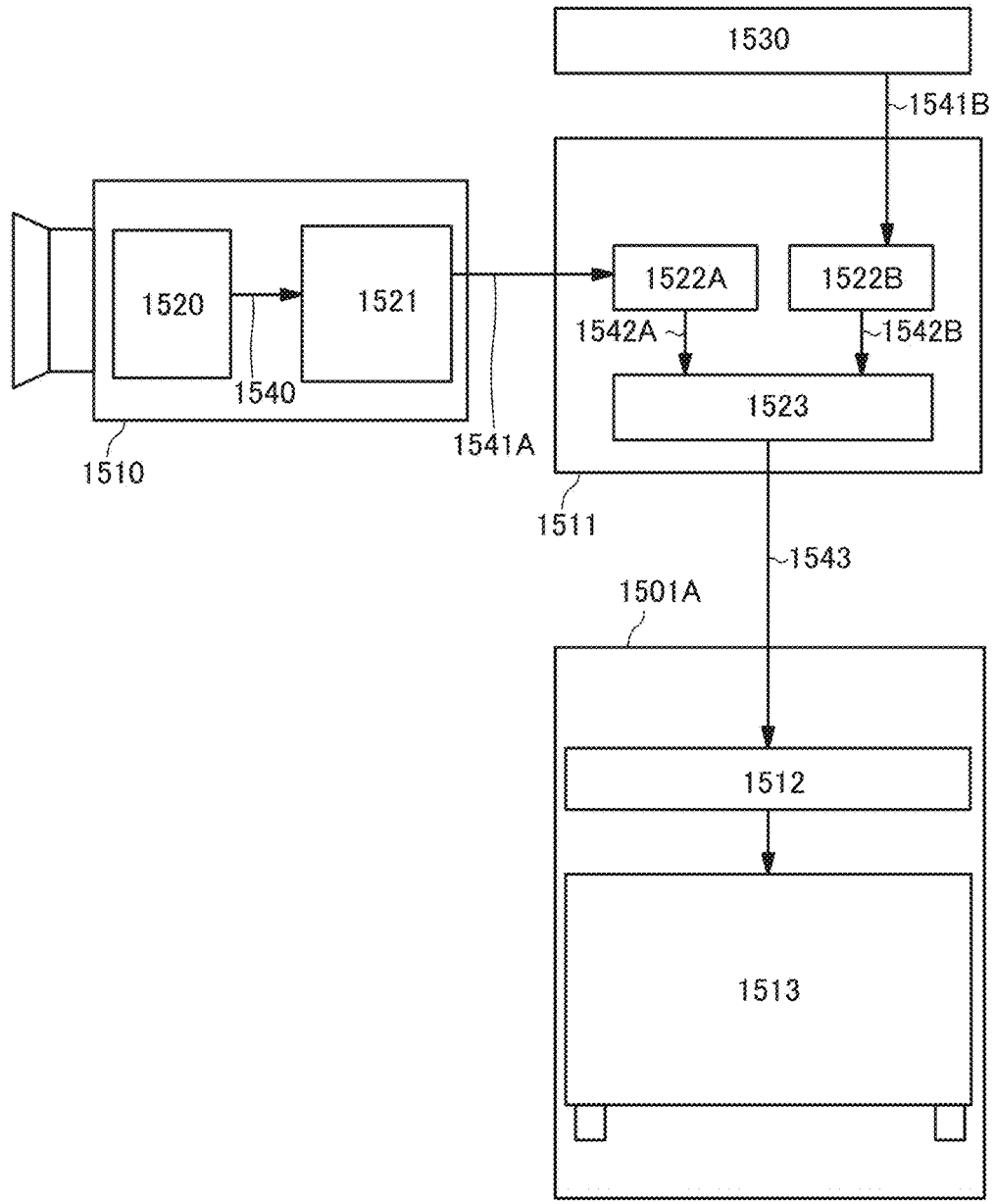
FIG. 39 is a block diagram illustrating a structure example of a broadcasting system.

FIG. 39 illustrates a broadcasting system 1500A including another electronic device system.

The broadcasting system 1500A includes the camera 1510, the transmitter 1511, the electronic device system 1501A, and an image generation device 1530. The electronic device system 1501A includes the receiver 1512 and the display device 1513. The camera 1510 includes the image sensor 1520 and the image processor 1521. The transmitter 1511 includes an encoder 1522A, an encoder 1522B, and the modulator 1523.

The receiver 1512 and the display device 1513 consist of an antenna, a demodulator, a decoder, an image processor, and a display unit included in the electronic device system 1501A. Specifically, for example, the receiver 1512 includes the antenna, the demodulator, and the decoder, whereas the display device 1513 includes the image processor and the display unit. The decoder may be included not in the receiver 1512 but in the display device 1513.

For the camera 1510, and the image sensor 1520 and the image processor 1521 included in the camera 1510, refer to the above descriptions. The image processor 1521 generates video data 1541A. The video data 1541A is output to the transmitter 1511.

The image generation device 1530 generates image data such as text, a figure, or a pattern added to the image data generated in the image processor 1521. The image data such as text, a figure, or a pattern is transmitted as video data 1541B to the transmitter 1511.

The transmitter 1511 processes the video data 1541A and the video data 1541B and generates the broadcast signal (carrier wave) 1543 that accords with a broadcast band. The encoder 1522A processes the video data 1541A and generates encoded data 1542A. The encoder 1522B processes the video data 1541B and generates encoded data 1542B. The encoder 1522A and the encoder 1522B perform processing such as encoding of the video data 1541A and the video data 1541B, respectively, addition of broadcast control data (e.g., authentication data) to the video data 1541A and the video data 1541B, encryption, or scrambling (data rearrangement for spread spectrum).

The broadcasting system 1500A may have a configuration in which one encoder is used, as in the broadcasting system 1500 illustrated in FIG. 38, for processing the video data 1541A and the video data 1541B.

The encoded data 1542A and the encoded data 1542B are transmitted to the modulator 1523. The modulator 1523 generates and outputs the broadcast signal 1543 by performing IQ modulation on the encoded data 1542A and the encoded data 1542B. The broadcast signal 1543 is a composite signal that has an I component and a Q component. A TV broadcast station takes a role in obtaining the video data 1541 and supplying the broadcast signal 1543.

The broadcast signal 1543 is received by the receiver 1512 included in the electronic device system 1501A.

Figure 40:
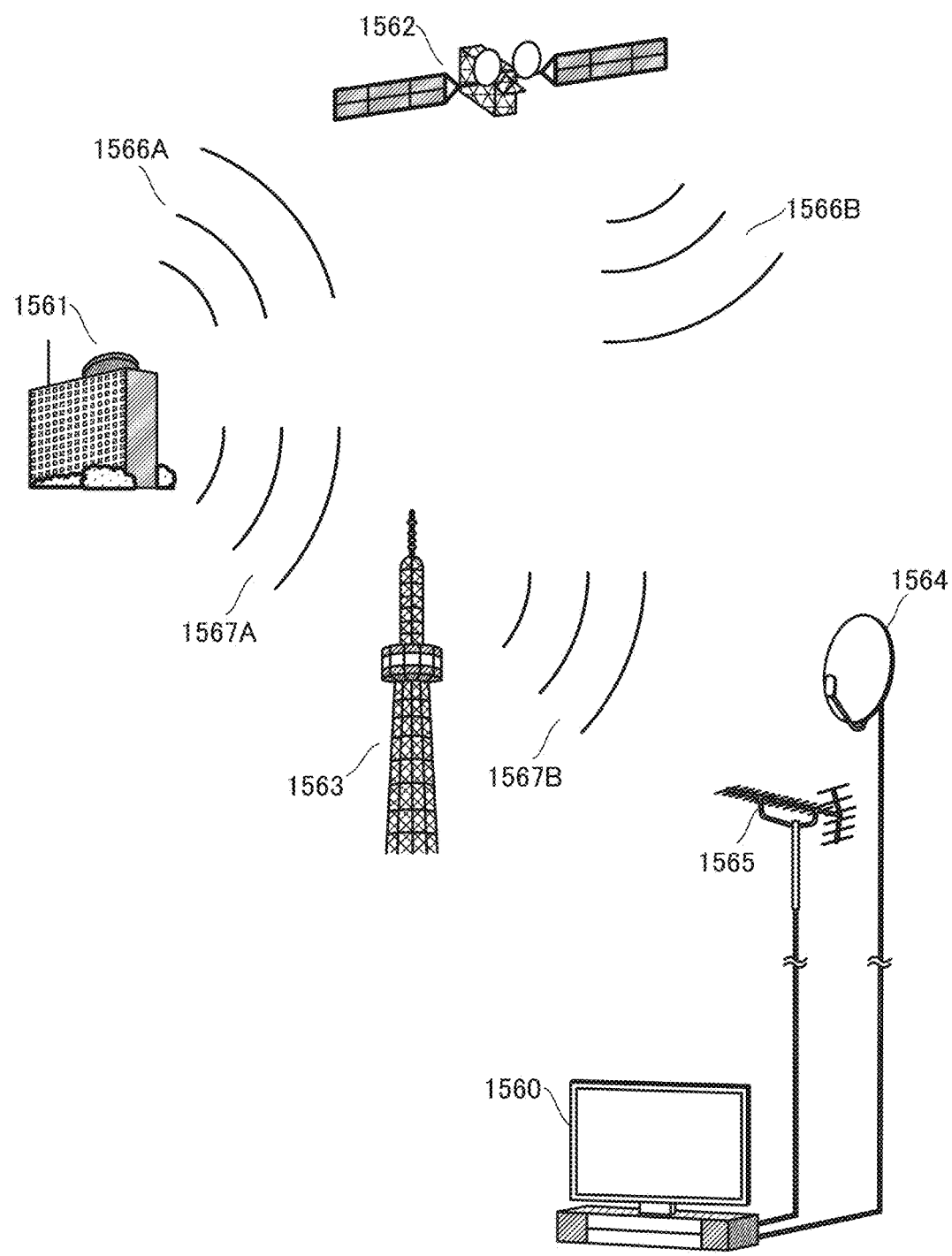
FIG. 40 is a schematic diagram illustrating data transmission in a broadcasting system.

FIG. 40 schematically illustrates data transmission in the broadcasting system. FIG. 40 illustrates a path in which a radio wave (a broadcast signal) transmitted from a broadcast station 1561 is delivered to a television receiver (TV) 1560 of every household. The TV 1560 is provided with the receiver 1512 and the display device 1513. As examples of an artificial satellite 1562, a communication satellite (CS) and a broadcast satellite (BS) can be given. As examples of an antenna 1564, a BS/110° CS antenna and a CS antenna can be given. Examples of the antenna 1565 include an ultra-high frequency (UHF) antenna.

Radio waves 1566A and 1566B are broadcast signals for a satellite broadcast. The artificial satellite 1562 transmits the radio wave 1566B toward the ground when receiving the radio wave 1566A. The antenna 1564 of every household receives the radio wave 1566B, and a satellite TV broadcast can be watched on the TV 1560. Alternatively, the radio wave 1566B is received by an antenna of another broadcast station, and a receiver in the broadcast station processes the radio wave 1566B into a signal that can be transmitted to an optical cable. The broadcast station transmits the broadcast signal to an input portion of the TV 1560 of every household using an optical cable network. Radio waves 1567A and 1567B are broadcast signals for a terrestrial broadcast. A radio wave tower 1563 amplifies the received radio wave 1567A and transmits it as the radio wave 1567B. A terrestrial TV broadcast can be watched on the TV 1560 of every household when the antenna 1565 receives the radio wave 1567B.

A video distribution system of this embodiment is not limited to a system for a TV broadcast. Video data to be distributed may be either moving image data or still image data.

Figure 41A:
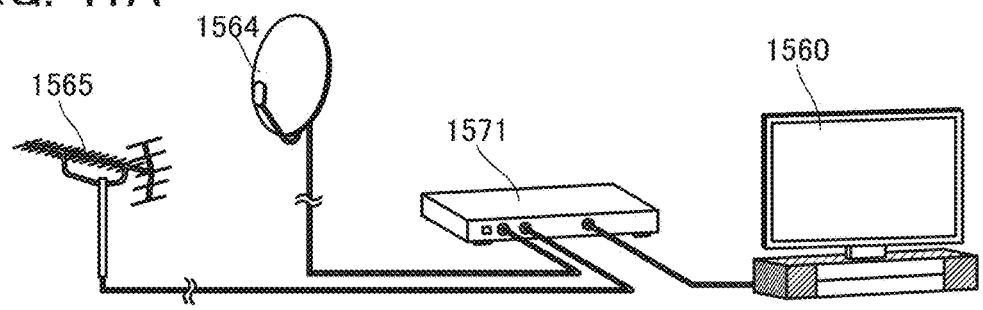
FIGS. 41A to 41D each illustrate a structure example of a receiver.
Figure 41B:
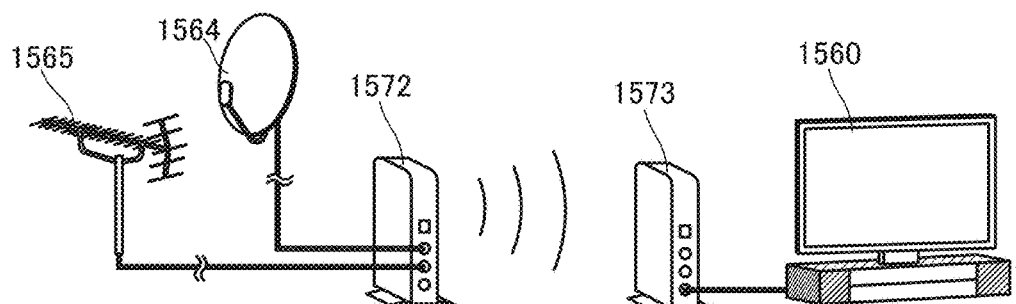
Figure 41C:
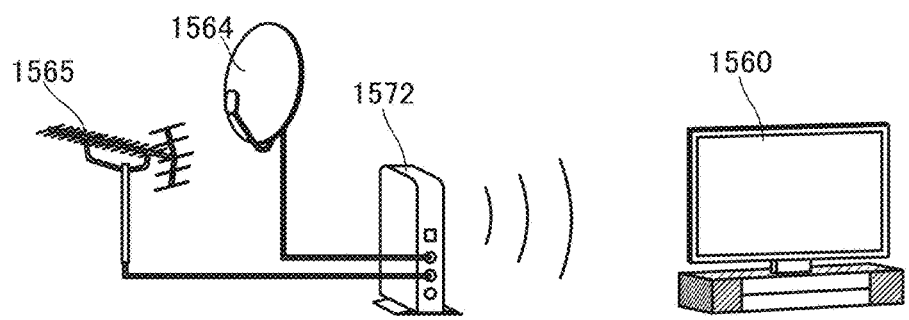
Figure 41D:
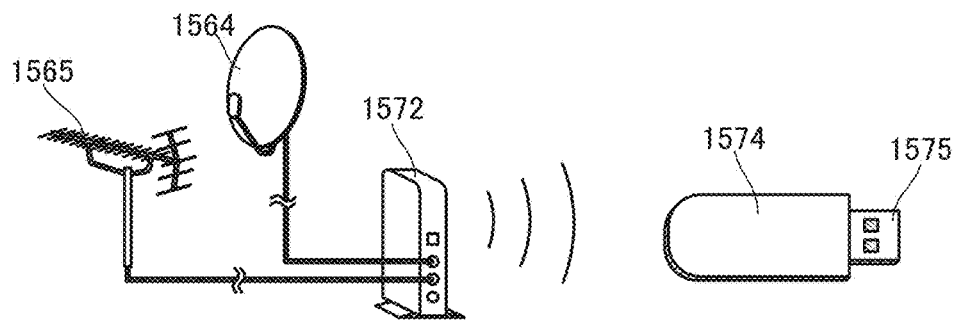

FIGS. 41A to 41D illustrate structure examples of a receiver. The TV 1560 can receive a broadcast signal with a receiver and perform display. FIG. 41A illustrates a case where a receiver 1571 is provided outside the TV 1560. FIG. 41B illustrates another case where the antennas 1564 and 1565 and the TV 1560 perform data transmission/reception through wireless devices 1572 and 1573. In this case, the wireless device 1572 or 1573 functions as a receiver. The wireless device 1573 may be incorporated in the TV 1560 (see FIG. 41C).

The size of a receiver can be reduced so that it can be portable. A receiver 1574 illustrated in FIG. 41D includes a connector portion 1575. If a display device and an electronic device such as an information terminal (e.g., a personal computer, a smartphone, a mobile phone, or a tablet terminal) include a terminal capable of being connected to the connector portion 1575, they can be used to watch a satellite broadcast or a terrestrial broadcast.

A semiconductor device can be used for the encoder 1522 of the broadcasting system 1500 in FIG. 38. Alternatively, the encoder 1522 can be formed by combining a dedicated IC, a processor (e.g., GPU or CPU), and the like. Alternatively, the encoder 1522 can be integrated into one dedicated IC chip.

At least part of this embodiment can be implemented in combination with any of the other embodiments and examples described in this specification as appropriate.

Example 1

In this example, verification that the use of a transistor containing the metal oxide of one embodiment of the present invention allows a large display module with high resolution to operate was performed.

[8K Display]

Recommendation ITU-R BT.2020-2 is an international standard for 8K displays. In the standard, the horizontal resolution is 7680, the vertical resolution is 4320, the driving method is a progressive method, and the maximum frame rate is 120 Hz.

Figure 42A:
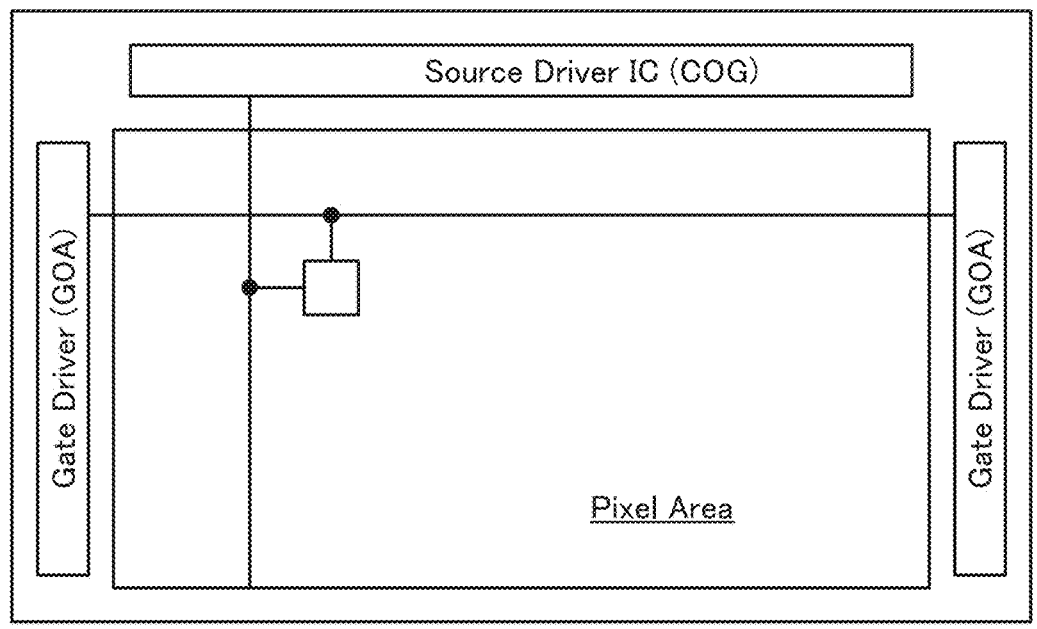
FIGS. 42A and 42B are block diagrams for Example.

FIG. 42A is a block diagram of an ideal display module. In the structure illustrated in FIG. 42A, one pixel portion (Pixel Area) formed over a substrate is provided with one source driver (Source Driver) and a pair of gate drivers (Gate Driver). The pair of gate drivers is preferably formed in the same process as a transistor included in a pixel and is preferably mounted on the display module by what is called a gate on array (GOA) method. An IC functioning as the source driver is preferably mounted on the substrate by a chip on glass (COG) method or the like.

A transistor used for driving such a display module with high resolution requires extremely high field-effect mobility. In some cases, particularly in a large display panel, image rewriting cannot be done in a frame period and driving cannot be performed with a transistor having low field-effect mobility that contains a semiconductor such as amorphous silicon.

Figure 42B:
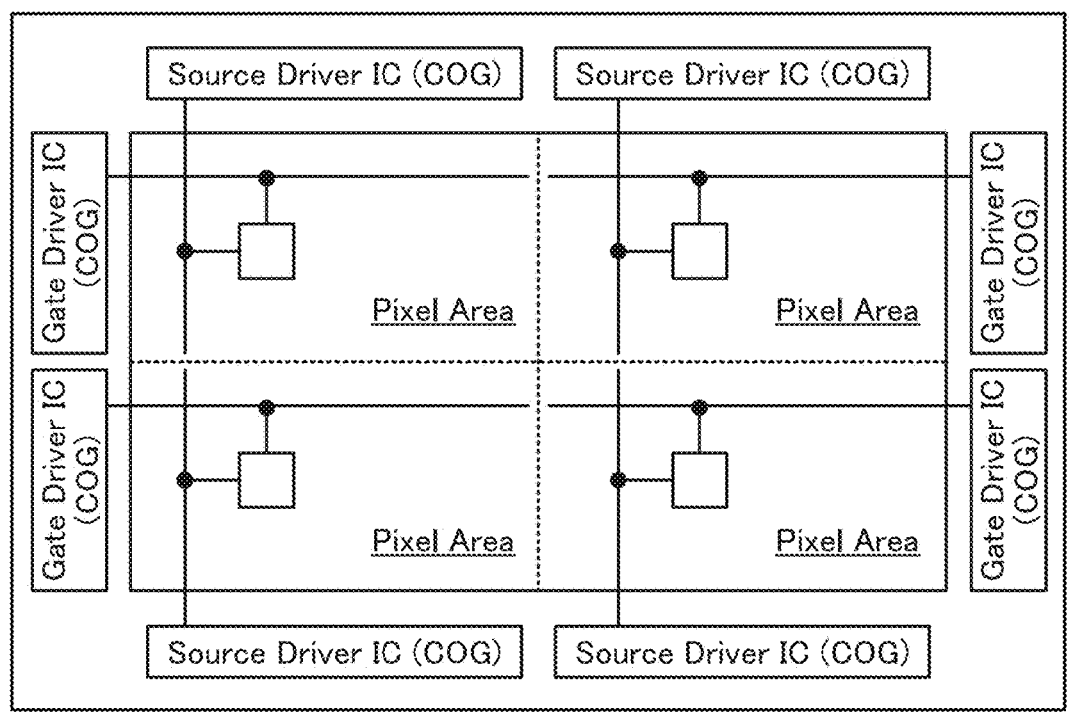

In the case of using a transistor containing amorphous silicon, a pixel portion can be divided into four parts and each part can be provided with a source driver and a gate driver as illustrated in FIG. 42B. With such a structure, rewriting of four pixel portions can be performed at the same time; thus, an image can be rewritten in a frame period even when a transistor with low field-effect mobility is used. In the case where it is difficult to mount the gate driver by a GOA method because the transistor has low field-effect mobility, an IC functioning as the gate driver is preferably mounted in a similar manner to the source driver, as illustrated in FIG. 42B.

However, the structure illustrated in FIG. 42B has, for example, the following problems: an increase in cost resulting from an increase in the number of the ICs such as the source driver and the gate driver and the amount of materials thereof; a decrease in the aperture ratio due to an increase in the number of wirings; an increase in a bezel area due to the implementation of the ICs; the necessity of a circuit for synchronizing the divided pixel portions; and a decrease in visibility because a boundary portion between the divided pixel portions is visually recognized. In addition, image processing or the like for dividing image data to be input into four parts is necessary; thus, a large-scale image processing circuit that can operate at high speed might be required.

[Examination Model]

Described here is the examination whether the use of a transistor containing the metal oxide of one embodiment of the present invention and the use of a transistor containing amorphous silicon, for comparison, allow a large 8K liquid crystal display module to operate.

The specifications of the liquid crystal display module used for the examination are as follows: the size of a pixel portion was 65 inches, the number of effective pixels was 7680×RGB (H)×4320 (V), the pixel size was 187.5 μm×187.5 μm, a VA mode was used as a liquid crystal mode, and the gray levels were 12 bits. The data voltage of a source driver IC was set from 3.5 V to 14.5 V, one horizontal period was set to 1.92 μs, and a dot inversion driving method was used. The clock frequency of a gate driver was set to 260.16 kHz, the voltage was set from −6.0 V to 22.0 V, and a common potential of a liquid crystal element was set to 9.0 V.

Note that one subpixel included one transistor and one capacitor. A transistor included in the pixel was a channel-etched single-gate transistor whose channel length was 4 μm and channel width was 8 μm. A transistor included in the gate driver was a channel-etched dual-gate transistor (having an S-channel structure) whose channel length was 4 μm and channel width was 4000 μm. The metal oxide (CAC-OS) of one embodiment of the present invention was used in a semiconductor layer of each of the transistors.

For comparison, the case where hydrogenated amorphous silicon (a-Si:H) was used in the semiconductor layer of each of the transistors was examined.

[Examination]

In the examination, the sum of the time until the potential of a gate line completely falls (gate fall time) and the time until the potential of a source line reaches 95% of the maximum input voltage (source line charge time) was estimated. The examination results are shown below.

TABLE 2

| | Gate fall time | Source line charge time (>95%) | Total | One horizontal period | Operation |
| --- | --- | --- | --- | --- | --- |
| a-Si:H | 2.25 μs | — | | 1.92 μs | Not operated |
| CAC-OS | 0.70 μs | 1.21 μs | 1.91 μs | | Operated |

In the case of using the CAC-OS, the sum of the gate fall time and the source line charge time was estimated to be 1.91 μs, which is shorter than one horizontal period 1.92 μs at the time of 120 Hz driving; this indicates that operation is possible. Accordingly, an integrated gate driver can be employed. In that case, the bezel width on the gate driver side is estimated to be 3.85 mm; thus, a display module with an extremely narrow bezel width can be fabricated.

In contrast, in the case of using hydrogenated amorphous silicon, the gate fall time exceeded one horizontal period; thus, the gate driver cannot be integrated. Note that the verification was performed on the assumption that loads on wirings such as the gate line and the source line were equal. However, in the case of using hydrogenated amorphous silicon, the size of the transistor provided in the pixel was large; thus, the load was larger than that in the case of using the CAC-OS.

Then, the relationship between the frame rate and the panel size (the size of the pixel portion) with which the gate driver can be integrated was determined for the case of using the CAC-OS and the case of using hydrogenated amorphous silicon.

Figure 43:
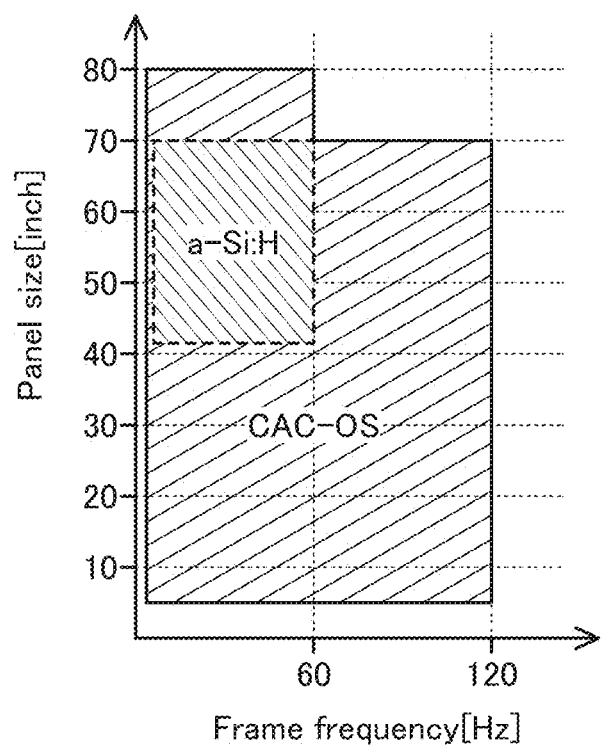
FIG. 43 shows operation ranges of displays in Example.

FIG. 43 shows the results. In FIG. 43, the longitudinal axis represents the panel size and the lateral axis represents the frame rate. It can be confirmed that the use of the CAC-OS can provide a 12-bit display panel of up to 70 inches, with 8K resolution and a frame rate of 120 Hz in which a gate driver can be integrated.

The above results show that the use of the metal oxide of one embodiment of the present invention can provide a large display module with high resolution.

Example 2

In this example, the transistors of one embodiment of the present invention were fabricated. In addition, the $I_d$-$V_g$ characteristics of the transistors were measured for reliability evaluation.
[Fabrication of Transistor]

First, transistors each corresponding to the above-described transistor 100E were fabricated to measure the electrical characteristics of the transistors. In this example, Sample A1 and Sample A2 described below were fabricated.

Samples A1 and A2 each included a transistor whose channel length L was 3 μm and channel width W was 50 μm.
[Fabrication Methods of Samples A1 and A2]

First, a 100-nm-thick tungsten film was formed over a glass substrate with a sputtering apparatus. Then, the conductive film was processed by a photolithography method to form the conductive film 104 functioning as a first gate electrode.

Then, four insulating films were stacked over the substrate and the conductive film 104 to form the insulating film 106 functioning as a first gate insulating film. To form the insulating film 106, the films were formed continuously in a vacuum with a plasma-enhanced chemical vapor deposition (PECVD) apparatus. To form the insulating film 106, a 50-nm-thick silicon nitride film, a 300-nm-thick silicon nitride film, a 50-nm-thick silicon nitride film, and a 50-nm-thick silicon oxynitride film were stacked in this order from the bottom.

Next, two metal oxide films (a first metal oxide film and a second metal oxide film) were sequentially formed over the insulating film 106. Then, the stacked metal oxide films were processed into an island shape to form the metal oxide film 108.

Note that the metal oxide films in Sample A1 and Sample A2 were formed under different conditions.

<Formation of Metal Oxide Film in Sample A1>

In Sample A1, the first metal oxide film was formed using a 20-nm-thick In—Ga—Zn film and the second metal oxide film was formed using a 25-nm-thick In—Ga—Zn film.

The first metal oxide film was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The proportion of oxygen in the whole deposition gas is referred to as an oxygen flow rate percentage in some cases. The oxygen flow rate percentage at the time of the formation of the first metal oxide film was 10%.

The second metal oxide film was formed under the same deposition conditions as those of the first metal oxide film except for the flow rate of a sputtering gas. Specifically, the introduction of the argon gas into the chamber was stopped, and an oxygen gas at a flow rate of 200 sccm was introduced into the chamber of the sputtering apparatus. The oxygen flow rate percentage at the time of the formation of the second metal oxide film was 100%.

<Formation of Metal Oxide Film in Sample A2>

In Sample A2, the first metal oxide film was formed using a 20-nm-thick In—Ga—Zn film and the second metal oxide film was formed using a 25-nm-thick In—Ga—Zn film.

The first metal oxide film was formed under the following conditions: the substrate temperature was 170° C.; an argon gas at a flow rate of 140 sccm and an oxygen gas at a flow rate of 60 sccm were introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The oxygen flow rate percentage at the time of the formation of the first metal oxide film was 30%.

The second metal oxide film was formed under the following conditions: the substrate temperature was 170° C.; an argon gas at a flow rate of 100 sccm and an oxygen gas at a flow rate of 100 sccm was introduced into a chamber of a sputtering apparatus; the pressure was 0.6 Pa; and an alternating-current power of 2.5 kw was applied to a metal oxide target containing indium, gallium, and zinc (In:Ga:Zn=1:1:1.2 [atomic ratio]). The oxygen flow rate percentage at the time of the formation of the second metal oxide film was 50%.

The metal oxide films 108 in Sample A1 and Sample A2 were formed in the above steps.

Next, heat treatment was performed at a heating temperature of 350° C. in the following manner: heat treatment in a nitrogen atmosphere was performed for one hour, and then heat treatment in a mixed gas atmosphere containing nitrogen and oxygen was performed for one hour.

Then, a conductive film was formed over the insulating film 106 and the metal oxide film 108 and was processed, so that the conductive films 112a and 112b were formed. For the conductive film, a 30-nm-thick first titanium film and a 200-nm-thick copper film were formed in this order with a sputtering apparatus. After that, the copper film was etched by a photolithography method, and then a 50-nm-thick second titanium film was formed with the sputtering apparatus. Subsequently, the first titanium film and the second titanium film were etched by a photolithography method, whereby the conductive films 112a and 112b were formed.

Next, an exposed surface of the metal oxide film 108 (on the back channel side) was washed with phosphoric acid.

Then, the insulating film 114 was formed over the insulating film 106, the metal oxide film 108, and the conductive films 112a and 112b, and the insulating film 116 was formed over the insulating film 114. The insulating film 114 and the insulating film 116 were formed in succession in a vacuum with a plasma-enhanced chemical deposition (PECVD) apparatus. The insulating film 114 was formed using a 30-nm-thick silicon oxynitride film and the insulating film 116 was formed using a 400-nm-thick silicon oxynitride film.

Next, heat treatment was performed at a heating temperature of 350° C. in a nitrogen atmosphere for one hour.

Then, a conductive film was formed over the insulating film 116. A 6-nm-thick ITSO film was formed as the conductive film by a sputtering apparatus.

Subsequently, oxygen was added to the insulating film 116 through the conductive film by plasma treatment. In the plasma treatment, plasma was discharged in an atmosphere containing an oxygen gas.

Next, the conductive film was removed.

Then, the insulating film 118 was formed over the insulating film 116. A 100-nm-thick silicon nitride film was formed as the insulating film 118 with a plasma-enhanced chemical vapor deposition (PECVD) apparatus.

After that, an opening was formed in a desired region of the insulating film. The opening was formed by a dry etching method.

Subsequently, a conductive film was formed to fill the opening and was processed into an island shape, whereby the conductive film 120a functioning as a second gate electrode was formed. A 100-nm-thick ITSO film was formed as the conductive film 120a with a sputtering apparatus.

Next, an insulating film was formed over the insulating film 118 and the conductive film 120a. A 1.5-μm-thick acrylic photosensitive resin was used for the insulating film.

In the above manner, Sample A1 and Sample A2 were fabricated.

[$I_d$-$V_g$ Characteristics of Transistor]

Next, the $I_d$-$V_g$ characteristics of the fabricated transistors in Sample A1 and Sample A2 were measured. In measuring the $I_d$-$V_g$ characteristics of the transistors, a voltage applied to the conductive film functioning as the first gate electrode (hereinafter the voltage is also referred to as gate voltage ($V_g$)) and a voltage applied to the conductive film functioning as the second gate electrode (hereinafter the voltage is also referred to as back gate voltage ($V_{bg}$)) were changed from −15 V to +20 V in increments of 0.25 V. A voltage applied to the conductive film functioning as a source electrode (hereinafter the voltage is also referred to as source voltage ($V_s$)) was 0 V (comm) and voltages applied to the conductive film functioning as a drain electrode (hereinafter the voltages are also referred to as drain voltage ($V_d$)) were 0.1 V and 20 V.

Figure 44A:
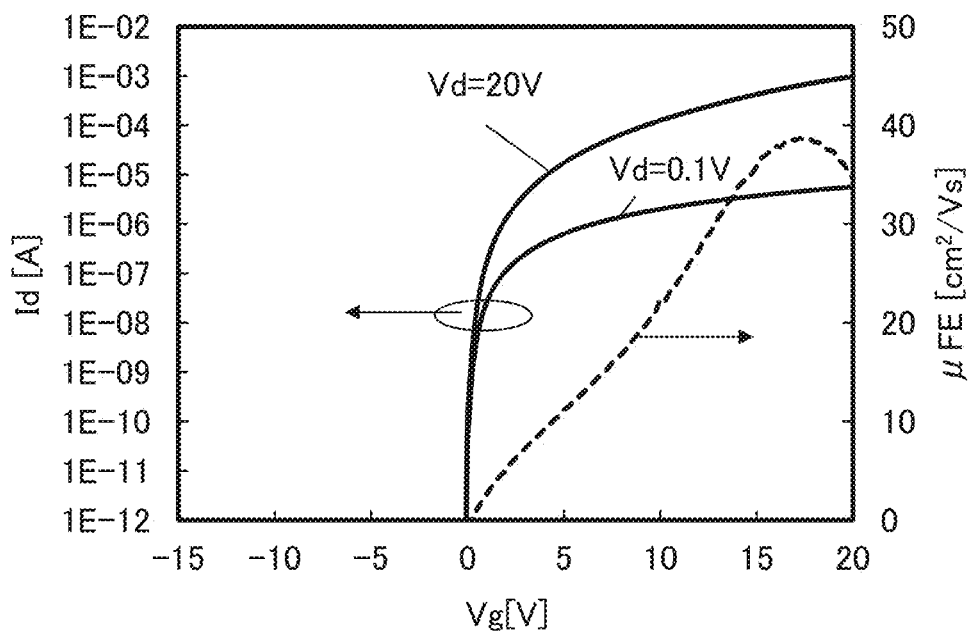
FIGS. 44A and 44B show $I_d$-$V_g$ characteristics of transistors in Example.
Figure 44B:
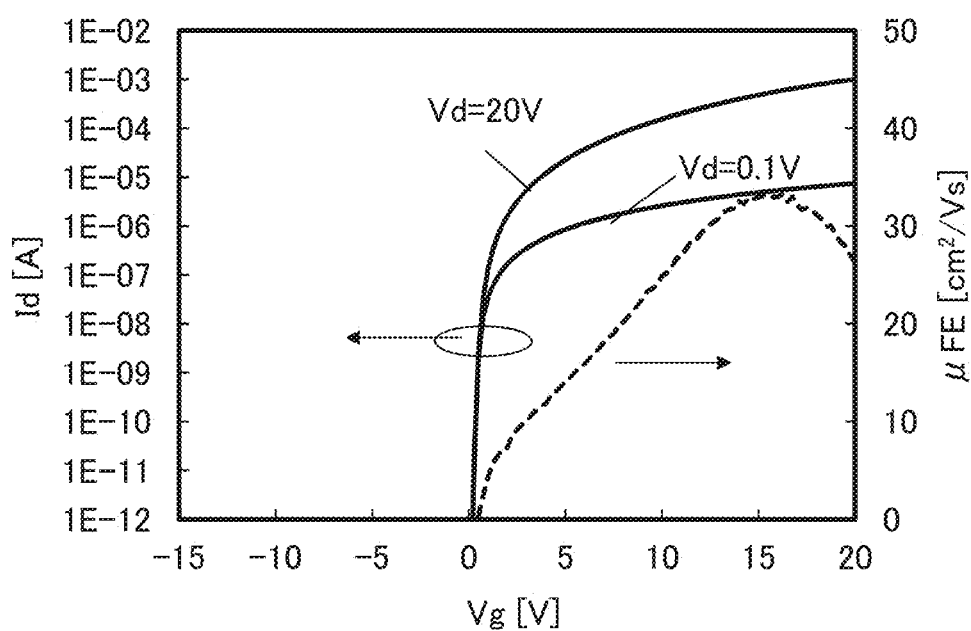

FIGS. 44A and 44B show the results of $I_d$-$V_g$ characteristics of Sample A1 and Sample A2, respectively. In each of FIGS. 44A and 44B, the first vertical axis represents $I_d$ (A), the second vertical axis represents field-effect mobility (μFE (cm²/Vs)), and the horizontal axis represents $V_g$ (V). Note that the field-effect mobility was measured when $V_d$ was 20 V.

<Field-Effect Mobility>

Here, the field-effect mobility is described. As an index of current drive capability of a transistor, the field-effect mobility is used. The on region of the transistor is divided into a linear region and a saturation region. From the characteristics in the regions, the field-effect mobility of the transistor can be calculated on the basis of the analytic formulae of the drain current based on gradual channel approximation. The field-effect mobility in the linear region and the field-effect mobility in the saturation region are referred to as linear mobility and saturation mobility, respectively, when they need to be distinguished from each other. The saturation mobility is represented by the following formula (1).

[Formula 1]

$$\mu_{FE}^{sat} = \frac{2L}{WC_{ox}} \left( \frac{\partial \sqrt{I_d}}{\partial V_g} \right)^2 \quad (1)$$

In this specification and the like, curves calculated from the formula (1) are referred to as mobility curves. FIGS. 44A and 44B show mobility curves of saturation mobility estimated from the $I_d$-$V_g$ characteristics using the formula (1).

As shown in FIGS. 44A and 44B, transistors having high field-effect mobility and favorable switching characteristics were fabricated in both of the conditions.

[Gate Bias-Temperature Stress Test]

Figure 47:
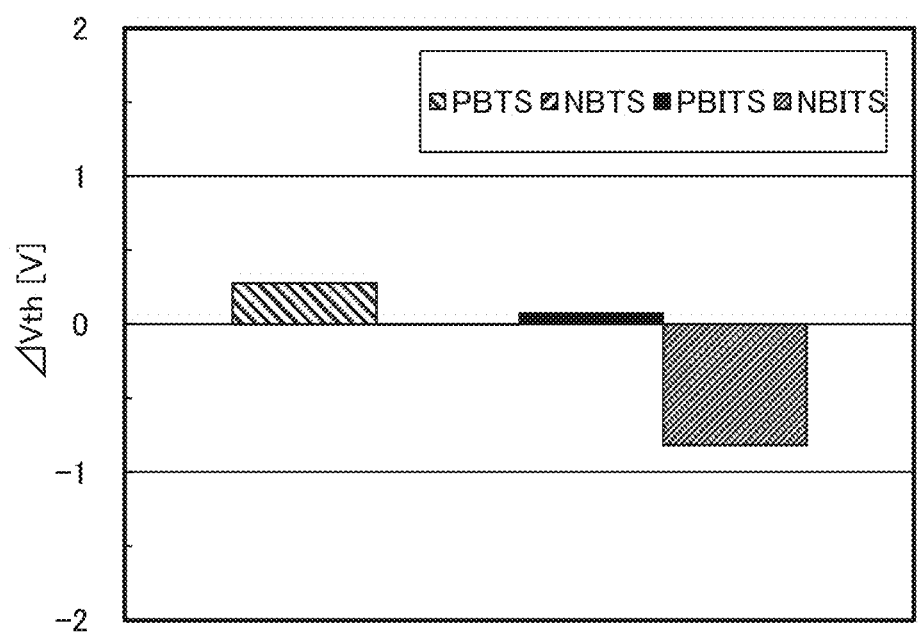
FIG. 47 shows the results of GBT tests each performed on a transistor in Example.

FIG. 47 shows the stress tests results of Sample A1. As the stress tests, gate bias-temperature stress tests (GBT tests) were conducted. A GBT test is one kind of acceleration test and can evaluate, in a short time, a change in transistor characteristics due to long-term use. Here, in each of the GBT tests, the substrate over which the transistor was formed was held at 60° C., 0 V was applied to the source and the drain of the transistor, and 30 V or −30 V was applied to the gate; this state was held for 3600 seconds. Note that a test in which a positive voltage is applied to a gate is referred to as PBTS, and a test in which a negative voltage is applied to a gate is referred to as NBTS. Furthermore, 30 V or −30 V was applied to the gate under light irradiation with a white LED at 10000 lx; this state was held for 3600 seconds. Note that a test in which a positive voltage is applied to a gate is referred to as PBITS, and a test in which a negative voltage is applied to a gate is referred to as NBITS.

FIG. 47 shows the results of the GBT tests. The results in FIG. 47 indicate that the amount of change in threshold value ($\Delta V_{th}$) is smaller than or equal to ±1 V, which is favorable. The probable factors of the favorable results in the GBT tests are, for example, as follows: a stack including a CAC-OS film and a CAAC-OS film is used for the metal oxide film 108 of the transistor included in Sample A1; a buried channel is formed; and an influence of defects and damage at the interface between the metal oxide film 108 and the insulating film 114 on a back channel is reduced.

[Reliability Evaluation 1]

Next, reliability evaluation was performed on each of Samples A1 and A2.

In the reliability evaluation, pulse voltage was repeatedly applied to transistors to drive the transistors, and the change rates of on-state currents were measured.

In the measurement, a pulse voltage whose high-level voltage was 20 V and low-level voltage was −8 V was applied to the first gate electrodes, the second gate electrodes, and the drain electrodes while a constant potential of −8 V was applied to the source electrodes. The frequency of the pulse voltage was approximately 17.1 kHz, and a period during which a voltage of 20 V was applied accounted for 20% and a period during which a voltage of −8 V was applied accounted for 80% (i.e., a duty cycle was 20%).

After the pulse voltage was applied for a certain period, the on-state currents of the transistors were measured. In the measurement of the on-state currents, gate voltage ($V_g$) and back gate voltage ($V_{bg}$) were set to 15 V, source voltage ($V_s$) was set to 0 V (comm), drain voltage ($V_d$) was set to 5 V, and a sampling period in the measurement was set to 7.5 msec (duty cycle: 7.5%).

The transistors in Samples A1 and A2 used for the measurement each had a channel length of 4 μm and a channel width of 1000 μm.

Figure 45A:
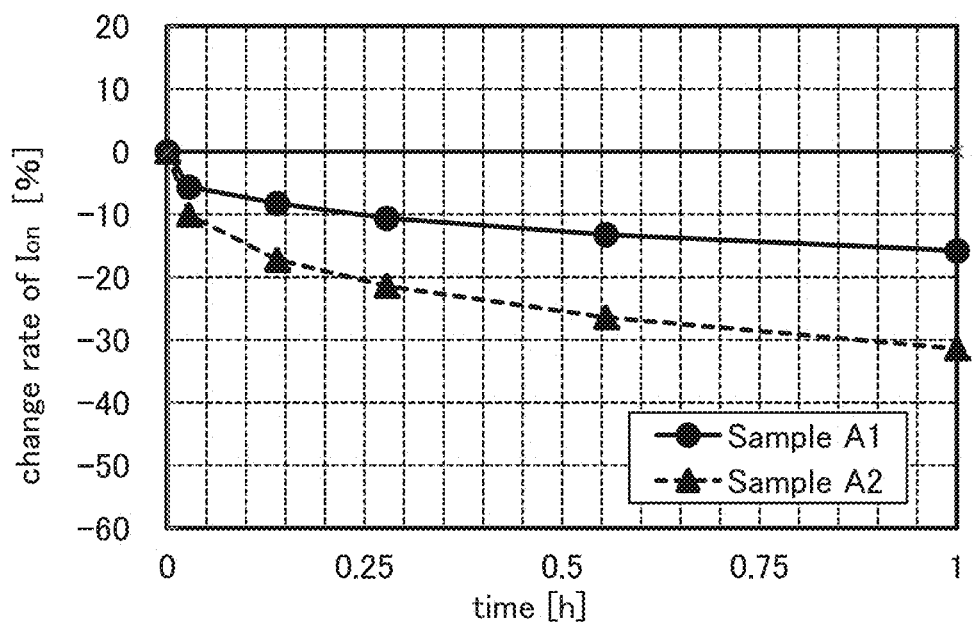
FIGS. 45A and 45B show changes in transistor characteristics in Example.

FIG. 45A shows the change rates of the on-state currents of Samples A1 and A2 estimated from the measured $I_d$-$V_g$ characteristics. In FIG. 45A, the lateral axis represents time and the longitudinal axis represents the change rate of on-state current.

Figure 45B:
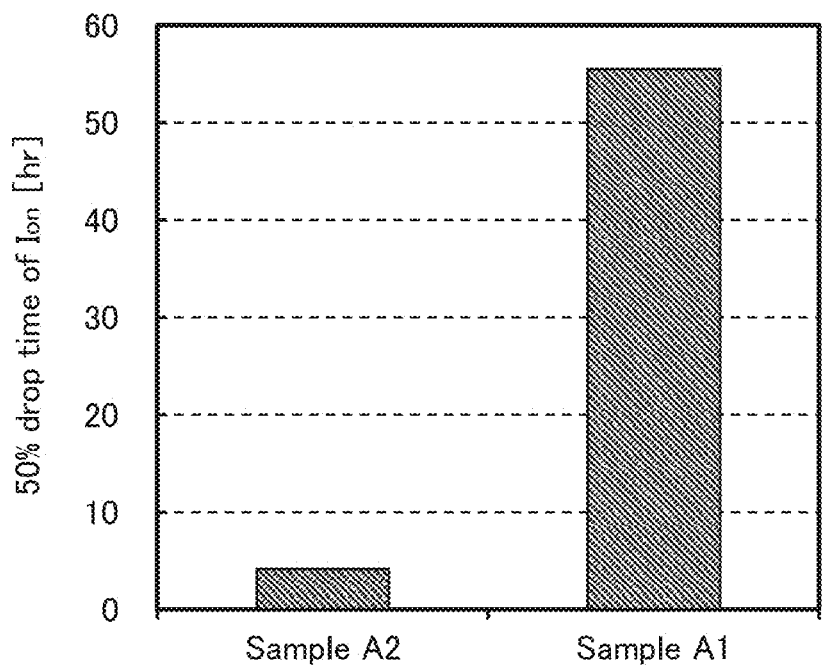

FIG. 45B shows the time until the on-state current drops to 50%. It is approximately 4.2 hours in Sample A2 and approximately 55.5 hours in Sample A1.

The above results show that a transistor containing the metal oxide of one embodiment of the present invention has high reliability.

[Reliability Evaluation 2]

Next, reliability evaluation was performed under the conditions different from those of the above reliability evaluation. The reliability evaluation was performed on three transistors fabricated under the same conditions as Sample A1. The channel lengths of the three transistors were 3 μm, 4 μm, and 6 μm, and the channel widths of the three transistors were each 1000 μm. Note that the results of the reliability evaluation slightly differ between Reliability evaluation 1 and Reliability evaluation 2 because different samples were measured.

In the measurement, a pulse voltage whose high-level voltage was 20 V and low-level voltage was −9 V was applied to first gate electrodes, second gate electrodes, and drain electrodes while a constant potential of −9 V was applied to source electrodes. As for the pulse voltage, a period during which a voltage of 20 V was applied accounted for 20% and a period during which a voltage of −9 V was applied accounted for 80% (i.e., a duty cycle was 20%).

After the pulse voltage was applied for a certain period, the on-state currents of the transistors were measured. In the measurement of the on-state currents, gate voltage ($V_g$) and back gate voltage ($V_{bg}$) were set to 15 V, source voltage ($V_s$) was set to 0 V (comm), drain voltage ($V_d$) was set to 5 V, and a sampling period in the measurement was set to 7.5 msec (duty cycle: 7.5%).

Figure 48A:
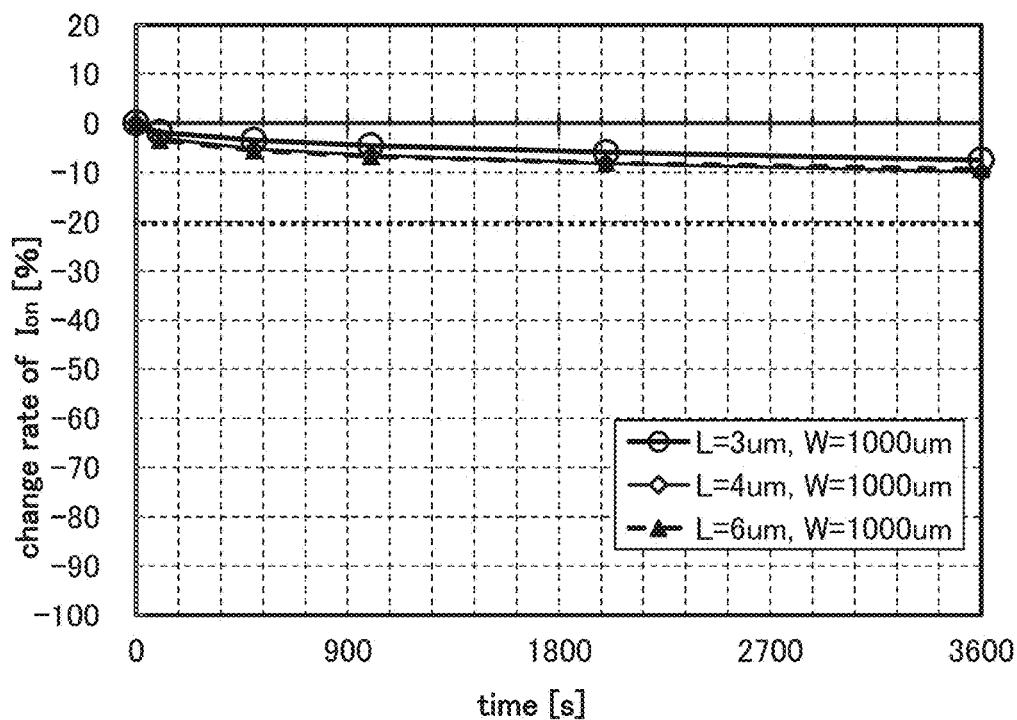
FIGS. 48A and 48B each show a change in transistor characteristics in Example.
Figure 48B:
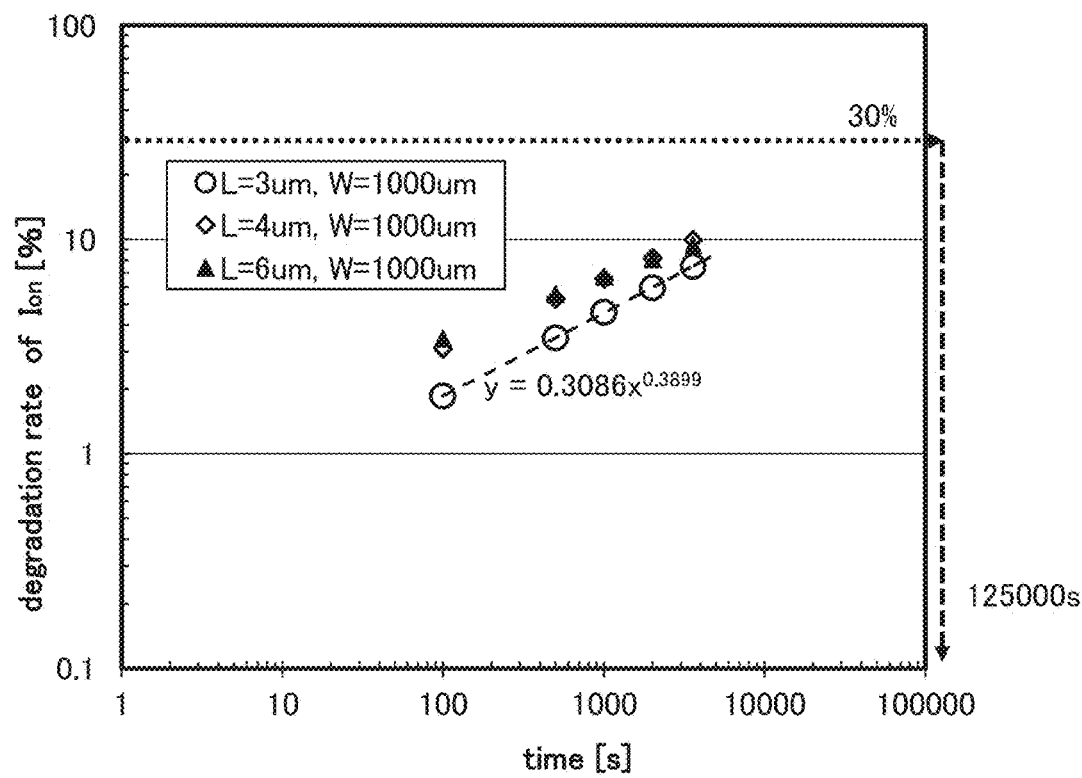

FIGS. 48A and 48B show the measurement results. FIG. 48A shows the measurement results in a semi-log graph, and FIG. 48B shows the measurement results in a log-log graph. In each of FIGS. 48A and 48B, the lateral axis represents the measurement time and the longitudinal axis represents the change rate of on-state current in the reliability evaluation. It can be estimated from the results in FIG. 48B that it takes approximately 125,000 sec for the on-state current to decrease to 70% by degradation. The above results show that a transistor containing the metal oxide of one embodiment of the present invention has high reliability.

[Fabrication of Transistor]

Next, transistors each corresponding to the above-described transistor 100A were fabricated to measure the electrical characteristics of the transistors. In this example, Sample A3 and Sample A4 described below were fabricated. Note that in each of the transistors in Samples A3 and A4, the stacking order of the conductive film 120a and the insulating film 118 was different from that in the transistor 100A.

Samples A3 and A4 each included a transistor whose channel length L was 2 μm and channel width W was 50 μm.

[Fabrication Methods of Samples A3 and A4]

First, a 100-nm-thick tungsten film was formed over a glass substrate with a sputtering apparatus. Then, the conductive film was processed by a photolithography method to form the conductive film 104 functioning as a first gate electrode.

Next, different insulating films 106 were formed for Samples A3 and A4.

For Sample A3, four insulating films were stacked over the substrate and the conductive film 104 to form the insulating film 106 functioning as a first gate insulating film. To form the insulating film 106 in Sample A3, the films were formed continuously in a vacuum with a PECVD apparatus. To form the insulating film 106 in Sample A3, a 50-nm-thick silicon nitride film, a 300-nm-thick silicon nitride film, a 50-nm-thick silicon nitride film, and a 50-nm-thick silicon oxynitride film were stacked in this order from the bottom.

For Sample A4, three insulating films were stacked over the substrate and the conductive film 104 to form the insulating film 106 functioning as a first gate insulating film. To form the insulating film 106 in Sample A4, the films were formed continuously in a vacuum with a PECVD apparatus. To form the insulating film 106 in Sample A4, a 50-nm-thick silicon nitride film, a 300-nm-thick silicon nitride film, and a 50-nm-thick silicon nitride film were stacked in this order from the bottom. For Sample A4, oxygen plasma treatment was performed on a surface of the insulating film 106 after the formation of the insulating film 106.

Next, two metal oxide films (a first metal oxide film and a second metal oxide film) were sequentially formed over the insulating film 106. Then, the stacked metal oxide films were processed into an island shape to form the metal oxide film 108.

The first metal oxide film was formed using a 10-nm-thick In—Ga—Zn film and the second metal oxide film was formed using a 25-nm-thick In—Ga—Zn film.

The first metal oxide film was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The oxygen flow rate percentage at the time of the formation of the first metal oxide film was 10%.

The second metal oxide film was formed under the same deposition conditions as those of the first metal oxide film except for the flow rate of a sputtering gas. Specifically, the introduction of the argon gas into the chamber was stopped, and an oxygen gas at a flow rate of 200 sccm was introduced into the chamber of the sputtering apparatus. The oxygen flow rate percentage at the time of the formation of the second metal oxide film was 100%.

Next, heat treatment was performed at a heating temperature of 350° C. in the following manner: heat treatment in a nitrogen atmosphere was performed for one hour, and then heat treatment in a mixed gas atmosphere containing nitrogen and oxygen was performed for one hour.

Then, a conductive film was formed over the insulating film 106 and the metal oxide film 108 and was processed, so that the conductive films 112a and 112b were formed. For the conductive film, a 50-nm-thick tungsten film, a 400-nm-thick aluminum film, and a 100-nm-thick titanium film were formed in this order with a sputtering apparatus. Subsequently, the conductive film was etched by a photolithography method, whereby the conductive films 112a and 112b were formed.

Next, an exposed surface of the metal oxide film 108 (on the back channel side) was washed with phosphoric acid.

Then, the insulating film 114 was formed over the insulating film 106, the metal oxide film 108, and the conductive films 112a and 112b, and the insulating film 116 was formed over the insulating film 114. The insulating film 114 and the insulating film 116 were formed in succession in a vacuum with a PECVD apparatus. The insulating film 114 was formed using a 30-nm-thick silicon oxynitride film and the insulating film 116 was formed using a 400-nm-thick silicon oxynitride film.

Next, heat treatment was performed at a heating temperature of 350° C. in a nitrogen atmosphere for one hour.

Then, a conductive film was formed over the insulating film 116. A 6-nm-thick ITSO film was formed as the conductive film by a sputtering apparatus.

Subsequently, oxygen was added to the insulating film 116 through the conductive film by plasma treatment. In the plasma treatment, plasma was discharged in an atmosphere containing an oxygen gas.

Next, the conductive film was removed.

Then, the insulating film 118 was formed over the insulating film 116. A 100-nm-thick silicon nitride film was formed as the insulating film 118 with a PECVD apparatus.

After that, an opening was formed in a desired region of the insulating film. The opening was formed by a dry etching method.

Subsequently, a conductive film was formed to fill the opening and was processed into an island shape, whereby the conductive film 120a functioning as a second gate electrode was formed. A 100-nm-thick ITSO film was formed as the conductive film 120a with a sputtering apparatus.

Next, an insulating film was formed over the insulating film 118 and the conductive film 120a. A 1.5-μm-thick acrylic photosensitive resin was used for the insulating film.

In the above manner, Sample A3 and Sample A4 were fabricated.

[$I_d$-$V_g$ Characteristics of Transistor]

Next, the $I_d$-$V_g$ characteristics of the transistors in Samples A3 and A4 were measured. Note that ten transistors were fabricated for each sample. The $I_d$-$V_g$ characteristics of the transistors were measured under the following conditions: $V_g$ and $V_{bg}$ were each changed from −15 V to +15 V in increments of 0.25 V, $V_s$ was set to 0 V (comm), and $V_d$ was set to 0.1 V or 20 V.

Figure 54A:
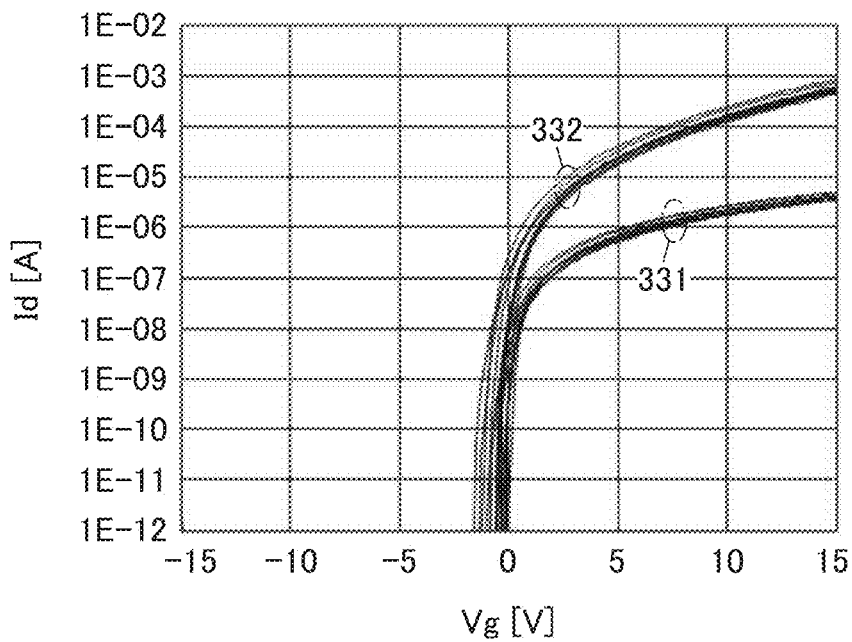
FIGS. 54A and 54B each show $I_d$-$V_g$ characteristics of a transistor in Example.
Figure 54B:
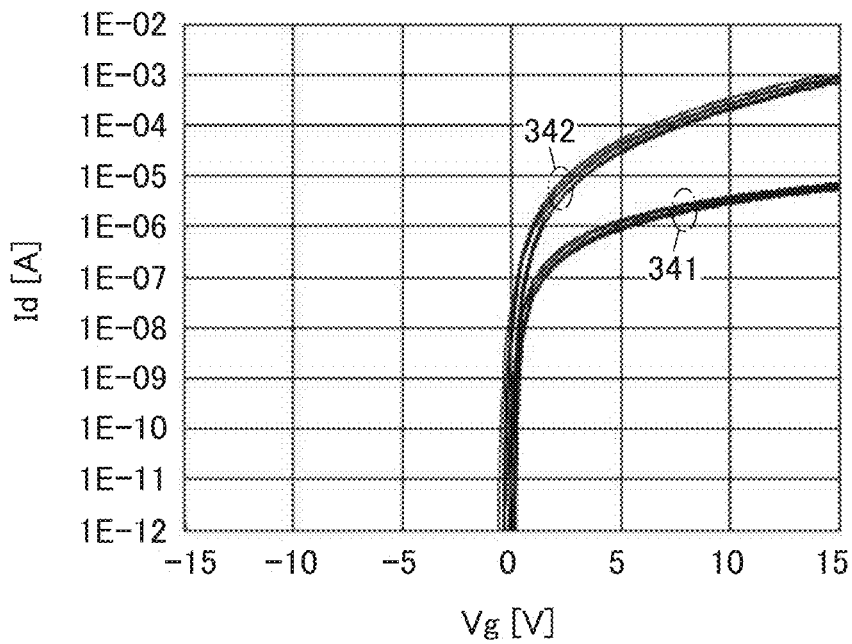

FIG. 54A shows the $I_d$-$V_g$ characteristics of the ten transistors in Sample A3. FIG. 54B shows the $I_d$-$V_g$ characteristics of the ten transistors in Sample A4. The lateral axis in each of FIGS. 54A and 54B represents $V_g$. The longitudinal axis in each of FIGS. 54A and 54B represents drain current ($I_d$) on a logarithmic scale. A profile group 331 in FIG. 54A shows the $I_d$-$V_g$ characteristics of the transistors in Sample A3 when $V_d$ is 0.1 V. A profile group 332 in FIG. 54A shows the $I_d$-$V_g$ characteristics of the transistors in Sample A3 when $V_d$ is 20 V. A profile group 341 in FIG. 54B shows the $I_d$-$V_g$ characteristics of the transistors in Sample A4 when $V_d$ is 0.1 V. A profile group 342 in FIG. 54B shows the $I_d$-$V_g$ characteristics of the transistors in Sample A4 when $V_d$ is 20 V.

The results in FIGS. 54A and 54B indicate that in both Sample A3 and Sample A4, the transistors have small off-state current and the variation among the transistors is small. This indicates that the transistors in Sample A3 and the transistors in Sample A4 have favorable electrical characteristics.

[Gate Bias-Temperature Stress Test]

Next, GBT tests were conducted on transistors in Samples A3 and A4. The transistors each had a channel length L of 3 μm and a channel width W of 50 μm. Here, in each of the GBT tests, a substrate over which the transistor was formed was held at 60° C., 0 V was applied to a source and a drain of the transistor, and 30 V or −30 V was applied to a gate; this state was held for 3600 seconds. Note that a test in which a positive voltage is applied to a gate is referred to as PBTS, and a test in which a negative voltage is applied to a gate is referred to as NBTS. Furthermore, 30 V or −30 V was applied to the gate under light irradiation with a white LED at 10000 lx; this state was held for 3600 seconds. Note that a test in which a positive voltage is applied to a gate is referred to as PBITS, and a test in which a negative voltage is applied to a gate is referred to as NBITS.

Figure 55:
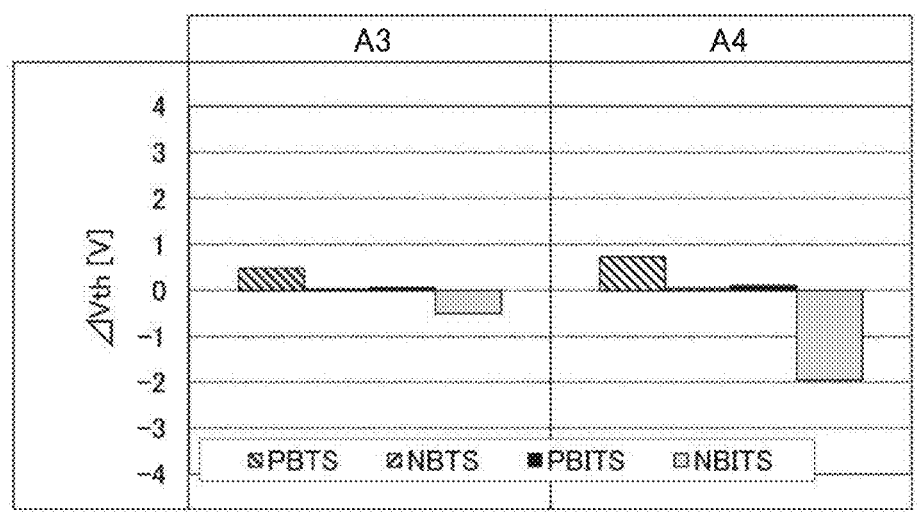
FIG. 55 shows the results of GBT tests performed on transistors in Example.

FIG. 55 shows the results of the GBT tests. The amounts of change in threshold value ($\Delta V_{th}$) of the transistor in Sample A3 are 0.49 V in PBTS, 0.04 V in NBTS, 0.06 V in PBITS, and −0.50 V in NBITS. Meanwhile, $\Delta V_{th}$ of the transistor in Sample A4 are 0.74 V in PBTS, 0.05 V in NBTS, 0.11 V in PBITS, and −1.96 V in NBITS. The amounts of change in $V_{th}$ of the transistors in Samples A3 and A4 due to the GBT tests are smaller than 2 V. This indicates that the transistors in Samples A3 and A4 have high reliability In general, a transistor in which a hydrogenated amorphous silicon layer is used for a semiconductor layer where a channel is formed (also referred to as an a-Si:H transistor) includes a silicon nitride layer as a gate insulating layer. In one embodiment of the present invention, a silicon nitride layer can be used for a gate insulating layer of an OS transistor. Accordingly, a significant equipment change is unnecessary for a shift from an a-Si:H transistor production line to an OS transistor production line. Thus, it is relatively easy to shift the production line from the a-Si:H transistor production line to the OS transistor production line.

Example 3

In this example, a display module for operation verification simulating an 8K display will be described. Note that a transistor containing the metal oxide of one embodiment of the present invention can be used as a transistor included in the display module.

To fabricate the display module for operation verification simulating an 8K display, a load that is equivalent to that of an 8K display is provided in a pixel portion of a 2K or 4K display module, as system requirements assumed for an 8K display.

Figure 46A:
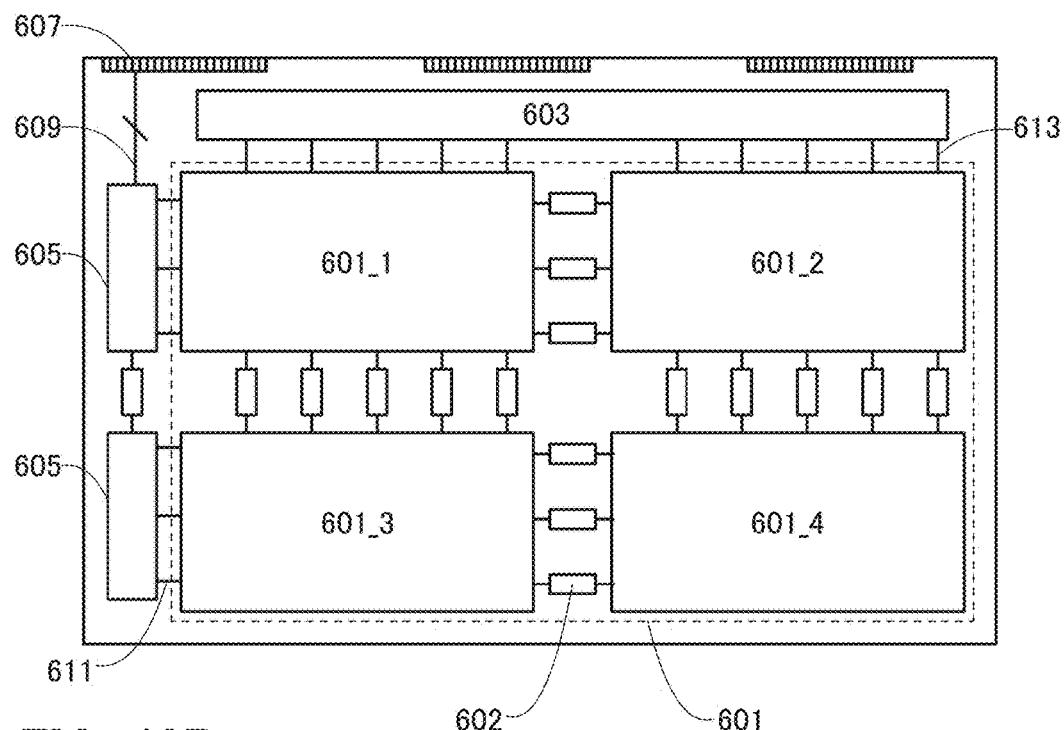
FIGS. 46A and 46B are block diagrams for Example.

FIG. 46A is a block diagram illustrating the display module for operation verification. In the structure illustrated in FIG. 46A, one pixel portion 601 formed over a substrate is provided with one source driver 603 and a pair of gate drivers 605. The pair of gate drivers 605 is preferably formed in the same process as a transistor included in a pixel and mounted on the display module by what is called a gate on array method. The source driver 603 is preferably mounted on the substrate by a COG method or the like.

Over the substrate, a terminal portion 607 connected to an FPC, a wiring 609 between the terminal portion 607 and the gate driver 605, a wiring 611 connected to the gate driver 605, and a wiring 613 connected to the source driver 603 are provided. The wiring 609 functions as a signal line and a power line for the gate driver 605. The wiring 611 functions as a gate wiring. The wiring 613 functions as a signal line.

The pixel portion 601 includes regions 601_1, 601_2, 601_3, and 601_4. A load 602 is provided for each of wirings between the region 601_1 and the region 601_2, between the region 601_1 and the region 601_3, between the region 601_2 and the region 601_4, between the region 601_3 and the region 601_4, and between the pair of gate drivers 605. The load 602 is a wiring load, and a resistor, a capacitor, or the like is provided for each wiring.

The provision of the load 602 in the pixel portion 601 and a driver circuit as appropriate allows reproduction of different operation in each region of the display module.

For example, no load is provided between the region 601_1 and the source driver 603 and between the region 601_1 and the gate driver 605. Thus, in the region 601_1, waveform distortion of signals through the signal line and the gate wiring is small, resulting in the mildest writing conditions of the signals to pixels in the pixel portion 601.

There is no load between the region 601_2 and the source driver 603, whereas the load 602 is provided between the region 601_2 and the gate driver 605. Thus, in the region 601_2, waveform distortion of a signal through the signal line is small and waveform distortion of a signal through the gate wiring is large.

There is a load between the region 601_3 and the source driver 603, whereas no load is provided between the region 601_3 and the gate driver 605. Thus, in the region 601_3, waveform distortion of a signal through the signal line is large and waveform distortion of a signal through the gate wiring is small.

The load 602 is provided between the region 601_4 and each of the source driver 603 and the gate driver 605. Thus, in the region 601_4, waveform distortion of signals through the signal line and the gate wiring is large, resulting in the harshest conditions of writing of the signals to pixels in the pixel portion 601.

Figure 46B:
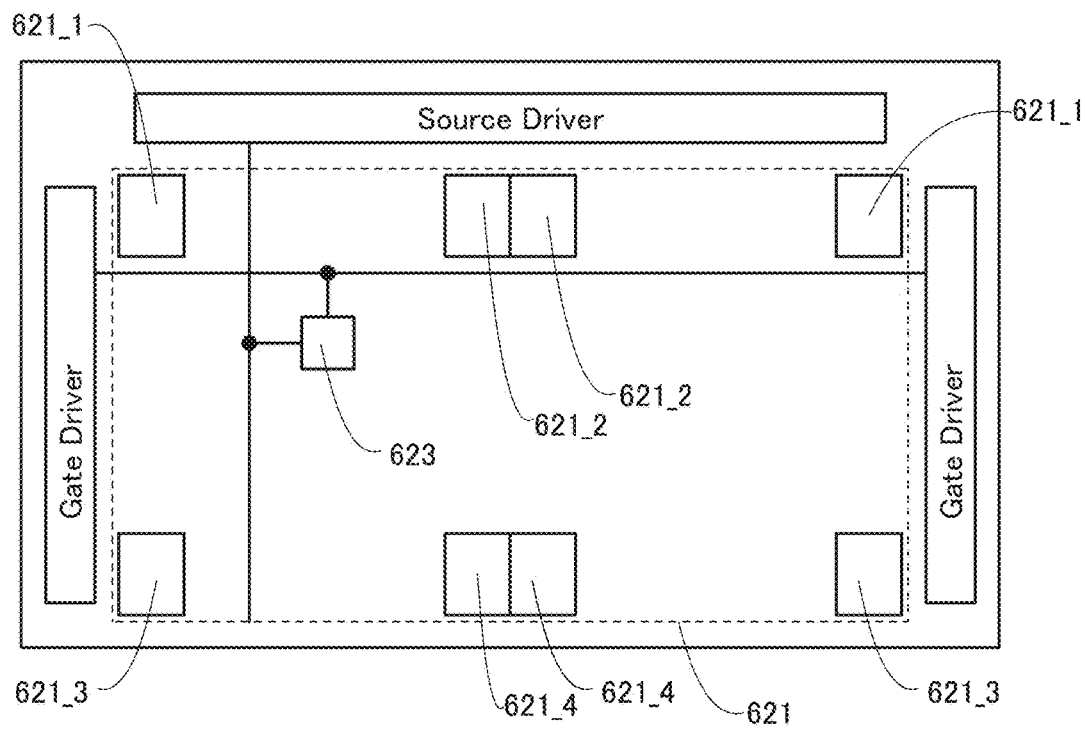

FIG. 46B is a block diagram of an actual 8K display module. A pixel 623 is provided in the pixel portion 621. The pixel 623 corresponds to the load 602 in FIG. 46A. The region 601_1 in FIG. 46A corresponds to a region 621_1 of the pixel portion 621 in FIG. 46B. The region 601_2 in FIG. 46A corresponds to a region 621_2 of the pixel portion 621 in FIG. 46B. The region 601_3 in FIG. 46A corresponds to a region 621_3 of the pixel portion 621 in FIG. 46B. The region 601_4 in FIG. 46A corresponds to a region 621_4 of the pixel portion 621 in FIG. 46B.

The provision of the loads 602 in the pixel portion 601 as illustrated in FIG. 46A allows verification of writing operation to pixels under four conditions in one display module. It also allows operation verification of a source driver and a gate driver that can drive a load that is equivalent to that of an 8K display. Accordingly, the operation verification of an 8K display module is possible using a 2K or 4K display module.

Example 4

Described in this example are the results of simulation for examining feasibility of a large 8K liquid crystal display device using the transistor of one embodiment of the present invention.

[Examination Model]

Table 3 shows the specifications of the examined liquid crystal display device. The screen diagonal of the liquid crystal display device was 65 inches, and three subpixels of R, G, and B were arranged in a stripe in a pixel. A pixel circuit included one transistor and one capacitor per cell. The transistor included in the pixel circuit was assumed as a channel-etched transistor including a CAC-OS film. A gate driver was integrated and an external IC was used as a source driver. The time required to write a video signal when the frame rate was assumed as 120 Hz was verified through simulation.

TABLE 3

| | |
|---|---|
| Screen diagonal | 65 inches |
| Driving method | Active matrix |
| Number of effective pixels | 7680 × RGB × 4320 |
| Pixel pitch | 0.1875 mm × 0.1875 mm |
| Pixel density | 136 ppi |
| Pixel circuit | 1 Tr + 1 C/cell |
| Frame rate | 120 Hz |
| Source driver | IC |
| Gate driver | Integrated |

Figure 49:
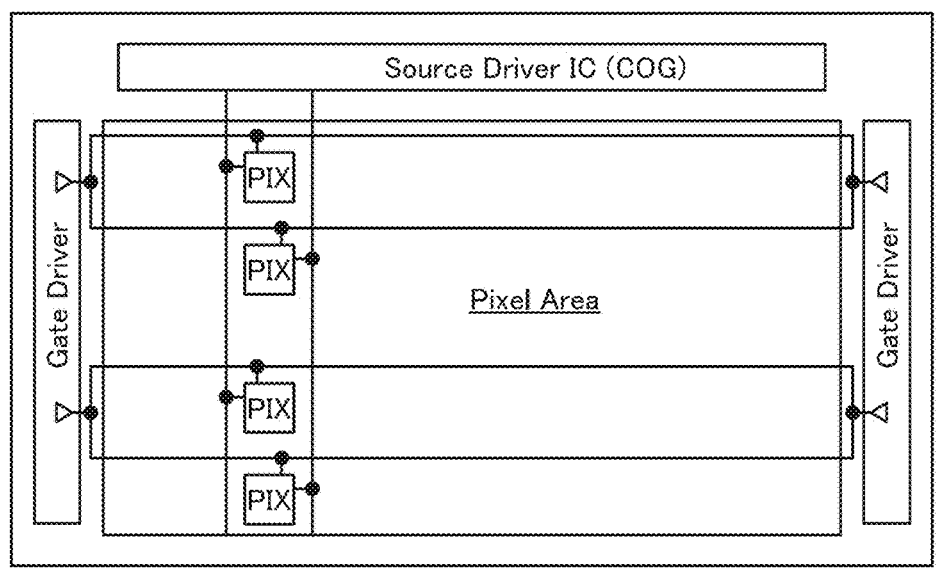
FIG. 49 is a block diagram for Example.

FIG. 49 is a schematic diagram of the examined liquid crystal display device. In a large display, the time constant particularly in a pixel region is preferably as small as possible particularly. Thus, the gate drivers were arranged on both sides of the pixel region so that a gate selection signal was input from both sides of a gate line. The gate line time constant in such a structure can be reduced to ¼ of that in a structure where the gate driver is provided on only one side of the pixel region. Accordingly, the charge and discharge time of the gate line can be short. To maximize the video signal writing time, two gate lines can be connected to a buffer, both gate lines can be simultaneously selected, and video signals can be simultaneously written into two rows. Owing to this structure, the number of shift register stages in the gate driver can be reduced by half, from 4320 to 2160, and one horizontal selection period can be increased from 1.92 µs to 3.83 µs.

Figure 50:
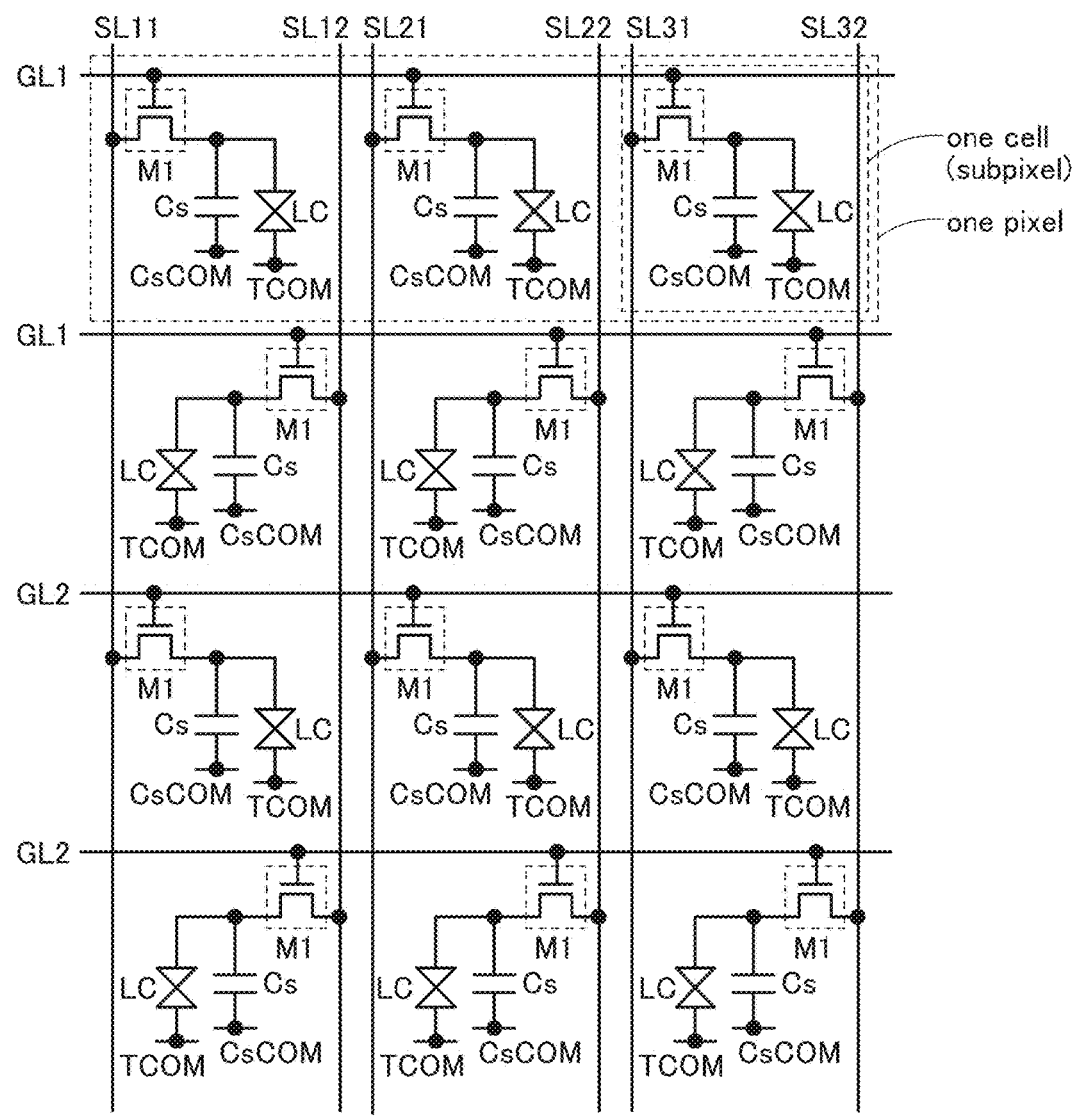
FIG. 50 is a circuit diagram for Example.

FIG. 50 is a circuit diagram of the pixels included in the liquid crystal display device. Each pixel includes three subpixels of red (R), green (G), and blue (B). Each subpixel includes a transistor M1, a capacitor Cs, and a liquid crystal element LC. In the transistor M1 functioning as a selection transistor, a gate is connected to a gate line GL and one of a source and a drain is connected to a source line SL. The capacitor Cs is provided between the other of the source and the drain of the transistor M1 and a common potential line CsCOM. The liquid crystal element LC is provided between the other of the source and the drain of the transistor M1 and a common potential line TCOM. Each subpixel has the simplest structure including one transistor and one capacitor. To write video signals simultaneously into two rows, two source lines are provided for pixels in one column (such a structure is called a double source-line structure). In pixels in an odd-numbered row, one of the source lines (e.g., SL11) is connected to the transistor M1. In pixels in an even-numbered row, the other of the source lines (e.g., SL12) is connected to the transistor M1.

Figure 51:
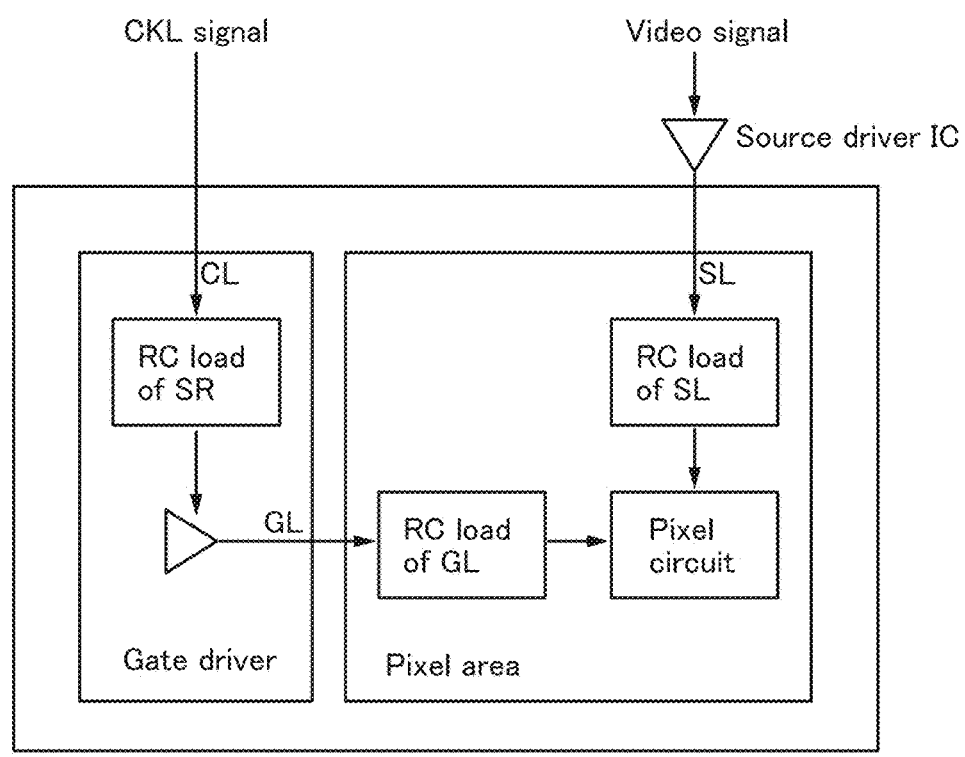
FIG. 51 is a block diagram for Example.

FIG. 51 is a block diagram illustrating a structure used for the simulation. Model parameters were extracted for the transistors of the pixel circuit and the gate driver on the basis of the actual values of a transistor including a CAC-OS film. A behavior model was used for the source driver. An RC load model was used for parasitic capacitances of the gate line and the source line in the pixel region and for a parasitic component of a CLK line of the gate driver. The parasitic capacitances and parasitic resistance were extracted by a boundary element method. The time required for writing a video signal was calculated for a pixel that had the highest RC load in the pixel region.

Figure 52:
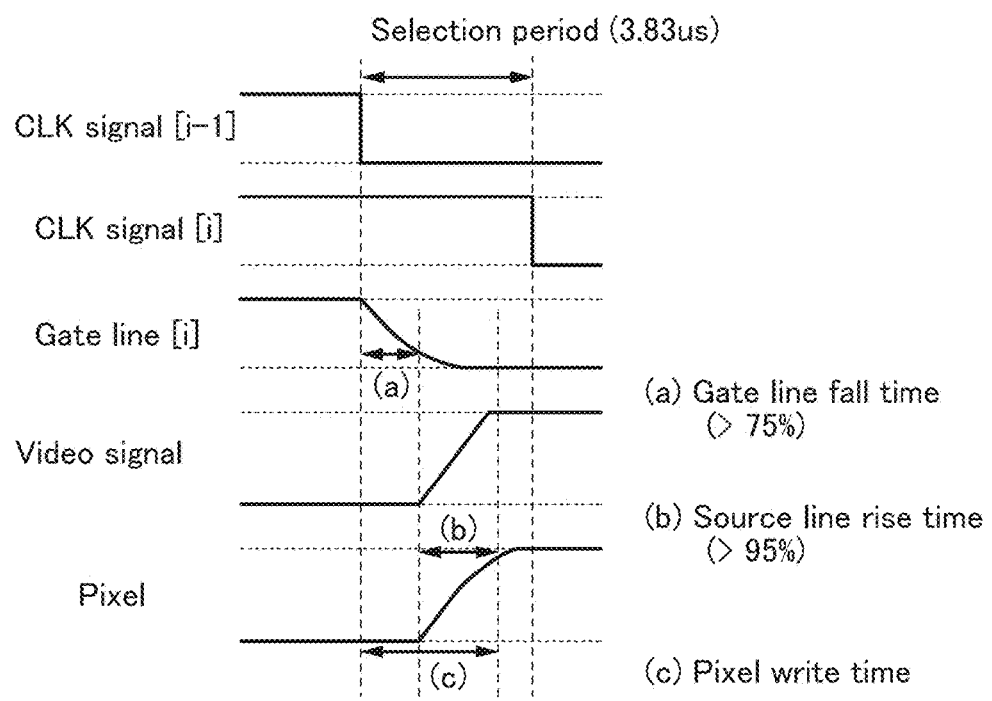
FIG. 52 is a timing chart for Example.

FIG. 52 is a timing chart showing writing operation to the pixel. A video signal is written to the pixel after the transistor M1 in a preceding row is turned off. In other words, the sum of the time required from inputting a CLK signal into the gate driver to turning off the transistor M1 (gate line fall time (a)) and the time from the input of a video signal until a potential of the pixel reaches a potential of the video signal (source line rise time (b)) corresponds to the writing time to the pixel (c). The writing time to the pixel was calculated from the sum of the gate line fall time and the source line rise time. Note that the gate line fall time was assumed as a period until the amplitude falls to 75% of the target amplitude and the source line rise time was assumed as a period until the voltage is raised to 95% of the target voltage. If the writing time to the pixel (c) is shorter than one horizontal selection period (3.83 μs here), it can be determined that the liquid crystal display device can operate.

[Calculation Result]

Table 4 shows the extraction results of the parasitic resistances and parasitic capacitances of the gate line, source line, gate driver, and CLK line. Table 4 also shows the extraction results of pixel capacitance. Transient analysis was performed using these extraction results.

TABLE 4

| Gate line resistance | 3.60 kΩ |
| Gate line capacitance | 364 pF |
| Source line resistance | 4.83 kΩ |
| Source line capacitance | 182 pF |
| CLK line resistance | 270 Ω |
| CLK line capacitance | 915 pF |
| Pixel capacitance | 191 fF |

Table 5 shows the calculation results of the gate line fall time and the source line rise time obtained by the transient analysis.

TABLE 5

| Gate line fall time (>75%) | 1.69 μs |
| Source line rise time (>95%) | 1.82 μs |
| Total time | 3.51 μs |

When the sum of the gate line fall time and the source line rise time is shorter than 3.83 μs, which is one horizontal selection period, the operation is possible. Table 5 shows that the writing time to the pixel (3.51 μs) is shorter than one horizontal selection period (3.83 μs), which indicates that the liquid crystal display device can operate.

Figure 53:
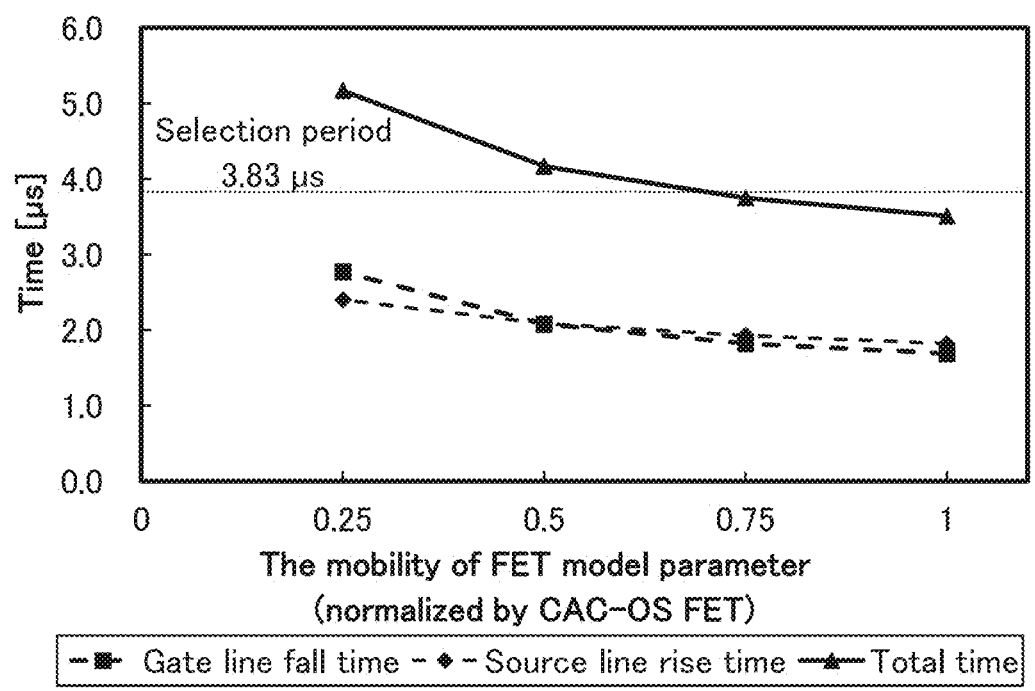
FIG. 53 shows a relationship between mobility and writing time in Example.

FIG. 53 shows the calculation results of the relationship between the field-effect mobility of the transistor and the writing time to the pixel. The longitudinal axis represents the writing time to the pixel, and the lateral axis represents the field-effect mobility when considering the field-effect mobility of a transistor including a CAC-OS film as one. As the field effect mobility decreases, the writing time to the pixel becomes longer. When the parameter of the field-effect mobility decreases to approximately 0.75 times, the writing time to the pixel becomes longer than one horizontal selection period, which indicates that the liquid crystal display device cannot be operated.

It has been confirmed that even a large (65-inch) display panel having a high resolution of 8K can be driven at a high frame rate of 120 Hz by using the transistor including a CAC-OS film.

Example 5

In this example, the transistor of one embodiment of the present invention was fabricated, and the reliability thereof was evaluated.

[Fabrication of Transistor]

First, a transistor corresponding to the above-described transistor 100A was fabricated. In this example, Sample B described below was fabricated. Note that in the transistor in Sample B, the stacking order of the conductive film 120a and the insulating film 118 was different from that in the transistor 100A.

Sample B included a transistor whose channel length L was 4 μm and channel width W was 1000 μm.

[Fabrication Method of Sample B]

First, a 100-nm-thick tungsten film was formed over a glass substrate with a sputtering apparatus. Then, the conductive film was processed by a photolithography method to form the conductive film 104 functioning as a first gate electrode.

Then, four insulating films were stacked over the substrate and the conductive film 104 to form the insulating film 106 functioning as a first gate insulating film. To form the insulating film 106, the films were formed continuously in a vacuum with a plasma-enhanced chemical vapor deposition (PECVD) apparatus. To form the insulating film 106, a 50-nm-thick silicon nitride film, a 300-nm-thick silicon nitride film, a 50-nm-thick silicon nitride film, and a 15-nm-thick silicon oxynitride film were stacked in this order from the bottom.

Next, two metal oxide films (a first metal oxide film and a second metal oxide film) were sequentially formed over the insulating film 106. Then, the stacked metal oxide films were processed into an island shape to form the metal oxide film 108.

The first metal oxide film was formed using a 20-nm-thick In—Ga—Zn film and the second metal oxide film was formed using a 25-nm-thick In—Ga—Zn film.

The first metal oxide film was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The oxygen flow rate percentage at the time of the formation of the first metal oxide film was 10%.

The second metal oxide film was formed under the same deposition conditions as those of the first metal oxide film except for the flow rate of a sputtering gas. Specifically, the introduction of the argon gas into the chamber was stopped, and an oxygen gas at a flow rate of 200 sccm was introduced into the chamber of the sputtering apparatus. The oxygen flow rate percentage at the time of the formation of the second metal oxide film was 100%.

Next, heat treatment was performed at a heating temperature of 350° C. in the following manner: heat treatment in a nitrogen atmosphere was performed for one hour, and then heat treatment in a mixed gas atmosphere containing nitrogen and oxygen was performed for one hour.

Then, a conductive film was formed over the insulating film 106 and the metal oxide film 108 and was processed, so that the conductive films 112a and 112b were formed. For the conductive film, a 50-nm-thick tungsten film, a 400-nm-thick aluminum film, and a 100-nm-thick titanium film were formed in this order with a sputtering apparatus. Subsequently, the conductive film was etched by a photolithography method, whereby the conductive films 112a and 112b were formed.

Next, an exposed surface of the metal oxide film 108 (on the back channel side) was washed with phosphoric acid.

Then, the insulating film 114 was formed over the insulating film 106, the metal oxide film 108, and the conductive films 112a and 112b, and the insulating film 116 was formed over the insulating film 114. The insulating film 114 and the insulating film 116 were formed in succession in a vacuum with a plasma-enhanced chemical deposition (PECVD) apparatus. The insulating film 114 was formed using a 30-nm-thick silicon oxynitride film and the insulating film 116 was formed using a 400-nm-thick silicon oxynitride film.

Next, heat treatment was performed at a heating temperature of 350° C. in a nitrogen atmosphere for one hour.

Then, a conductive film was formed over the insulating film 116. A 6-nm-thick ITSO film was formed as the conductive film by a sputtering apparatus.

Subsequently, oxygen was added to the insulating film 116 through the conductive film by plasma treatment. In the plasma treatment, plasma was discharged in an atmosphere containing an oxygen gas.

Next, the conductive film was removed.

Then, the insulating film 118 was formed over the insulating film 116. A 100-nm-thick silicon nitride film was formed as the insulating film 118 with a plasma-enhanced chemical vapor deposition (PECVD) apparatus.

After that, an opening was formed in a desired region of the insulating film. The opening was formed by a dry etching method.

Subsequently, a conductive film was formed to fill the opening and was processed into an island shape, whereby the conductive film 120a functioning as a second gate electrode was formed. A 100-nm-thick ITSO film was formed as the conductive film 120a with a sputtering apparatus.

Next, an insulating film was formed over the insulating film 118 and the conductive film 120a. A 1.5-μm-thick acrylic photosensitive resin was used for the insulating film.

In the above manner, Sample B was fabricated.
[Reliability Evaluation]

Next, reliability evaluation was performed on the transistor in Sample B. In the reliability evaluation, pulse voltage was repeatedly applied to the transistor to drive the transistor, and the change rate of on-state current was measured.

In the measurement, a pulse voltage whose high-level voltage was 20 V and low-level voltage was −8 V was applied to the first gate electrode, the second gate electrode, and the drain electrode while a constant potential of −8 V was applied to the source electrode at room temperature (25° C.). The cycle was 58.4 μsec, and a period during which a voltage of 20 V was applied accounted for 20% (11.68 μsec per cycle) and a period during which a voltage of −8 V was applied accounted for 80% (i.e., a duty cycle was 20%). The upper limit of source current ($I_s$) was 10 mA.

After the pulse voltage was applied for a certain period, the on-state current of the transistor was measured. In the measurement of the on-state current, gate voltage ($V_g$) and back gate voltage ($V_{bg}$) were set to 15 V, source voltage ($V_s$) was set to 0 V (comm), drain voltage ($V_d$) was set to 5 V, and a sampling period in the measurement was set to 7.5 msec (duty cycle: 7.5%).

Figure 56A:
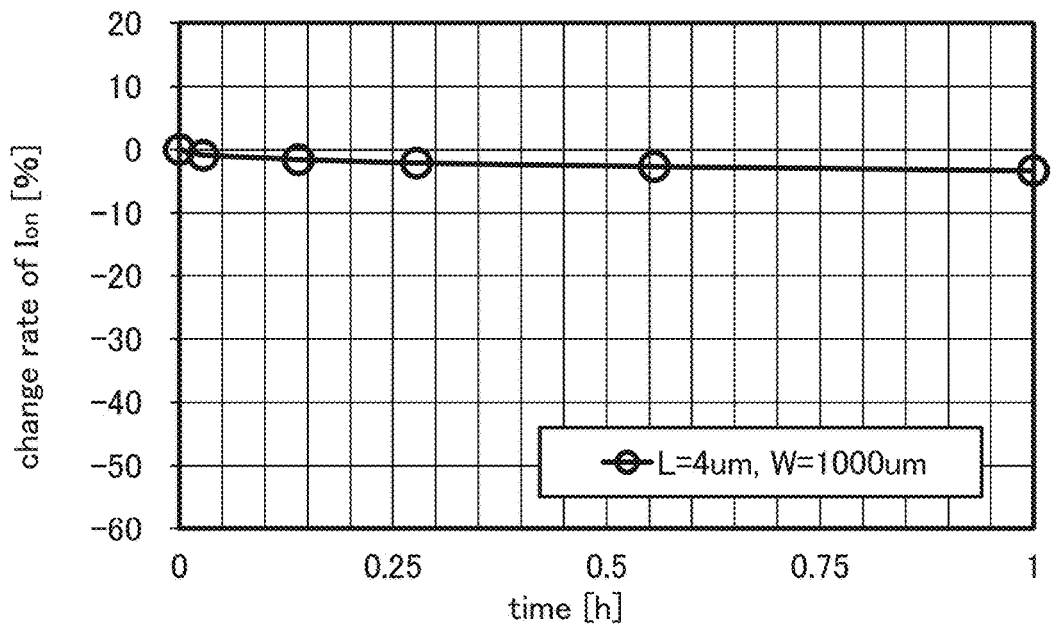
FIGS. 56A and 56B each show a change in transistor characteristics in Example.
Figure 56B:
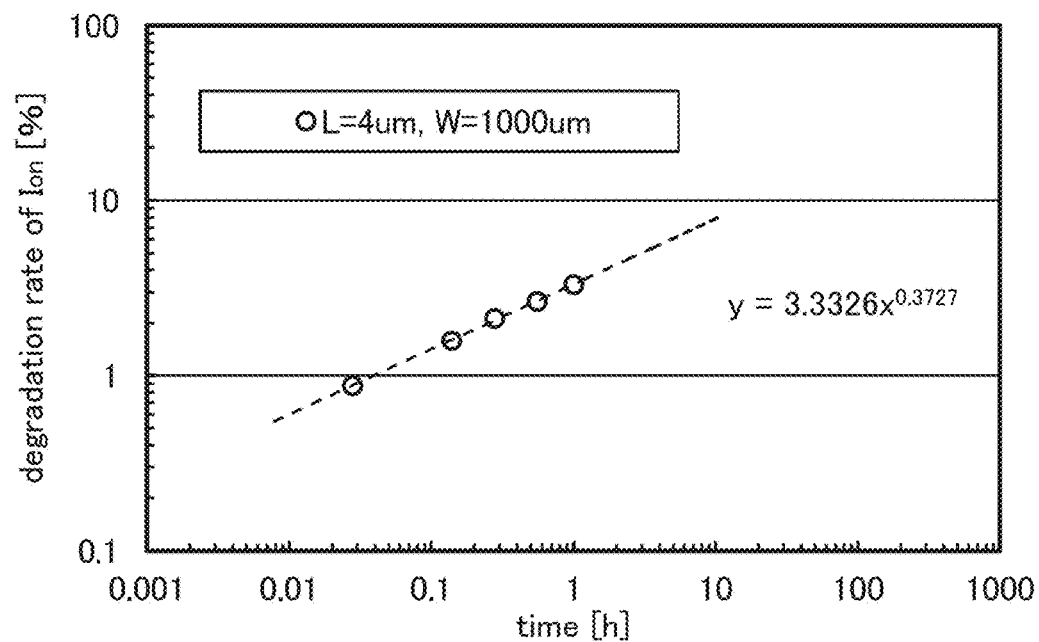

FIGS. 56A and 56B show the measurement results. FIG. 56A shows the measurement results in a semi-log graph, and FIG. 56B shows the measurement results in a log-log graph. In each of FIGS. 56A and 56B, the lateral axis represents the measurement time and the longitudinal axis represents the change rate of on-state current in the reliability evaluation. It can be estimated from the results in FIG. 56B that it takes approximately 364 hours for the on-state current to decrease to 70% by degradation. The above results show that a transistor containing the metal oxide of one embodiment of the present invention has high reliability.

Example 6

In this example, the transistor of one embodiment of the present invention was fabricated, and the reliability thereof was evaluated.
[Fabrication of Transistor]

First, a transistor corresponding to the above-described transistor 100A was fabricated. In this example, Sample C described below was fabricated.

Sample C included a transistor whose channel length L was 3 μm and channel width W was 50 μm.
[Fabrication Method of Sample C]

First, a 100-nm-thick tungsten film was formed over a glass substrate with a sputtering apparatus. Then, the conductive film was processed by a photolithography method to form the conductive film 104 functioning as a first gate electrode.

Then, four insulating films were stacked over the substrate and the conductive film 104 to form the insulating film 106 functioning as a first gate insulating film. To form the insulating film 106, the films were formed continuously in a vacuum with a plasma-enhanced chemical vapor deposition (PECVD) apparatus. To form the insulating film 106, a 50-nm-thick silicon nitride film, a 300-nm-thick silicon nitride film, a 50-nm-thick silicon nitride film, and a 15-nm-thick silicon oxynitride film were stacked in this order from the bottom.

Next, two metal oxide films (a first metal oxide film and a second metal oxide film) were sequentially formed over the insulating film 106. Then, the stacked metal oxide films were processed into an island shape to form the metal oxide film 108.

The first metal oxide film was formed using a 10-nm-thick In—Ga—Zn film and the second metal oxide film was formed using a 25-nm-thick In—Ga—Zn film.

The first metal oxide film was formed under the following conditions: the substrate temperature was 130° C.; an argon gas at a flow rate of 180 sccm and an oxygen gas at a flow rate of 20 sccm was introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The oxygen flow rate percentage at the time of the formation of the first metal oxide film was 10%.

The second metal oxide film was formed under the same deposition conditions as those of the first metal oxide film except for the flow rate of a sputtering gas. Specifically, the introduction of the argon gas into the chamber was stopped, and an oxygen gas at a flow rate of 200 sccm was introduced into the chamber of the sputtering apparatus. The oxygen flow rate percentage at the time of the formation of the second metal oxide film was 100%.

Next, heat treatment was performed at a heating temperature of 350° C. in the following manner: heat treatment in a nitrogen atmosphere was performed for one hour, and then heat treatment in a mixed gas atmosphere containing nitrogen and oxygen was performed for one hour.

Then, a conductive film was formed over the insulating film 106 and the metal oxide film 108 and was processed, so that the conductive films 112a and 112b were formed. For the conductive film, a 50-nm-thick tungsten film, a 400-nm-thick aluminum film, and a 100-nm-thick titanium film were formed in this order with a sputtering apparatus. Subsequently, the conductive film was etched by a photolithography method, whereby the conductive films 112a and 112b were formed.

Next, an exposed surface of the metal oxide film 108 (on the back channel side) was washed with phosphoric acid.

Then, the insulating film 114 was formed over the insulating film 106, the metal oxide film 108, and the conductive films 112a and 112b, and the insulating film 116 was formed over the insulating film 114. The insulating film 114 and the insulating film 116 were formed in succession in a vacuum with a plasma-enhanced chemical deposition (PECVD) apparatus. The insulating film 114 was formed using a 30-nm-thick silicon oxynitride film and the insulating film 116 was formed using a 300-nm-thick silicon oxynitride film.

After the insulating film 116 was formed, successively, oxygen was added to the insulating film 116 by plasma treatment in a vacuum. In the plasma treatment, plasma was discharged in an atmosphere containing an oxygen gas.

Next, heat treatment was performed at a heating temperature of 350° C. in a nitrogen atmosphere for one hour.

Next, a two-layer metal oxide film was formed and was processed into an island shape to form the conductive film 120a functioning as a second gate electrode.

The first metal oxide film was formed using a 10-nm-thick In—Ga—Zn film and the second metal oxide film was formed using a 90-nm-thick In—Ga—Zn film.

The first metal oxide film was formed under the following conditions: the substrate temperature was 170° C.; an oxygen gas at a flow rate of 200 sccm was introduced into a chamber of a sputtering apparatus; the pressure was 0.6 Pa; and an alternating-current power of 2.5 kw was applied to a metal oxide target containing indium, gallium, and zinc (In:Ga:Zn=4:2:4.1 [atomic ratio]). The oxygen flow rate percentage at the time of the formation of the first metal oxide film was 100%.

The second metal oxide film was formed under the same deposition conditions as those of the first metal oxide film except for the flow rate of a sputtering gas. Specifically, an argon gas at a flow rate of 180 sccm and an oxygen gas at a flow rate of 20 sccm were introduced into a chamber of a sputtering apparatus. The oxygen flow rate percentage at the time of the formation of the second metal oxide film was 10%.

Then, the insulating film 118 was formed over the conductive film 120a. A 100-nm-thick silicon nitride film was formed as the insulating film 118 with a plasma-enhanced chemical vapor deposition (PECVD) apparatus.

Next, an insulating film was formed over the insulating film 118. A 1.5-μm-thick acrylic photosensitive resin was used for the insulating film.

In the above manner, Sample C was fabricated.

[$I_d$-$V_g$ Characteristics of Transistor]

Next, the $I_d$-$V_g$ characteristics of the fabricated transistor in Sample C were measured. In measuring the $I_d$-$V_g$ characteristics of the transistor, $V_g$ and $V_{bg}$ were changed from −15 V to +20 V in increments of 0.25 V. Furthermore, $V_s$ was set to 0 V (comm) and $V_d$ was set to 0.1 V or 20 V.

Figure 57:
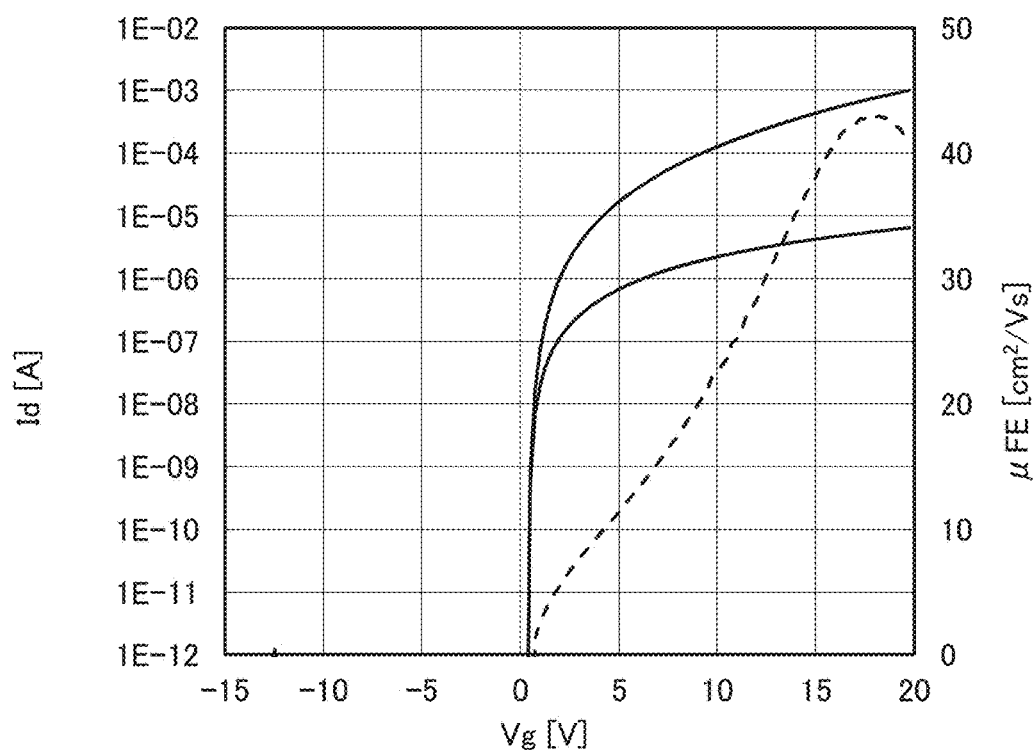
FIG. 57 shows a change in transistor characteristics in Example.

FIG. 57 shows the results of $I_d$-$V_g$ characteristics of Sample C. In FIG. 57, the first vertical axis represents $I_d$ (A), the second vertical axis represents field-effect mobility (μFE (cm$^2$/V$_s$)), and the horizontal axis represents $V_g$ (V). Note that the field-effect mobility was measured when $V_d$ was 20 V.

As shown in FIG. 57, the fabricated transistor has high field-effect mobility and favorable switching characteristics.

Example 7

In a fabrication process of a transistor, a metal oxide film (oxide semiconductor film) is damaged in a variety of steps. Specifically, the metal oxide film may be damaged in a formation step of a source electrode and a drain electrode, an etching process (particularly in a dry etching process) of the source electrode and the drain electrode, a formation step of a passivation film, and the like.

In this example, ESR analysis was performed on samples in which a passivation film or source and drain electrodes was/were formed over a metal oxide film to examine the damage due to the film formation.

The ESR analysis in this example was performed focusing on a signal at a g-factor of around 1.9. This ESR signal is probably due to conduction electron spin resonance resulting from hydrogen, which is a donor, having entered an oxygen vacancy (Vo) in the metal oxide film.

Figure 58A:
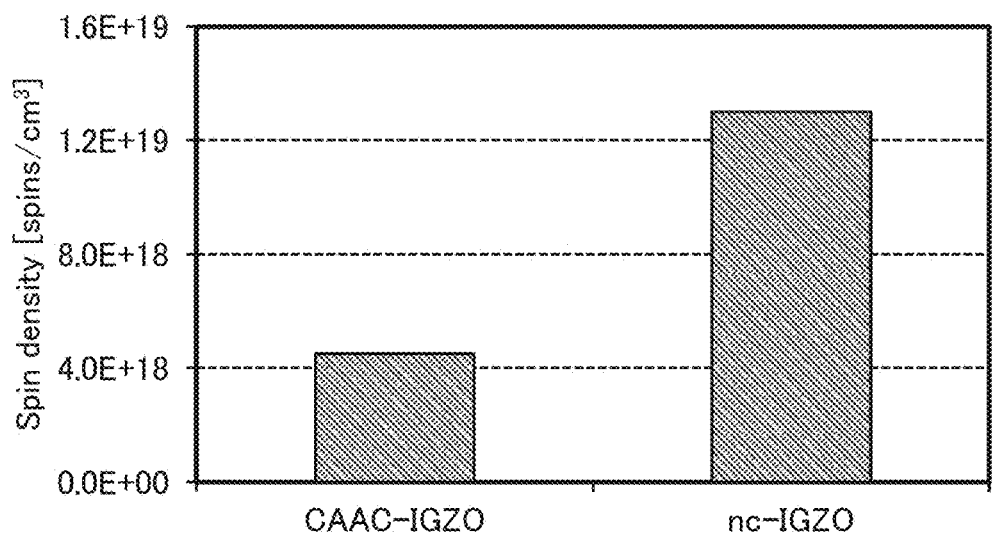
FIGS. 58A and 58B show ESR analysis results in Example.
Figure 58B:
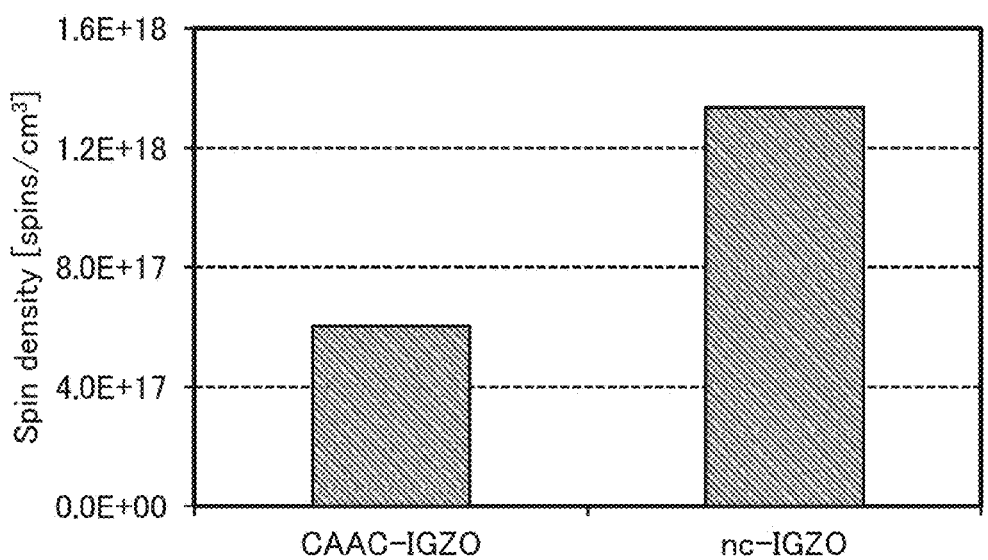

FIGS. 58A and 58B show quantified spin density obtained by the ESR analysis of the samples in this example. In this example, an nc-IGZO and a CAAC-IGZO were used as metal oxides. FIG. 58A shows the results of a sample in which a passivation film (formed of an SiON film) was formed over the metal oxide film. FIG. 58B shows the results of a sample in which source and drain electrodes (formed of a W film) were formed over the metal oxide film.

The results in FIGS. 58A and 58B indicate that a CAAC-IGZO has a smaller ESR signal due to hydrogen that has entered an oxygen vacancy than an nc-IGZO. This means that it is found that a CAAC-IGZO is particularly less likely to be damaged in a fabrication process of a transistor, and the resistance of the CAAC-IGZO is less likely to be reduced.

REFERENCE NUMERALS

100A: transistor, 100C: transistor, 100D: transistor, 100E: transistor, 102: substrate, 104: conductive film, 106: insulating film, 108: metal oxide film, 108_1: metal oxide film, 108_1_0: metal oxide film, 108_2: metal oxide film, 108_2_0: metal oxide film, 112a: conductive film, 112a_1: conductive film, 112a_2: conductive film, 112a_3: conductive film, 112b: conductive film, 112b_1: conductive film, 112b_2: conductive film, 112b_3: conductive film, 114: insulating film, 116: insulating film, 117: opening, 118: insulating film, 119: insulating film, 120: conductive film, 120a: conductive film, 120a_1: conductive film, 142a: opening, 191: target, 192: plasma, 193: target, 194: plasma, 200A: transistor, 200B: transistor, 204: conductive film, 205: capacitor wiring, 208: metal oxide film, 208_1: metal oxide film, 208_2: metal oxide film, 209: metal oxide film, 209_1: metal oxide film, 209_2: metal oxide film, 210: conductive film, 210_1: conductive film, 210_2: conductive film, 211: opening, 212a: conductive film, 212b: conductive film, 213: conductive film, 220a: conductive film, 220a_1: conductive film, 242a: opening, 242b: opening, 250: capacitor, 250a: capacitor, 331: profile group, 332: profile group, 341: profile group, 342: profile group, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 601: pixel portion, 601_1: region, 601_2: region, 601_3: region, 601_4: region, 602: load, 603: source driver, 605: gate driver, 607: terminal portion, 609: wiring, 611: wiring, 613: wiring, 621: pixel portion, 621_1: region, 621_2: region, 621_3: region, 621_4: region, 623: pixel, 700: display device, 701: substrate, 702: pixel portion, 704: source driver circuit portion, 705: substrate, 706: gate driver circuit portion, 708: FPC terminal portion, 710: signal line, 711: lead wiring portion, 712: sealant, 716: FPC, 730: insulating film, 732: sealing film, 734: insulating film, 735: insulating film, 736: coloring film, 738: light shielding film, 750: transistor, 752: transistor, 760: connection electrode, 770: insulating film, 772: conductive film, 773: insulating film, 774: conductive film, 775: liquid crystal element, 776: liquid crystal layer, 778: structure, 780: anisotropic conductive film, 782: light-emitting element, 786: EL layer, 788: conductive film, 791: touch panel, 792: insulating film, 793: electrode, 794: electrode, 795: insulating film, 796: electrode, 797: insulating film, 800: display device, 810: display unit, 815: controller IC, 820: touch sensor unit, 840: host, 843: optical sensor, 844: open/close sensor, 845: light, 850: interface, 851: frame memory, 852: decoder, 853: sensor controller, 854: controller, 855: clock generation circuit, 860: image processing portion, 861: gamma correction circuit, 862: dimming circuit, 863: toning circuit, 864: correction circuit, 870: memory, 873: timing controller, 875: register, 875A: scan chain register portion, 875B: register portion, 884: touch sensor controller, 890: region, 902: control portion, 903: cell array, 904: sense amplifier circuit, 905: driver, 906: main amplifier, 907: input/output circuit, 908: peripheral circuit, 909: memory cell, 930: register, 931: register, 947: retention circuit, 948: selector, 949: flip-flop circuit, 950: inverter, 955: inverter, 957: analog switch, 958: analog switch, 961: inverter, 963: inverter, 964: clocked inverter, 965: analog switch, 966: buffer, 1500: broadcasting system, 1500A: broadcasting system, 1501: electronic device system, 1501A: electronic device system, 1510: camera, 1511: transmitter, 1512: receiver, 1513: display device, 1520: image sensor, 1521: image processor, 1522: encoder, 1522A: encoder, 1522B: encoder, 1523: modulator, 1530: image generation device, 1540: Raw data, 1541: video data, 1541A: video data, 1541B: video data, 1542: encoded data, 1542A: encoded data, 1542B: encoded data, 1543: broadcast signal, 1560: TV, 1561: broadcast station, 1562: artificial satellite, 1563: radio wave tower, 1564: antenna, 1565: antenna, 1566A: radio wave, 1566B: radio wave, 1567A: radio wave, 1567B: radio wave, 1571: receiver, 1572: wireless device, 1573: wireless device, 1574: receiver, 1575: connector portion, 7000: display module, 7001: upper cover, 7002: lower cover, 7006: display panel, 7009: frame, 7010: print circuit board, 7011: battery, 7015: light-emitting portion, 7016: light-receiving portion, 7017a: light guide portion, 7017b: light guide portion, 7018: light, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: band, 8305: lens, 9000: housing, 9001: display portion, 9003: speaker, 9005: operation key, 9006: connection terminal, 9007: sensor, 9008: microphone.

This application is based on Japanese Patent Application Serial No. 2016-178106 filed with Japan Patent Office on Sep. 12, 2016, Japanese Patent Application Serial No. 2016-183322 filed with Japan Patent Office on Sep. 20, 2016, Japanese Patent Application Serial No. 2016-233577 filed with Japan Patent Office on Nov. 30, 2016, and Japanese Patent Application Serial No. 2017-099483 filed with Japan Patent Office on May 19, 2017, the entire contents of which are hereby incorporated by reference.

The invention claimed is:

1. A display device comprising:
a pixel portion; and
a driver circuit for driving the pixel portion,
wherein the driver circuit comprises a first transistor,
wherein the pixel portion comprises a second transistor and a pixel electrode electrically connected to the second transistor,
wherein the first transistor comprises a first gate electrode, a first metal oxide film serving as a channel over the first gate electrode and a second gate electrode over the first metal oxide film,
wherein the first gate electrode and the second gate electrode are electrically connected to each other,
wherein the second transistor comprises a second metal oxide film serving as a channel,
wherein the pixel electrode comprises a third metal oxide film,
wherein the third metal oxide film comprises a region having higher hydrogen concentration than the second metal oxide film,
wherein the first metal oxide film, the second metal oxide film, and the third metal oxide film each comprise In, Zn, and an element M,
wherein the first metal oxide film, the second metal oxide film, and the third metal oxide film each comprise a plurality of first regions and a plurality of second regions,
wherein the plurality of first regions comprise In or Zn, and oxygen,
wherein the plurality of second regions comprise In or the element M, and oxygen, and
wherein the plurality of first regions and the plurality of second regions are mixed so as to be dispersed or distributed in a mosaic pattern.

2. The display device according to claim 1,
wherein an insulating film is over the first metal oxide film and the second transistor,
wherein the second metal oxide film is over a gate insulating film,
wherein the third metal oxide film and the second gate electrode are over the insulating film, and
wherein the third metal oxide film is electrically connected to the second transistor in an opening of the insulating film.

3. The display device according to claim 1,
wherein a first insulating film and a second insulating film are stacked in this order over the second transistor,
wherein the first insulating film is over the first metal oxide film,
wherein the first insulating film and the second insulating film each have an opening over the second transistor,
wherein the second metal oxide film is over a gate insulating film,
wherein the second gate electrode is over the first insulating film, wherein the third metal oxide film is over the second insulating film, and wherein the third metal oxide film is electrically connected to the second transistor in the openings of the first insulating film and the second insulating film.

4. The display device according to claim 3, wherein the first insulating film comprises an inorganic insulating film, and wherein the second insulating film comprises an organic resin film.

5. The display device according to claim 1, wherein the second transistor comprises a third gate electrode and a gate insulating film between the third gate electrode and the second metal oxide film, and wherein the second metal oxide film and the third metal oxide film are over the gate insulating film.

6. The display device according to claim 1, wherein a hydrogen concentration of the third metal oxide film is higher than or equal to $1 \times 10^{20}$ atoms/cm$^3$.

7. The display device according to claim 1, wherein the first metal oxide film, the second metal oxide film, and the third metal oxide film each comprise a region where an In content accounts for 40% or higher and 50% or lower of a total sum of In, M, and Zn atoms and a region where an M content accounts for 5% or higher and 30% or lower of the total sum of In, M, and Zn atoms, and wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

8. The display device according to claim 1, wherein an atomic ratio of In to M and Zn is 4:x:y in the first metal oxide film, the second metal oxide film, and the third metal oxide film, where x is greater than or equal to 1.5 and less than or equal to 2.5 and y is greater than or equal to 2 and less than or equal to 4, and wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

9. The display device according to claim 1, wherein an atomic ratio of In to M and Zn is 5:x:y in the first metal oxide film, the second metal oxide film, and the third metal oxide film, where x is greater than or equal to 0.5 and less than or equal to 1.5 and y is greater than or equal to 5 and less than or equal to 7, and wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

10. The display device according to claim 1, wherein the first transistor has a dual-gate structure, and wherein the second transistor has a single-gate structure.

11. An electronic device comprising:

the display device according to claim 1; and a receiver.

12. The display device according to claim 1, wherein the plurality of the first regions each have a size of greater than or equal to 0.5 nm and less than or equal to 3 nm, and wherein the plurality of the second regions each have a size of greater than or equal to 0.5 nm and less than or equal to 3 nm.

13. A display device comprising:

a pixel portion; and a driver circuit for driving the pixel portion, wherein the driver circuit comprises a first transistor, wherein the pixel portion comprises a second transistor and a pixel electrode electrically connected to the second transistor, wherein a first insulating film and a second insulating film are stacked in this order over the second transistor, wherein the first insulating film and the second insulating film each have an opening over the second transistor, wherein the first transistor comprises a first gate electrode, a first metal oxide film serving as a channel over the first gate electrode, the first insulating film over the first metal oxide film, and a second gate electrode over the first insulating film, wherein the first gate electrode and the second gate electrode are electrically connected to each other, wherein the second transistor comprises a second metal oxide film serving as a channel, wherein the pixel electrode is over the second insulating film, wherein the pixel electrode is electrically connected to the second transistor in the openings of the first insulating film and the second insulating film, wherein the first metal oxide film and the second metal oxide film each comprise In, Zn, and an element M, wherein the first metal oxide film and the second metal oxide film each comprise a plurality of first regions and a plurality of second regions, wherein the plurality of first regions comprise In or Zn, and oxygen, wherein the plurality of second regions comprise In or the element M, and oxygen, and wherein the plurality of first regions and the plurality of second regions are mixed so as to be dispersed or distributed in a mosaic pattern.

14. The display device according to claim 13, wherein the pixel electrode comprises a third metal oxide film, wherein the third metal oxide film comprises In, Zn, and the element M, and wherein the third metal oxide film comprises a region having higher hydrogen concentration than the second metal oxide film.

15. The display device according to claim 14, wherein a hydrogen concentration of the third metal oxide film is higher than or equal to $1 \times 10^{20}$ atoms/cm$^3$.

16. The display device according to claim 13, wherein the first insulating film comprises an inorganic insulating film, and wherein the second insulating film comprises an organic resin film.

17. The display device according to claim 13, wherein the first metal oxide film and the second metal oxide film each comprise a region where an In content accounts for 40% or higher and 50% or lower of a total sum of In, M, and Zn atoms and a region where an M content accounts for 5% or higher and 30% or lower of the total sum of In, M, and Zn atoms, and wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

18. The display device according to claim 13,
wherein an atomic ratio of In to M and Zn is 4:x:y in the first metal oxide film and the second metal oxide film, where x is greater than or equal to 1.5 and less than or equal to 2.5 and y is greater than or equal to 2 and less than or equal to 4, and
wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

19. The display device according to claim 13,
wherein an atomic ratio of In to M and Zn is 5:x:y in the first metal oxide film and the second metal oxide film, where x is greater than or equal to 0.5 and less than or equal to 1.5 and y is greater than or equal to 5 and less than or equal to 7, and
wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

20. The display device according to claim 13,
wherein the first transistor has a dual-gate structure, and
wherein the second transistor has a single-gate structure.

21. An electronic device comprising:
the display device according to claim 13; and
a receiver.

22. The display device according to claim 13,
wherein the plurality of the first regions each have a size of greater than or equal to 0.5 nm and less than or equal to 3 nm, and
wherein the plurality of the second regions each have a size of greater than or equal to 0.5 nm and less than or equal to 3 nm.

* * * * *